(12) United States Patent
Thibado

(10) Patent No.: US 12,328,081 B2
(45) Date of Patent: Jun. 10, 2025

(54) ENERGY HARVESTING DEVICES AND SENSORS, AND METHODS OF MAKING AND USE THEREOF

(71) Applicant: Board of Trustees of the University of Arkansas, Little Rock, AR (US)

(72) Inventor: Paul Thibado, Fayetteville, AR (US)

(73) Assignee: Board of Trustees of the University of Arkansas, Little Rock, AR (US)

(*) Notice: Subject to any disclaimer, the term of this patent is extended or adjusted under 35 U.S.C. 154(b) by 1168 days.

(21) Appl. No.: 16/427,023

(22) Filed: May 30, 2019

(65) Prior Publication Data

US 2019/0386584 A1    Dec. 19, 2019

Related U.S. Application Data

(60) Provisional application No. 62/741,234, filed on Oct. 4, 2018, provisional application No. 62/677,826, filed on May 30, 2018.

(51) Int. Cl.
*H02N 2/18* (2006.01)
*B81B 3/00* (2006.01)
(Continued)

(52) U.S. Cl.
CPC .......... *H02N 2/186* (2013.01); *B81B 3/0021* (2013.01); *H01M 10/052* (2013.01); *H02N 1/08* (2013.01);
(Continued)

(58) Field of Classification Search
CPC .......... H02N 2/186; H02N 1/08; H02N 2/181; B81B 3/0021; B81B 2203/0127;
(Continued)

(56) References Cited

U.S. PATENT DOCUMENTS 4,808,886 A    2/1989 Lathom
4,995,069 A    2/1991 Tanaka
(Continued)

FOREIGN PATENT DOCUMENTS

CL    200501653    5/2006
CN    103840710 A    6/2014
(Continued)

OTHER PUBLICATIONS

Mounet, N., Gibertini, M., Schwaller, P. et al. Two-dimensional materials from high-throughout computational exfoliation of experimentally known compounds, Nature Nanotech 13, 246-252 (2018). (Year: 2018).*
(Continued)

*Primary Examiner* — Thomas Truong
(74) *Attorney, Agent, or Firm* — Meunier Carlin & Curfman LLC

(57) ABSTRACT

Disclosed herein are energy harvesting devices and sensors, and methods of making and use thereof. The energy harvesting devices can comprise a membrane disposed on a substrate, wherein the membrane comprises a two-dimensional (2D) material and one or more ripples; and a component electrically, magnetically, electromagnetically, electrostatic/capacitively, piezoelectrically, magnetostrictively and/or mechanically coupled to the membrane and/or the substrate, such that the component is configured to harvest energy from the membrane. The sensors can comprise a membrane disposed on a substrate, wherein the membrane comprises a two-dimensional material one or more ripples; and a component electrically, magnetically, electromagnetically, electrostatic/capacitively, piezoelectrically, magnetostrictively and/or mechanically coupled to the membrane and/or the substrate, such that the component is configured to detect a signal from the membrane.

18 Claims, 55 Drawing Sheets

(51) Int. Cl.
    *H01L 41/113*    (2006.01)
    *H01M 10/052*    (2010.01)
    *H02N 1/08*      (2006.01)
    *H10N 30/30*     (2023.01)
    *H10N 30/85*     (2023.01)
    *H10N 35/85*     (2023.01)

(52) U.S. Cl.
    CPC ........... *H02N 2/181* (2013.01); *H10N 30/308* (2023.02); *H10N 30/85* (2023.02); *H10N 35/85* (2023.02)

(58) Field of Classification Search
    CPC .. H01L 41/1138; H01L 41/18; H01M 10/052; Y02E 60/10; H10N 30/308; H10N 3/85; H10N 35/85; H10N 30/30; H10N 30/50; H10N 30/80
    USPC .......................................................... 310/328
    See application file for complete search history.

(56) References Cited

U.S. PATENT DOCUMENTS

| | | |
|---|---|---|
| 6,444,516 B1 | 9/2002 | Clevenger |
| 7,279,686 B2 | 10/2007 | Schneiker |
| 7,834,263 B2 | 11/2010 | DeSteese et al. |
| 7,839,058 B1 | 11/2010 | Chrchill et al. |
| 7,851,691 B2 | 12/2010 | DeSteese et al. |
| 8,455,751 B2 | 6/2013 | Olsen et al. |
| 8,552,617 B2 * | 10/2013 | Lim ..................... H02N 10/00 310/306 |
| 9,142,857 B2 * | 9/2015 | Lee ..................... B81C 1/00682 |
| 9,281,461 B2 | 3/2016 | Olsen et al. |
| 9,698,707 B2 * | 7/2017 | Monfray ................ H02N 10/00 |
| 9,837,595 B2 | 12/2017 | Yu et al. |
| 9,893,261 B1 | 2/2018 | Boyd et al. |
| 10,014,461 B1 | 7/2018 | Boyd et al. |
| 10,056,538 B1 | 8/2018 | Boyd |
| 10,109,781 B1 | 10/2018 | Boyd |
| 10,249,810 B2 | 4/2019 | Boyd et al. |
| 10,546,991 B2 | 1/2020 | Boyd |
| 10,600,948 B1 | 3/2020 | Liu |
| 10,600,950 B2 | 3/2020 | Boyd et al. |
| 10,707,267 B2 | 7/2020 | Boyd |
| 10,848,079 B2 | 11/2020 | Ma et al. |
| 10,855,101 B2 | 12/2020 | Jung et al. |
| 10,873,276 B2 | 12/2020 | Ma et al. |
| 10,985,677 B2 * | 4/2021 | Boyd ..................... H01L 35/04 |
| 2003/0015997 A1 | 1/2003 | Chloupek |
| 2007/0276444 A1 | 11/2007 | Gelbart |
| 2010/0008291 A1 | 1/2010 | LeBlanc |
| 2012/0267899 A1 * | 10/2012 | Huffman ................ H02N 2/186 290/1 R |
| 2012/0283807 A1 * | 11/2012 | Deterre ................. A61N 1/3785 607/116 |
| 2012/0312102 A1 | 12/2012 | Alvarez |
| 2013/0140950 A1 | 6/2013 | Fuentes-Fernandez et al. |
| 2013/0193930 A1 * | 8/2013 | Baugher ............ H01L 41/1138 290/1 R |
| 2013/0214875 A1 | 8/2013 | Duncan et al. |
| 2013/0313943 A1 * | 11/2013 | Duncan ................. C01B 32/182 977/734 |
| 2015/0115331 A1 | 4/2015 | Moon et al. |
| 2015/0115767 A1 * | 4/2015 | Pinkerton ............ G02B 7/1821 310/300 |
| 2015/0188030 A1 | 7/2015 | Andosca |
| 2015/0249257 A1 | 9/2015 | Liu et al. |
| 2015/0319662 A1 | 11/2015 | Enomoto |
| 2016/0111978 A1 | 4/2016 | Kim et al. |
| 2016/0211828 A1 | 7/2016 | Simmonds et al. |
| 2016/0315561 A1 * | 10/2016 | Shin ........................ H02N 1/04 |
| 2016/0336880 A1 | 11/2016 | Gruenwald |
| 2016/0346556 A1 * | 12/2016 | Slepian .................. H02N 2/181 |
| 2017/0287977 A1 | 10/2017 | Moroz et al. |
| 2018/0294393 A1 | 10/2018 | Boyd |
| 2019/0063412 A1 | 2/2019 | Strano et al. |
| 2019/0386584 A1 * | 12/2019 | Thibado ................ B81B 3/0021 |
| 2020/0028053 A1 | 1/2020 | Strano et al. |
| 2020/0076199 A1 | 3/2020 | Kaufman et al. |
| 2020/0227614 A1 | 7/2020 | Boyd |
| 2020/0388744 A1 | 12/2020 | Boyd et al. |
| 2021/0265984 A1 | 8/2021 | Kaufman |
| 2021/0336480 A1 * | 10/2021 | Thibado ................... H02N 1/08 |

FOREIGN PATENT DOCUMENTS

| | | |
|---|---|---|
| CN | 104067087 A | 9/2014 |
| KR | 101199117 B1 | 2/2012 |
| KR | 1187312 B1 | 7/2012 |
| KR | 20120074556 A | 7/2012 |
| WO | 2013190744 A1 | 12/2013 |
| WO | 2013192335 A1 | 12/2013 |
| WO | 2015163178 A1 | 10/2015 |
| WO | 2016061155 A | 4/2016 |
| WO | 2016128625 | 8/2016 |

OTHER PUBLICATIONS

P. M. Thibado, Charging capacitors using graphene fluctuations. Dated: Jan. 12, 2022. 5 pages.

Extended European Search Report issued for Application No. 19812598.1, dated Jun. 15, 2021.

Examination Report issued for Indian Application No. 201927027079, dated Dec. 24, 2021.

Examination Report issued for Australian Application No. 2017379071, dated Feb. 22, 2022.

Office Action issued for Japanese Application No. 2019-534118, dated Feb. 25, 2022.

Flexible nanoantenna arrays capture abundant solar energy (Aug. 11, 2008) retrieved Dec. 28, 2020 from https://phys.org/news/2008-08-flexible-nanoantenna-arrays-capture-abundant.html.

Gadalla, Mena N., M. Abdel-Rahman, and Atif Shamim. "Design, optimization and fabrication of a 28.3 THz nanorectenna for infrared detection and rectification." Scientific reports 4.1 (2014): 4270, 1-9.

Extended European Search Report issued for Application No. 17882960.2, dated Jun. 30, 2020.

N. Mounet, M. Gibertini, P. Schwaller, D. Campi, A. Merkys, A. Marrazzo, T. Sohier, I.E. Castelli, A. Cepellotti, G. Pizzi, N. Marzari, Two-dimensional materials from high-throughput computational exfoliation of experimentally known compounds, Nature Nanotechnology, 13 (2018) 246+.

P. San-Jose, J. Gonzalez, F. Guinea, Electron-Induced Rippling in Graphene, Physical Review Letters, 106 (2021) 045502.

P. Langevin, On the theory of Brownian motion, C. R. Acad. Sci. (Paris) 146, 530-533 (1908).

T. Li, S. Kheifets, D. Medellin, and M. G. Raizen, Measurement of the instantaneous velocity of a Brownian particle, Science 328, 1673 (2010).

S. Stapf, R. Kimmich, and R. O. Seitter, Proton and Deuteron Field-Cycling NMR Relaxometry of Liquids in Porous Glasses: Evidence for Lévy-Walk Statistics, Phys. Rev. Lett. 75, 2855 (1995).

H. Katori, S. Schlipf, and H. Walther, Anomalous Dynamics of a Single Ion in an Optical Lattice, Phys. Rev. Lett. 79, 2221 (1997).

M. F. Shlesinger, G. M. Zaslavsky, and J. Klafter, Strange kinetics, Nature (London) 363, 31 (1993).

R. Metzler and J. Klafter, The random walk's guide to anomalous diffusion: A fractional dynamics approach, Phys. Rep. 339, 1-77 (2000).

G. M. Viswanathan, S. V. Buldyrev, S. Havlin, M. G. E. da Luz, E. P. Raposo, and H. E. Stanley, Optimizing the success of random searches, Nature (London) 401, 911 (1999).

I. Kosztin and K. Schulten, Fluctuation-Driven Molecular Transport through an Asymmetric Membrane Channel, Phys. Rev. Lett. 93, 238102 (2004).

(56) References Cited

OTHER PUBLICATIONS

D. F. Bocian and S. I. Chan, NMR studies of membrane structure and dynamics, Annu. Rev. Phys. Chem. 29, 307 (1978).
J. Pecreaux, H. G. Dobereiner, J. Prost, J. F. Joanny, and P. Bassereau, Refined contour analysis of giant unilamellar vesicles, Eur. Phys. J. E 13, 277 (2004).
A. Naji, P. J. Atzberger, and F. L. H. Brown, Hybrid Elastic and Discrete-Particle Approach to Biomembrane Dynamics with Application to the Mobility of Curved Integral Membrane Proteins, Phys. Rev. Lett. 102, 138102 (2009).
E. Reister-Gottfried, S. M. Leitenberger, and U. Seifert, Diffusing proteins on a fluctuating membrane: Analytical theory and simulations, Phys. Rev. E 81, 031903 (2010).
J. K. Schoelz, P. Xu, V. Meunier, P. Kumar, M. Neek Amal, P. M. Thibado, and F. M. Peeters, Graphene ripples as a realization of a two-dimensional Ising model: A scanning tunneling microscope study, Phys. Rev. B 91, 045413 (2015).
P. Xu, Y. Yang, S. D. Barber, M. L. Ackerman, J. K. Schoelz, D. Qi, I. A. Kornev, L. Dong, L. Bellaiche, S. Barraza-Lopez, and P. M. Thibado, Atomic control of strain in freestanding graphene, Phys. Rev. B 85, 121406(R) (2012).
J. H. Los, M. I. Katsnelson, O. V. Yazyev, K. V. Zakharchenko, and A. Fasolino, Scaling properties of flexible membranes from atomistic simulations: Application to graphene, Phys. Rev. B 80, 121405(R) (2009).
B. S. Swartzentruber, Direct Measurement of Surface Diffusion Using Atom-Tracking Scanning Tunneling Microscopy, Phys. Rev. Lett. 76, 459 (1996).
P. Haenggi and F. Marchesoni, Artificial Brownian motors: Controlling transport on the nanoscale, Rev. Mod. Phys. 81, 387 (2009).
Paradiso, Joseph A., and Thad Starner. "Energy scavenging for mobile and wireless electronics." IEEE Pervasive computing 1 (2005): 18-27.
Moore, Gordon E. "No exponential is forever: but"Forever" can be delayed [semiconductor industry]." 2003 IEEE International Solid-State Circuits Conference, 2003. Digest of Technical Papers. ISSCC. IEEE, 2003.
Erturk, A. and D. J. Inman (2008). "A distributed parameter electromechanical model for cantilevered piezoelectric energy harvesters." Journal of vibration and acoustics 130/041002-1.
Erturk, A. and D. J. Inman (2009). "An experimentally validated bimorph cantilever model for piezoelectric energy harvesting from base excitations." Smart materials and structures 18: 025009.
Joon Kim, K., F. Cottone, et al. (2010). "Energy scavenging for energy efficiency in networks and applications." Bell Labs Technical Journal 15(2): 7-29.
Wang, Lei, and F. G. Yuan. "Energy harvesting by magnetostrictive material (MsM) for powering wireless sensors in SHM." Sensors and Smart Structures Technologies for Civil, Mechanical, and Aerospace Systems 2007. vol. 6529. International Society for Optics and Photonics, 2007, 11 pages.
Beeby, S., R. Torah, et al. (2007). "A micro electromagnetic generator for vibration energy harvesting." Journal of Micromechanics and Microengineering 17: 1257.
Mitcheson, P. D., E. M. Yeatman, et al. (2008). "Energy harvesting from human and machine motion for wireless electronic devices." Proceedings of the IEEE 96(9): 1457-1486.
Roundy, S., P. K. Wright, et al. (2004). Energy Scavenging For Wireless Sensor Networks with special focus on Vibrations, Kluwer Academic Publisher.
Poulin, G., E. Sarraute, et al. (2004). "Generation of electrical energy for portable devices Comparative study of an electromagnetic and a piezoelectric system." Sensors & Actuators: A. Physical 116(3): 461-471.
Beeby, S. P., M. J. Tudor, et al. (2006). "Energy harvesting vibration sources for microsystems applications." Measurement Science and Technology 17(12): R175-R195.
Zhu, D., M. J. Tudor, et al. (2010). "Strategies for increasing the operating frequency range of vibration energy harvesters: a review." Measurement Science and Technology 21: 022001.

Jang, Kwang Yeop, James Lee, and Dong-Gun Lee. "Magneto-Thermo-Triboelectric Generator (MTTG) for thermal energy harvesting." Active and Passive Smart Structures and Integrated Systems 2016. vol. 9799. International Society for Optics and Photonics, 2016.
International Search Report and the Written Opinion issued for Application No. PCT/US2017/067798, dated Mar. 6, 2018, 9 pages.
International Preliminary Report on Patentability issued for Application No. PCT/US2017/067798, dated Jul. 4, 2019.
Bao et al., "Ripple Texturing of Suspended Graphene Atomic Membranes," Mar. 3, 2009, https://doi.org/ 10.48550/arXiv.0903.0414 (Year: 2009).
De Lima et al., "Soliton instability and fold formation in laterally compressed graphene," Jan. 8, 2015, Nanotechnology, vol. 26, No. 4 (Year: 2015).
Akinwande et al., "A Review on Mechanics and Mechanical Properties of 2D Materials—Graphene and Beyond," Nov. 4, 2016, https://doi.org/10.48550/arXiv.1611.01555 (Year: 2016).
Guo et al 'Energy Harvesting with Single-Ion -Selective Nanopores: A Concentration—Gradient-Driven Nanofluidic Power Source, Mar. 25, 2010, Advanced Functional Materials, vol. 20, No. 8 (Year: 2010).
Shen et al., "One Step Synthesis of Graphene Oxide-Magnetic Nanoparticle Composite," Jan. 4, 2010, The Journal of Physical Chemistry C, vol. 114, No. 3 (Year: 2010).
Sari et al., "An Energy Harvesting M EMS Frequency Detector," 2007, IEEE Sensors 2007 Conference (Year: 2007).
Wang and Devel, "Periodic ripples in suspended graphene," Mar. 23, 2011, Physical Review B, vol. 83, No. 12 (Year: 2011).
Abedpour et al., "Irreversibility in response to forces acting on graphene sheets," May 12, 2010, Physical Review Letters, vol. 104, No. 19 (Year: 2010).
English translation of KR-1187312-B1 (Year: 2012).
English Translation of CN 103840710.
A. Einstein, Investigations on the theory of the Brownian movement, Annalen der Physik, 17 (1905) 549-560.
A. Fasolino, J.H. Los, M.I. Katsnelson, Intrinsic ripples in graphene, Nature Materials, 6 (2007) 858-861.
A.A. Balandin, S. Ghosh, W. Bao, I. Calizo, D. Teweldebrhan, F. Miao, C.N. Lau, Superior thermal conductivity of single-layer graphene, Nano Lett., 8 (2008) 902-907.
A.L. Cottrill, A.T. Liu, Y. Kunai, V.B. Koman, A. Kaplan, S.G. Mahajan, P.W. Liu, A.R. Toland, M.S. Strano, Ultra-high thermal effusivity materials for resonant ambient thermal energy harvesting, Nature Communications, 9 (2018) 664.
Bonilla, M. Ruiz-Garcia, Critical radius and temperature for buckling in graphene, Physical Review B, 93 (2016) 115407.
C. Lotze, M. Corso, K.J. Franke, F. von Oppen, J.I. Pascual, Driving a Macroscopic Oscillator with the Stochastic Motion of a Hydrogen Molecule, Science, 338 (2012) 779-782. [E3] L. Gammaitoni, P. Hanggi, P. Jung, F. Marchesoni, Stochastic resonance, Rev. Mod. Phys., 70 (1998) 223-287.
C.B. Williams, R.B. Yates, Analysis of a micro-electric generator for microsystems, Transducers, (1995) 369.
E.V. Castro, H. Ochoa, M.I. Katsnelson, R. V. Gorbachev, D.C. Elias, K.S. Novoselov, A.K. Geim, F. Guinea, Limits on Charge Carrier Mobility in Suspended Graphene due to Flexural Phonons, Physical Review Letters, 105 (2010) 266601.
H.H. Hasegawa, C.B. Li, Y. Ohtaki, Thermodynamics of a system with long-time correlations, International Journal of Quantum Chemistry, 98 (2004) 138-144.
I.A. Martinez, E. Roldan, L. Dinis, D. Petrov, J.M.R. Parrondo, R.A. Rica, Brownian Carnot engine, Nature Physics, 12 (2016) 67-70.
International Search Report and the Written Opinion issued for Application No. PCT/US2019/034688, dated Aug. 9, 2019, 11 pages.
J. Macaulay, M. Kuckelhaus, Internet of things in logistics, Matthais Heutger (2015).
J. Tersoff, D.R. Hamann, Theory of The Scanning Tunneling Microscope, Physical Review B, 31 (1985) 805-813.
J.C. Meyer, A.K. Geim, M.I. Katsnelson, K.S. Novoselov, T.J. Booth, S. Roth, The structure of suspended graphene sheets, Nature, 446 (2007) 60-63.

(56) References Cited

OTHER PUBLICATIONS

J.F. Xu, P.M. Thibado, Z. Ding, 4 K, ultrahigh vacuum scanning tunneling microscope having two orthogonal tips with tunnel junctions as close as a few nanometers, Rev. Sci. Instrum., 77 (2006) 093703.

J.-S. Rattinacannou, A promising new energy source: The Brownian motion of nanoresonator arrays European Physical Journal, 79 (2014) 01006.

L. Gammaitoni, P. Hanggi, P. Jung, F. Marchesoni, Stochastic resonance, Rev. Mod. Phys., 70 (1998) 223-287.

M. Lopez-Suarez, R. Rurali, L. Gammaitoni, G. Abadal, Nanostructured graphene for energy harvesting, Physical Review B, 84 (2011) 161401(R).

M. Neek-Amal, P. Xu, J.K. Schoelz, M.L. Ackerman, S.D. Barber, P.M. Thibado, A. Sadeghi, F.M. Peeters, Thermal mirror buckling in freestanding graphene locally controlled by scanning tunneling microscopy, Nat. Comm., 5 (2014) 4962.

M. Ruiz-Garcia, L.L. Bonilla, A. Prados, Ripples in hexagonal lattices of atoms coupled to Glauber spins, Journal of Statistical Mechanics-Theory and Experiment, (2015) P05015.

M. Ruiz-Garcia, L.L. Bonilla, A. Prados, STM-driven transition from rippled to buckled graphene in a spin-membrane model, Physical Review B, 94 (2016) 205404.

M.B. Lundeberg, J.A. Folk, Rippled Graphene in an In-Plane Magnetic Field: Effects of a Random Vector Potential, Physical Review Letters, 105 (2010) 146804.

M.L. Ackerman, P. Kumar, M. Neek-Amal, P.M. Thibado, F.M. Peeters, S. Singh, Anomalous Dynamical Behavior of Freestanding Graphene Membranes, Physical Review Letters, 117 (2016) 126801.

M.O. Magnasco, Forced Thermal Ratchets, Physical Review Letters, 71 (1993) 1477-1481.

M.R. Sorensen, A.F. Voter, Temperature-accelerated dynamics for simulation of infrequent events, Journal of Chemical Physics, 112 (2000) 9599-9606.

N. Mounet, M. Gibertini, P. Schwaller, D. Campi, A. Merkys, A. Marrazzo, T. Sohier, I.E. Castelli, A. Cepellotti, G. Pizzi, N. Marzari, Two-dimensional materials from high-throughput computational exfoliation of experimentally known compounds, Nature Nanotechnology, 13 (2018) 246+ 246-252.

N.R. Greene, Energy Flow for a Variable-Gap Capacitor, The Physics Teacher, 43 (2005) 340.

P. San-Jose, J. Gonzalez, F. Guinea, Electron-Induced Rippling in Graphene, Physical Review Letters, 106 (2011) 045502.

P. Xu, M. Neek-Amal, S.D. Barber, J.K. Schoelz, M.L. Ackerman, P.M. Thibado, A. Sadeghi, F.M. Peeters, Unusual ultra-low-frequency fluctuations in freestanding graphene, Nat. Comm., 5 (2014) 3720.

R. O'Donnell, N. Schofield, A.C. Smith, J. Cullen, Design Concepts for High-Voltage Variable-Capacitance DC Generators, IEEE Transactions on Industry Applications, 45 (2009) 1778-1784.

R.D. Astumian, Thermodynamics and kinetics of a Brownian motor, Science, 276 (1997) 917-922.

S. Hanson, M. Seok, Y.S. Lin, Z. Foo, D. Kim, Y. Lee, N. Liu, D. Sylvester, D. Blaauw, A Low-Voltage Processor for Sensing Applications with Picowatt Standby Mode, IEEE Journal of Solid-State Circuits, 44 (2009) 1145-1155.

S. Roundy, P.K. Wright, J. Rabaey, A study of low level vibrations as a power source for wireless sensor nodes, Computer Communications, 26 (2003) 1131- 1144.

S.F. Philp, Vacuum-Insulated, Varying-Capacitance Machine, IEEE Transactions on Electrical Insulation, 12 (1977) 130-136.

U. Seifert, Stochastic thermodynamics, fluctuation theorems and molecular machines, Reports on Progress in Physics, 75 (2012) 126001.

\* cited by examiner

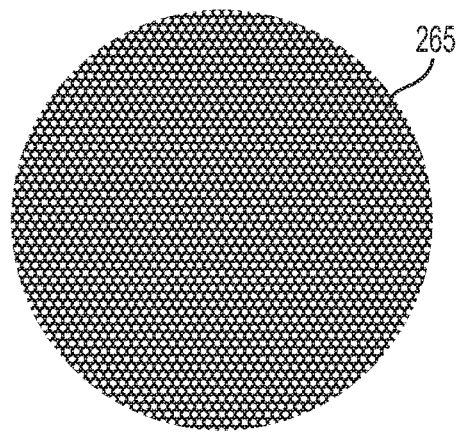
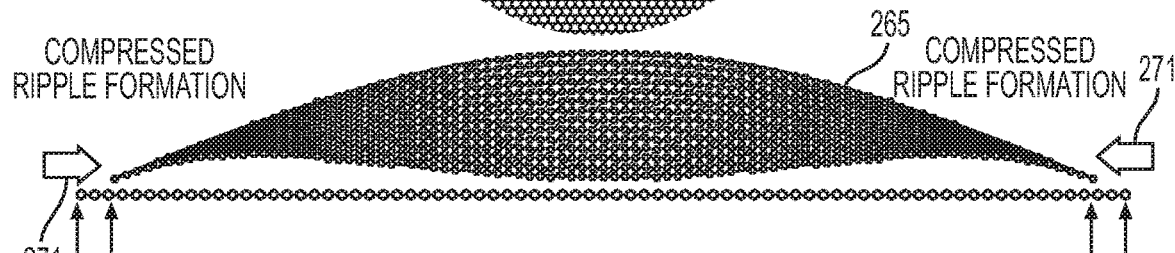
FIG. 2B
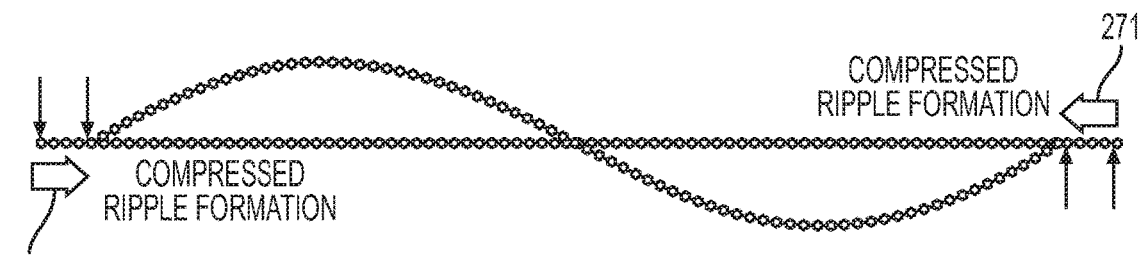
FIG. 2C
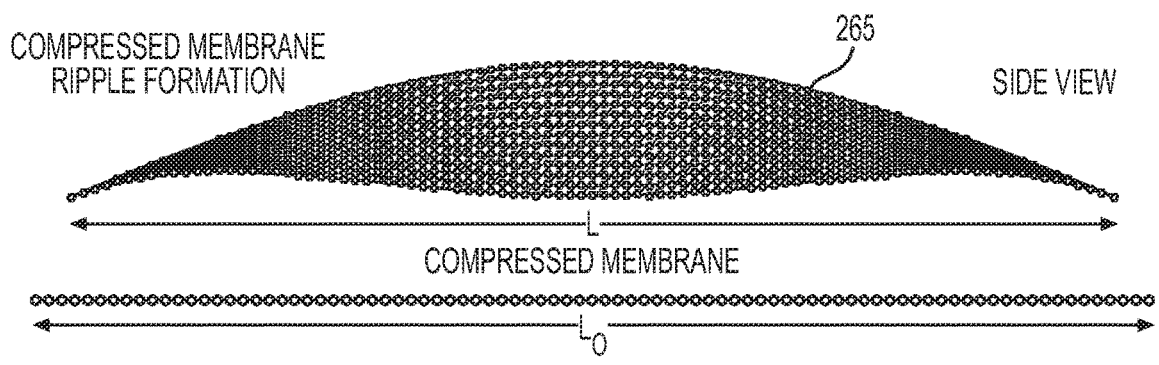
FIG. 2D $$Q_{ch}^{max}(I_{stm}) = \frac{\varepsilon_0 Af\langle d(t)\rangle}{d_0^2} V_{stm} T + k\, G_{stm} \langle d(t)\rangle\, T\, I_{stm}$$

$$Q_{ch}^{max}(I_{stm}) = \frac{\varepsilon_0 A f \langle d(t) \rangle}{d_0^2} V_{stm} T + k G_{stm} \langle d(t) \rangle T I_{stm}$$

ENERGY HARVESTING DEVICES AND SENSORS, AND METHODS OF MAKING AND USE THEREOF

CROSS REFERENCE TO RELATED APPLICATIONS

This application claims priority to, and the benefit of, both U.S. Provisional Patent Application Ser. No. 62/677,826 filed on May 30, 2018, and U.S. Provisional Patent Application Ser. No. 62/741,234 filed on Oct. 4, 2018, both of which are incorporated by reference as if set forth fully herein.

STATEMENT REGARDING FEDERALLY SPONSORED RESEARCH

Neither the priority applications nor this application used government funds or benefitted from government sponsored research.

FIELD

The disclosed technology generally relates to energy harvesting devices and sensors, and methods of making and use thereof.

BACKGROUND

Vibration energy harvesting is the practice of capturing vibration energy from external vibration sources (e.g. vehicles, machines, buildings, and human motions). This captured energy can then be used for various applications. In certain approaches to vibration energy harvesting, a plate is fixed at one end and will vibrate up and down between two extremes when it is excited. By flexing and oscillating between the two extremes, the strain/stress developed on the surface of the plate can be used to generate energy. Vibrations at the atomic scale are omnipresent, even in a mechanically quiet environment. This is due to the material being held at some temperature above absolute zero, and are called thermal vibrations. It is with respect to these and other considerations that the various embodiments described below are presented.

SUMMARY

In accordance with the purposes of the disclosed devices and methods, as embodied and broadly described herein, the disclosed subject matter relates to energy harvesting devices and sensors, and methods of making and use thereof.

In one embodiment, a system for harvesting vibrational energy includes a free-standing membrane connected to one or more supports and has a first surface that is unobstructed and free to vibrate in response to ambient energy. Vibration of the membrane defines cyclical ripple formations along the first surface, wherein each ripple formation alternates between a peak and a trough in a respective window region of a plurality of window regions of the membrane. A scanning tunneling microscope (STM) is connected to the system and has a tip and a voltage source. The STM tip is positioned proximate the membrane to define a respective capacitive region of charges between the tip of the STM and the window regions of the membrane. A distance between the tip of the STM and each respective window region of the window regions of the membrane varies with respective peaks and troughs. The capacitive region between the tip of the STM and each window region of the membrane stores and emits the charges in cycles according to the distance between the tip and the respective window region. A fixed storage capacitor is connected to the membrane and receives emitted charges from the capacitive region when the distance between the tip of the STM and each window region is increasing during ripple peak periods. The voltage source delivers charges to the capacitive region when the distance between the tip of the STM and a respective window region is decreasing during ripple trough periods.

In another embodiment, the disclosure provides a system for converting vibrational energy to a current output with a free-standing membrane connected to one or more supports and comprising a first surface that is unobstructed and free to vibrate in response to ambient energy. Vibration of the membrane defines cyclical ripple formations along the first surface, wherein each ripple formation alternates between a peak and a trough in a respective window region of a plurality of window regions of the membrane. A scanning tunneling microscope (STM) with a tip is positioned proximate the membrane, and the STM includes a voltage source setting a setpoint current between the tip and the membrane to define a respective capacitive region of charges between the tip and the window regions of the membrane. A distance between the tip of the microscope and each window region of the membrane varies with respective peaks and troughs, and the capacitive region stores and emits the charges in cycles in response to the distance between the tip and the window regions and pursuant to tunneling of additional charges through the capacitive region. A fixed storage capacitor is connected to the membrane and receives emitted charges and additional tunneling charges from the capacitive region when the distance between the tip of the microscope and a respective window region is increasing during ripple peak periods in the respective window region.

In yet another embodiment, a system for converting vibrational energy to a current output includes a current harvesting circuit in a substrate, wherein the current harvesting circuit comprises a common metal contact connected by respective matching oriented diodes to a voltage source and a fixed storage capacitor. A free-standing membrane extends over at least the common metal contact in the current harvesting circuit, such that the common metal contact is separated from the membrane by a stand-off support and faces a first surface of the membrane to define a capacitive region between the common metal contact and the first surface of the membrane. The first surface of the membrane is unobstructed and free to vibrate in response to ambient energy, wherein vibration of the membrane defines cyclical ripple formations along the first surface, and wherein each ripple formation alternates between a peak and a trough relative to the common contact. The capacitive region between the common contact and the membrane accumulates charges between the common contact and the membrane, and the common contact switches a current output of accumulated charges across one of the respective diodes to direct the current output to either the voltage source or the fixed storage capacitor in response to the cyclical ripple formations in the membrane.

In another non-limiting embodiment of this disclosure, a method of assembling an energy harvesting circuit includes forming a capacitive region in the energy harvesting circuit by defining a first capacitor plate having an initial separation distance with respect to a first surface of a free-standing membrane, wherein the first surface of the free-standing membrane defines a second capacitor plate, then connecting the first capacitor plate to a voltage source configured to induce charge accumulation in the capacitive region. Next, the membrane is positioned relative to the first capacitor plate such that the membrane is unobstructed and free to vibrate in response to ambient energy, wherein vibration of the membrane defines cyclical ripple formations along the first surface, and wherein each ripple formation alternates between a peak and a trough relative to the first capacitor plate to change the initial separation distance. The method includes discharging the capacitive region across a respective diode to direct accumulated charges to either the voltage source or a load, wherein discharging the capacitive region comprises directing the charges to the voltage source and directing the charges to the load during a peak.

Another embodiment discloses a method of assembling an energy harvesting circuit by impregnating an insulating layer of a freestanding membrane with fixed charge carriers and forming a capacitive region in the energy harvesting circuit by defining a first capacitor plate having an initial separation distance with respect to a first surface of the free-standing membrane. The first surface of the free-standing membrane defines a second capacitor plate having the fixed charge carriers. The method further allows for positioning the membrane relative to the first capacitor plate such that the membrane is unobstructed and free to vibrate in response to ambient energy and change a capacitance of the capacitive region, wherein vibration of the membrane defines cyclical ripple formations along the first surface, and wherein each ripple formation alternates between a peak and a trough relative to the first capacitor plate to change the initial separation distance. During periods of vibration, accumulated charge is directed from the first capacitor plate into the capacitive region. The accumulated charge may be discharged from the capacitive region across at least one of a resistive load and a fixed storage capacitor.

Additional advantages of the disclosed devices and methods will be set forth in part in the description which follows, and in part will be obvious from the description. The advantages of the disclosed devices will be realized and attained by means of the elements and combinations particularly pointed out in the appended claims. It is to be understood that both the foregoing general description and the following detailed description are exemplary and explanatory only and are not restrictive of the disclosed devices and methods, as claimed.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

The accompanying drawings, which are incorporated and constitute a part of this specification, illustrate several aspects of the disclosure, and together with the description, serve to explain the principles of the disclosure.

FIG. 2A is a top view of a membrane subject to a compressive force that interacts with vibrational ripple formation according to this disclosure.

FIG. 2B is a side view of a membrane subject to oppositely directed lateral compressive forces and upward vibrational forces at points along an edge of a portion of a membrane showing vibrational ripple formation according to this disclosure.

FIG. 2C is a side view of a membrane subject to an oppositely directed lateral compressive forces and oppositely directed vibrational forces at points along an edge of a membrane showing vibrational ripple formation according to this disclosure.

FIG. 2D is a side view of a taut membrane displaced into a ripple formation by compressive and vibrational forces as described herein.

DETAILED DESCRIPTION

Figure 1A:
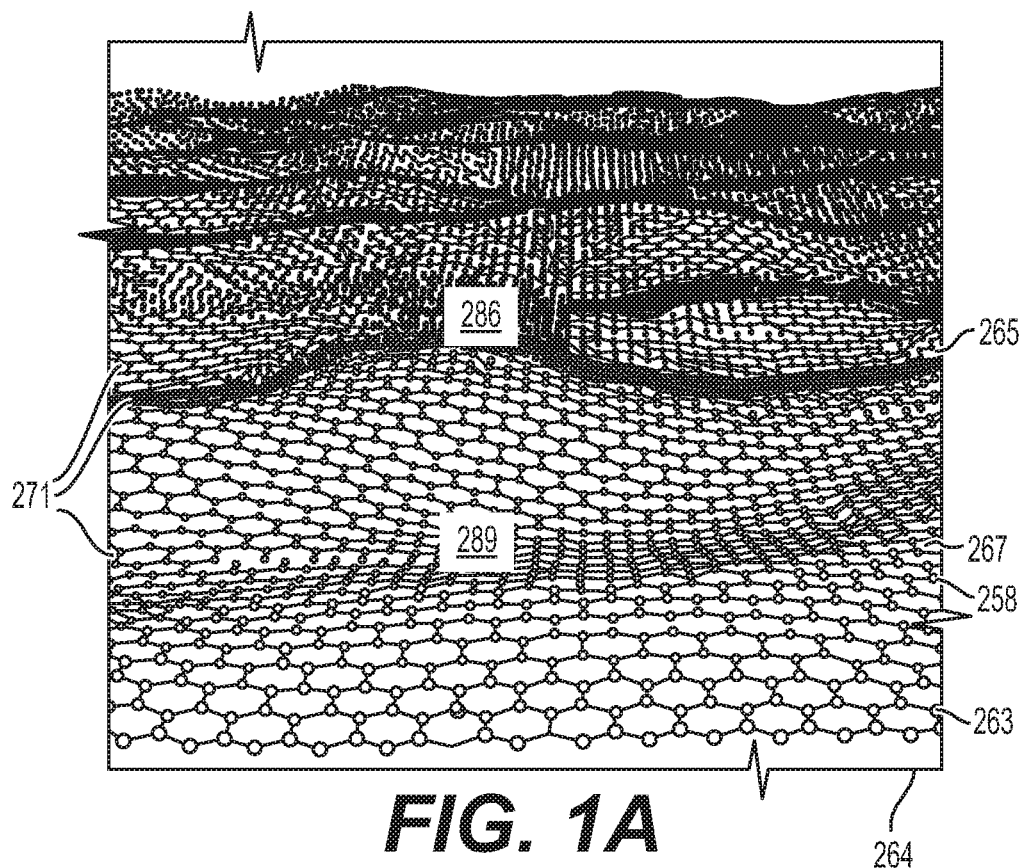
FIG. 1A is a perspective view of a membrane subject to ripple formation as disclosed herein.

The devices and methods described herein may be understood more readily by reference to the following detailed description of specific aspects of the disclosed subject matter and the Examples included therein.

Before the present devices and methods are disclosed and described, it is to be understood that the aspects described below are not limited to the details of construction and arrangement of components set forth in the following description or illustrated in the drawings. The disclosed technology is capable of other embodiments and of being practiced or carried out in various ways.

In the following description, references are made to the accompanying drawings that form a part hereof and that show, by way of illustration, specific embodiments or examples.

It is also to be understood that the terminology used herein is for the purpose of describing particular aspects only and is not intended to be limiting. In describing example embodiments, terminology will be resorted to for the sake of clarity. It is intended that each term contemplates its broadest meaning as understood by those skilled in the art and includes all technical equivalents that operate in a similar manner to accomplish a similar purpose. It is also to be understood that the mention of one or more steps of a method does not preclude the presence of additional method steps or intervening method steps between those steps expressly identified. Steps of a method may be performed in a different order than those described herein without departing from the scope of the disclosed technology. Similarly, it is also to be understood that the mention of one or more components in a device or system does not preclude the presence of additional components or intervening components between those components expressly identified.

Also, throughout this specification, various publications are referenced. The disclosures of these publications in their entireties are hereby incorporated by reference into this application in order to more fully describe the state of the art to which the disclosed matter pertains. The references disclosed are also individually and specifically incorporated by reference herein for the material contained in them that is discussed in the sentence in which the reference is relied upon.

The specification makes references to numerous electrical charges of opposite polarity along with collection of certain positive and negative charges on identified hardware. Nothing in this specification limits the disclosure to any one arrangement of positive or negative polarity in circumstances where an opposite polarity may also be arranged.

The specification further references peaks and troughs of a freestanding membrane subject to rippling effects due to outside energy forces, and whether a certain structure of the membrane is a peak or a trough depends up perspective as well as the membrane's position relative to another structure. Accordingly, nothing in this detailed specification requires any particular orientation of structures or hardware, and the terms "peaks," "troughs," and "ripples" are not limited to any one orientation but are for description purposes only.

Definitions

In this specification and in the claims that follow, reference will be made to a number of terms, which shall be defined to have the following meanings:

Throughout the description and claims of this specification the word "comprise" and other forms of the word, such as "comprising" and "comprises," means including but not limited to, and is not intended to exclude, for example, other additives, components, integers, or steps.

As used in the description and the appended claims, the singular forms "a," "an," and "the" include plural referents unless the context clearly dictates otherwise. Thus, for example, reference to "a composition" includes mixtures of two or more such compositions, reference to "the compound" includes mixtures of two or more such compounds, reference to "an agent" includes mixture of two or more such agents, and the like.

It is understood that throughout this specification the identifiers "first" and "second" are used solely to aid the reader in distinguishing the various components, features, or steps of the disclosed subject matter. The identifiers "first" and "second" are not intended to imply any particular order, amount, preference, or importance to the components or steps modified by these terms.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB.

Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

Energy Harvesting Devices and Sensors

Described herein are energy harvesting devices 100 and sensors 195. The energy harvesting devices and sensors can comprise a membrane 265 disposed on a substrate 258, wherein the membrane 225 comprises a two-dimensional (2D) material and one or more ripples having peaks 286 and troughs 289 as shown in FIG. 1A. As further illustrated in FIG. 1A, the substrate may be a grid 258 defining grid cells across a span of the substrate to outline window regions 269 of the overlaying membrane 265 within each cell as discussed herein.

In an example embodiment, an energy harvesting device 100 having a power source 105, 118, 200 for ambient vibration energy harvesting is disclosed, having an atomic two-dimensional membrane 265 for buckling at a relatively low frequency. The anomalous vibrational kinetic energy of these two-dimensional materials, if used as the active component of an energy harvesting device 100, can provide superior energy production when compared to existing technology. For example, in current silicon microelectromechanical (MEM) vibration energy harvesting technology, the active component may be an etch silicon platform. This platform will not spontaneously vibrate or mechanically buckle because it is too rigid. "Mechanical buckling" is understood in this disclosure as non-linear phenomenon. The prior approaches of silicon MEM structures are linear response devices. In contrast, the membrane 265 of the energy harvesting devices 100 described herein can spontaneously vibrate and mechanically buckle.

The two-dimensional material can, for example, comprise graphene, $MoS_2$, $MoSe_2$, $WS_2$, $WSe_2$, $ReS_2$, $ReSe_2$, Boron Nitride (BN) or a combination thereof. In certain examples, the two-dimensional material can comprise graphene. The graphene may include monolayer materials, bi-layer materials, tri-layer materials, and multi-layer materials. Though the example embodiments herein indicate that one non-limiting material for the freestanding membrane is graphene, any of the materials discussed herein may be a viable option as well for the freestanding membrane. These layers may be stacked on one another in arbitrary or specific crystallographic orientations, which may enhance the vibrational properties.

The identity of the two-dimensional material can be selected based on a variety of factors. For example, the bending stiffness varies between the different two-dimensional materials and therefore different vibration frequencies would be available. Also, the electrical conductivity of the various two-dimensional materials varies considerably, which can control the efficiency of harvesting energy using an electrostatic approach. Accordingly, the identity of the two-dimensional material can be selected to control one or more of these parameters.

In some examples, the membrane 265 can comprise freestanding graphene which has a substantially large velocity component in the velocity probability distribution. In some examples, the membrane 265 can exhibit perpetual non-linear movement at room temperature.

The membrane 265 can, for example, have an average thickness of 0.3 nanometers (nm) or more (e.g., 0.4 nm or more, 0.5 nm or more, 0.6 nm or more, 0.7 nm or more, 0.8 nm or more, 0.9 nm or more, 1.0 nm or more, 1.1 nm or more, 1.2 nm or more, 1.3 nm or more, 1.4 nm or more, 1.5 nm or more, 1.6 nm or more, 1.7 nm or more, 1.8 nm or more, 1.9 nm or more, 2.0 nm or more, 2.1 nm or more, 2.2 nm or more, 2.3 nm or more, 2.4 nm or more, or 2.5 nm or more). In some examples, the membrane 265 can have an average thickness of 3.0 nm or less (e.g., 2.9 nm or less, 2.8 nm or less, 2.7 nm or less, 2.6 nm or less, 2.5 nm or less, 2.4 nm or less, 2.3 nm or less, 2.2 nm or less, 2.1 nm or less, 2.0 nm or less, 1.9 nm or less, 1.8 nm or less, 1.7 nm or less, 1.6 nm or less, 1.5 nm or less, 1.4 nm or less, 1.3 nm or less, 1.2 nm or less, 1.1 nm or less, 1.0 nm or less, 0.9 nm or less, 0.8 nm or less, 0.7 nm or less, 0.6 nm or less, or 0.5 nm or less). The average thickness of the membrane 265 can range from any of the minimum values described above to any of the maximum values described above. For example, the membrane 265 can have an average thickness of from 0.3 nm to 3.0 nm (e.g., from 0.3 nm to 2.5 nm, from 0.3 nm to 2.0 nm, from 0.3 nm to 1.5 nm, form 0.3 nm to 1.0 nm, or from 0.3 nm to 0.6 nm).

The membrane 265 can, for example, have an average lateral dimension of 0.1 microns (μm) or more (e.g., 0.5 μm or more, 1 μm or more, 1.5 μm or more, 2 μm or more, 2.5 μm or more, 3 μm or more, 3.5 μm or more, 4 μm or more, 4.5 μm or more, 5 μm or more, 6 μm or more, 7 μm or more, 8 μm or more, 9 μm or more, 10 μm or more, 15 μm or more, 20 μm or more, 25 μm or more, 30 μm or more, 35 μm or more, 40 μm or more, 45 μm or more, 50 μm or more, 60 μm or more, 70 μm or more, or 80 μm or more). In some examples, the membrane 265 can have an average lateral dimension of 100 μm or less (e.g., 90 μm or less, 80 μm or less, 70 μm or less, 60 μm or less, 50 μm or less, 45 μm or less, 40 μm or less, 35 μm or less, 30 μm or less, 25 μm or less, 20 μm or less, 15 μm or less, 10 μm or less, 9 μm or less, 8 μm or less, 7 μm or less, 6 μm or less, 5 μm or less, 4.5 μm or less, 4 μm or less, 3.5 μm or less, 3 μm or less, 2.5 μm or less, 2 μm or less, 1.5 μm or less, or 1 μm or less). The average lateral dimension of the membrane 265 can range from any of the minimum values described above to any of the maximum values described above. For example, the membrane 265 can have an average lateral dimension of from 0.1 microns to 100 microns (e.g., from 0.1 μm to 50 μm, from 50 μm to 100 μm, from 0.1 μm to 20 μm, from 20 μm to 40 μm, from 40 μm to 60 μm, from 60 μm to 80 μm, from 80 μm to 100 μm, from 0.5 μm to 95 μm, or from 10 μm to 90 μm).

In some examples, the membrane 265 can have a tension per unit length of 0.0 Newtons per meter (N/m) or more (e.g., 0.01 N/m or more, 0.02 N/m or more, 0.03 N/m or more, 0.04 N/m or more, 0.05 N/m or more, 0.06 N/m or more, 0.07 N/m or more, 0.08 N/m or more, 0.09 N/m or more, 0.10 N/m or more, 0.11 N/m or more, 0.12 N/m or more, 0.13 N/m or more, 0.14 N/m or more, 0.15 N/m or more, 0.20 N/m or more, 0.25 N/m or more, 0.30 N/m or more, 0.35 N/m or more, 0.40 N/m or more, 0.45 N/m or more, 0.50 N/m or more, 0.60 N/m or more, 0.70 N/m or more, 0.80 N/m or more, 0.90 N/m or more, 1.0 N/m or more, 1.5 N/m or more, 2.0 N/m or more, 2.5 N/m or more, 3.0 N/m or more, 3.5 N/m or more, 4.0 N/m or more, 4.5 N/m or more, 5.0 N/m or more, 6.0 N/m or more, or 7.0 N/m or more). In some examples, the membrane 265 can have a tension per unit length of 10.0 N/m or less (e.g., 9.0 N/m or less, 8.0 N/m or less, 7.0 N/m or less, 6.0 N/m or less, 5.0 N/m or less, 4.5 N/m or less, 4.0 N/m or less, 3.5 N/m or less, 3.0 N/m or less, 2.5 N/m or less, 2.0 N/m or less, 1.5 N/m or less, 1.0 N/m or less, 0.90 N/m or less, 0.80 N/m or less, 0.70 N/m or less, 0.60 N/m or less, 0.50 N/m or less, 0.45 N/m or less, 0.40 N/m or less, 0.35 N/m or less, 0.30 N/m or less, 0.25 N/m or less, 0.20 N/m or less, 0.15 N/m or less, 0.14 N/m or less, 0.13 N/m or less, 0.12 N/m or less, 0.11 N/m or less, 0.10 N/m or less, 0.09 N/m or less, 0.08 N/m or less, 0.07 N/m or less, 0.06 N/m or less, or 0.05 N/m or less). The tension per unit length of the membrane 265 can range from any of the minimum values described above to any of the maximum values described above. For example, the membrane 265 can have a tension per unit length of from 0.0 to 10.0 N/m (e.g., from 0.0 N/m to 8.0 N/m, from 0.0 N/m to 5.0 N/m, from 0.0 N/m to 3.0 N/m, from 0.0 N/m to 1.0 N/m, from 0.0 to 0.5 N/m, from 0.0 to 0.3 N/m, or from 0.03 N/m to 0.12 N/m). The tension can be measured using atomic force microscopy.

The one or more ripples can, for example, have an average length of 1 nm or more (e.g., 2 nm or more, 3 nm or more, 4 nm or more, 5 nm or more, 6 nm or more, 7 nm or more, 8 nm or more, 9 nm or more, 10 nm or more, 15 nm or more, 20 nm or more, 25 nm or more, 30 nm or more, 35 nm or more, 40 nm or more, 45 nm or more, 50 nm or more, 55 nm or more, 60 nm or more, 65 nm or more, 70 nm or more, 75 nm or more, or 80 nm or more). In some examples, the one or more ripples can have an average length of 100 nm or less (e.g., 95 nm or less, 90 nm or less, 85 nm or less, 80 nm or less, 75 nm or less, 70 nm or less, 65 nm or less, 60 nm or less, 55 nm or less, 50 nm or less, 45 nm or less, 40 nm or less, 35 nm or less, 30 nm or less, 25 nm or less, 20 nm or less, 15 nm or less, 10 nm or less, 9 nm or less, 8 nm or less, 7 nm or less, 6 nm or less, or 5 nm or less). The average length of the one or more ripples can range from any or the minimum values described above to any of the maximum values described above. For example, the one or more ripples can have an average length of from 1 nm to 100 nm (e.g., from 1 nm to 90 nm, from 1 nm to 80 nm, from 1 nm to 70 nm, from 1 nm to 60 nm, from 5 nm to 50 nm, from 10 nm to 40 nm, or from 20 nm to 30 nm). The length of the ripples can, for example, be measured using electron microscopy.

In some examples, the one or more ripples can have an average height of 0.1 nm or more (e.g., 0.11 nm or more, 0.12 nm or more, 0.13 nm or more, 0.14 nm or more, 0.15 nm or more, 0.20 nm or more, 0.25 nm or more, 0.30 nm or more, 0.35 nm or more, 0.40 nm or more, 0.45 nm or more, 0.50 nm or more, 0.60 nm or more, 0.70 nm or more, 0.80 nm or more, 0.90 nm or more, 1.0 nm or more, 1.1 nm or more, 1.2 nm or more, 1.3 nm or more, 1.4 nm or more, or 1.5 nm or more). In some examples, the one or more ripples can have an average height of 2.0 nm or less (e.g., 1.9 nm or less, 1.8 nm or less, 1.7 nm or less, 1.6 nm or less, 1.5 nm or less, 1.4 nm or less, 1.3 nm or less, 1.2 nm or less, 1.1 nm or less, 1.0 nm or less, 0.90 nm or less, 0.80 nm or less, 0.70 nm or less, 0.60 nm or less, 0.50 nm or less, 0.45 nm or less, 0.40 nm or less, 0.35 nm or less, 0.30 nm or less, 0.25 nm or less, or 0.20 nm or less). The average height of the one or more ripples can range from any of the minimum values described above to any of the maximum values described above. For example, the one or more ripples can have an average height of from 0.1 nm to 2.0 nm (e.g., 0.1 nm to 1.5 nm, from 0.1 nm to 1.0 nm, from 0.1 nm to 0.70 nm, from 0.20 nm to 0.60 nm, from 0.30 nm to 0.50 nm, or from 0.35 nm to 0.45 nm). The height of the ripples can, for example, be measured using electron microscopy.

The membrane 265 can, for example, be fixed at one or both ends to a membrane substrate 258. In some examples, the membrane 265 is configured to vibrate through its central portion.

The membrane substrate 258 can, for example, comprise copper, silicon, silicon carbide, sapphire, or a combination thereof. In some examples, the membrane substrate 258 can comprise a grid comprising one or more apertures 263. In certain descriptions, the apertures 263 are areas between grid sidewalls that form window regions 264 of the membrane 265.

The following discussion discloses a certain example where the membrane 265 comprises graphene and the substrate 258 comprises a copper grid, but the same concepts can apply to any of the membranes 265 and/or membrane substrates 258 described herein.

In certain embodiments, the membrane 265 can comprise a single atomic plane of carbon from graphite as its active component. A sheet of graphene may be placed on top of a copper grid serving as the above noted membrane substrate 258 and define one or more apertures 263 within respective sections of the membrane. Each aperture 263, covered with graphene, can form an open frame geometry with freestanding graphene in between. When graphene is disposed on the copper grid, there is a strong van der Waals interaction (~0.1 J/m²) between the edge of the graphene and the copper grid cell sidewall 264 (FIG. 1A). Depending on the amount of excess graphene, the length of contact will naturally increase or decrease until the forces are balanced. This phenomenon is known as self-tensioning. The final tension can be ~0.1 N/m and the final geometry of the freestanding graphene can be composed of ripples (FIGS. 1A, 2A-2C). These ripples can form naturally and the ripples can have a typical size distribution of 20-24 nm in length and 0.3 to 0.5 nm in height. In order for ripples to form, the graphene must be free to self-compress to the final self-tension.

The compression strain associated with the ripple geometry is the change in the length divided by the original length. The compression strain can, for example, be 0.01% or more (e.g., 0.02% or more, 0.03% or more, 0.04% or more, 0.05% or more, 0.06% or more, 0.07% or more, 0.08% or more, 0.09% or more, 0.1% or more, 0.2% or more, 0.3% or more, 0.4% or more, 0.5% or more, 0.6% or more, 0.7% or more, or 0.8% or more). In some examples, the compression strain can be 1% or less (e.g., 0.9% or less, 0.8% or less, 0.7% or less, 0.6% or less, 0.5% or less, 0.4% or less, 0.3% or less, 0.2% or less, 0.1% or less, 0.09% or less, 0.08% or less, 0.07% or less, 0.06% or less, 0.05% or less, or 0.04% or less). The compression strain can, for example, range from any of the minimum values described above to any of the maximum values described above. For example, the compression strain can range from 0.01% to 1% (e.g., from 0.01% to 0.1%, from 0.1% to 1%, from 0.01% to 0.05%, from 0.05% to 0.1%, from 0.1% to 0.5%, from 0.5% to 1%, or from 0.05% to 0.5%).

It is possible to apply a tensile load to the substrate 265 and graphene assembly, and alter the shape of the ripples, as the graphene is stretched. Altering the shape of the ripples alters the compressive strain and alters the rate at which the graphene will spontaneously invert its curvature. Alternatingly, by tuning the external load, the frequencies of vibration of the membrane 265 can be altered.

When held at room temperature (e.g. 300 K), the freestanding graphene can spontaneously vibrate, due to the thermal energy continuously flowing from the bar supports of the copper grid. At an atomic level as shown in FIG. 1A, when the graphene membrane 265 is held at room temperature, each carbon atom has a kinetic energy (0.5 m v², where m is the mass of the carbon atom and v is its velocity) equal to $k_B T$ or about 25 meV. This is an abundant source of energy, since graphene has $4 \times 10^{15}$ atoms/cm². Electrical power calculations predict each ripple can produce 10 pW of power, equivalently 25,0000 W/m², which places it in a similar category to wind and solar energy production. Since the velocity is not zero, the atoms within the membrane 265 are in constant motion. Since the atoms 267 are connected together in a network, the entire membrane 265 forms ripples and at times these ripples invert their curvature between peaks 286 and troughs 289. Each ripple has thousands of atoms and when the curvature inverts itself, all the atoms move coherently together, in phase, and this energy can be harvested. This natural motion could be used as the active component of an energy harvesting device 100, or this natural motion could be used to drive the active component of a conventional vibration energy harvesting device 100.

In some examples, the membrane 265 can have one ripple. In some examples, the membrane 265 can comprise a plurality of ripples 271 that can form a network of interacting ripples. A membrane 265 that measures 10 microns by 10 microns can, in some examples, have over 100,000 ripples. The motion of one ripple 271 can affect the motion of other ripples nearby, thus providing a feedback mechanism which enhances the energy harvesting capability.

The energy harvesting devices 100 further comprise a load component 175 electrically, magnetically, and/or mechanically coupled to the membrane 265 and/or the substrate 258, such that, in non-limiting examples, the component 175 is configured to harvest or measure energy from the membrane 265.

In some examples, the membrane substrate 258 is thermally conductive and the membrane 265 is in thermal contact with the membrane substrate 258, wherein the thermal energy of the membrane substrate 258 can be converted into a vibration of the membrane 265 such that the membrane 265 has a vibrational energy, and a load component 175, 199, 275 is configured to convert the vibrational energy of the membrane 265 into electrical, magnetic, and/or mechanical energy, thereby harvesting energy from the membrane 265. In some examples, the thermal energy can comprise ambient thermal energy and/or ambient kinetic energy.

In some examples, the membrane 265 can have a vibrational energy and the component 275 is configured to convert the vibrational energy of the membrane 265 into electrical, magnetic, and/or mechanical energy, thereby harvesting energy from the membrane 265. In some examples, the vibrational energy comprises ambient vibrational energy.

The vibrational energy can, for example, comprise vibrations having a frequency of 0.1 milliHertz or more (e.g., 0.5 mHz or more, 1 mHz or more, 5 mHz or more, 10 mHz or more, 50 mHz or more, 100 mHz or more, 500 mHz or more, 1 Hz or more, 5 Hz or more, 10 Hz or more, 50 Hz or more, 100 Hz or more, 500 Hz or more, 1 kiloHertz (kHz) or more, 10 kHz or more, 50 kHz or more, 100 kHz or more, 500 kHz or more, 1 megaHertz (MHz) or more, 5 MHz or more, 10 MHz or more, 50 MHz or more, 100 MHz or more, 500 MHz or more, or 1 GigaHertz (GHz) or more). In some examples, the vibrational energy can comprise vibrations having a frequency of 10 GigaHertz (GHz) or less (e.g., 5 GHz or less, 1 GHz or less, 500 MHz or less, 100 MHz or less, 50 MHz or less, 10 MHz or less, 5 MHz or less, 1 MHz or less, 500 kHz or less, 100 kHz or less, 50 kHz or less, 10 kHz or less, 5 kHz or less, 1 kHz or less, 500 Hz or less, 100 Hz or less, 50 Hz or less, 10 Hz or less, 5 Hz or less, 1 Hz or less, 500 mHz or less, 100 mHz or less, 50 mHz or less, 10 mHz or less, or 5 mHz or less). The frequency of the vibrations of the vibrational energy can range from any of the minimum values described above to any of the maximum values described above. For example, the vibrational energy can comprise vibrations having a frequency of from 0.1 mHz to 10 GHz (e.g., from 0.1 mHz to 1 kHz, from 1 kHz to 10 GHz, from 0.1 mHz to 1 Hz, from 1 Hz to 1 kHz, from 1 kHz to 1 MHz, from 1 MHz to 10 GHz, or from 5 mHz to 1 GHz).

In some examples, the membrane 265 is capable of vibrating continuously since it can harness ambient energy at lower frequencies and independent of noise constraints. In turn, this ambient energy can be harnessed by the load component 175, 275 and converted into other forms of energy, including electricity.

Whereas conventional vibrational energy harvesting devices 100 have required a macroscopic external driving force to harvest vibrational energy (e.g., the vibrations in a moving car), in some example the energy harvesting devices 100 described herein can be driven via ambient conditions.

For example, the energy harvesting devices 100 described herein can harvest energy in a quiet environment as well as a noisy environment.

In some examples, the energy harvesting device 100 can be configured such that each of the one or more ripples can produce a power of 1 picoWatt (pW) or more (e.g., 5 pW or more, 10 pW or more, 15 pW or more, 20 pW or more, 25 pW or more, 30 pW or more, 35 pW or more, 40 pW or more, 45 pW or more, 50 pW or more, 55 pW or more, 60 pW or more, 65 pW or more, 70 pW or more, 75 pW or more, 80 pW or more, 85 pW or more, or 90 pW or more). In some examples, the energy harvesting device 100 can be configured such that each of the one or more ripples can produce a power of 100 pW or less (e.g., 95 pW or less, 9095 pW or less, 8595 pW or less, 8095 pW or less, 7595 pW or less, 7095 pW or less, 6595 pW or less, 6095 pW or less, 5595 pW or less, 5095 pW or less, 4595 pW or less, 4095 pW or less, 3595 pW or less, 3095 pW or less, 2595 pW or less, 2095 pW or less, 1595 pW or less, or 1095 pW or less). The power produced by each of the one or more ripples can range from any of the minimum values described above to any of the maximum values described above. For example, the energy harvesting device 100 can be configured such that each of the one or more ripples can produce a power of from 1 pW to 100 pW (e.g., from 1 pW to 50 pW, from 50 pW to 100 pW, from 1 pW to 30 pW, from 20 pW to 40 pW, from 40 pW to 60 pW, from 60 pW to 80 pW, from 80 pW to 100 pW, from 10 pW to 90 pW, or from 20 pW to 80 pW).

In some examples, the energy harvesting device 100 can have a power density of 1 Watts per meters squared ($W/m^2$) or more (e.g., 2 $W/m^2$ or more; 3 $W/m^2$ or more; 4 $W/m^2$ or more; 5 $W/m^2$ or more; 10 $W/m^2$ or more; 50 $W/m^2$ or more; 100 $W/m^2$ or more; 500 $W/m^2$ or more; 1,000 $W/m^2$ or more; 5,000 $W/m^2$ or more; 10,000 $W/m^2$ or more; or 50,000 $W/m^2$ or more). In some examples, the energy harvesting device 100 can have a power density of 100,000 $W/m^2$ or less (e.g., 90,000 $W/m^2$ or less; 80,000 $W/m^2$ or less; 70,000 $W/m^2$ or less; 60,000 $W/m^2$ or less; 50,000 $W/m^2$ or less; 10,000 $W/m^2$ or less; 5,000 $W/m^2$ or less; 1,000 $W/m^2$ or less; 500 $W/m^2$ or less; 100 $W/m^2$ or less; 50 $W/m^2$ or less; 10 $W/m^2$ or less; or 5 $W/m^2$ or less). The power density of the energy harvesting device 100 can range from any of the minimum values described above to any of the maximum values described above. For example, the energy harvesting device 100 can have a power density of from 1 $W/m^2$ to 100,000 $W/m^2$ (e.g., from 1 $W/m^2$ to 1,000 $W/m^2$; from 1,000 $W/m^2$ to 100,000 $W/m^2$; from 1 $W/m^2$ to 100 $W/m^2$; from 100 $W/m^2$ to 1,000 $W/m^2$; from 1,000 $W/m^2$ to 10,000 $W/m^2$; from 10,000 $W/m^2$ to 100,000 $W/m^2$; from 10 $W/m^2$ to 50,000 $W/m^2$; or from 100 $W/m^2$ to 10,000 $W/m^2$).

Referring now to FIG. 3, in some examples, the membrane 265 can have an electrical charge and a load component 175 (shown explicitly in FIG. 4) is a capacitor electrically coupled to the membrane 265, wherein the circuit including the membrane 265 is configured to convert the vibrational energy of the charged membrane 265 into an alternating electrical current, thereby harvesting energy from the membrane 265. For example, the movement of the charged membrane 265 induces current in a nearby load component.

In some examples, the membrane 265 has a vibrational energy and the circuit is configured to detect a signal produced by the vibrational energy of the membrane 265. The vibrational energy can, for example, comprise ambient vibrational energy.

The vibrational energy can, for example, comprise vibrations having a frequency of 0.1 milliHertz or more (e.g., 0.5 mHz or more, 1 mHz or more, 5 mHz or more, 10 mHz or more, 50 mHz or more, 100 mHz or more, 500 mHz or more, 1 Hz or more, 5 Hz or more, 10 Hz or more, 50 Hz or more, 100 Hz or more, 500 Hz or more, 1 kiloHertz (kHz) or more, 10 kHz or more, 50 kHz or more, 100 kHz or more, 500 kHz or more, 1 megaHertz (MHz) or more, 5 MHz or more, 10 MHz or more, 50 MHz or more, 100 MHz or more, 500 MHz or more, or 1 GigaHertz (GHz) or more). In some examples, the vibrational energy can comprise vibrations having a frequency of 10 GigaHertz (GHz) or less (e.g., 5 GHz or less, 1 GHz or less, 500 MHz or less, 100 MHz or less, 50 MHz or less, 10 MHz or less, 5 MHz or less, 1 MHz or less, 500 kHz or less, 100 kHz or less, 50 kHz or less, 10 kHz or less, 5 kHz or less, 1 kHz or less, 500 Hz or less, 100 Hz or less, 50 Hz or less, 10 Hz or less, 5 Hz or less, 1 Hz or less, 500 mHz or less, 100 mHz or less, 50 mHz or less, 10 mHz or less, or 5 mHz or less). The frequency of the vibrations of the vibrational energy can range from any of the minimum values described above to any of the maximum values described above. For example, the vibrational energy can comprise vibrations having a frequency of from 0.1 mHz to 10 GHz (e.g., from 0.1 mHz to 1 kHz, from 1 kHz to 10 GHz, from 0.1 mHz to 1 Hz, from 1 Hz to 1 kHz, from 1 kHz to 1 MHz, from 1 MHz to 10 GHz, or from 5 mHz to 1 GHz).

For example, in certain implementations of apparatus 100, a circuit can be operatively connected with the membrane 265, wherein the membrane 265 will have a predetermined sensitivity operable to harness relatively low frequency vibrations. Accordingly, the circuit can be configured to detect the buckling frequency of the membrane 265 and when a predetermined change in the frequency of the membrane 265 is detected by the circuit, for example based on the presence of an added mass, an output as to the detection of the mass will be determined and transmitted, due to the sensitivity of the membrane 265 of the device.

Methods of Making

Also disclosed herein are methods of making the energy harvesting devices and sensors described herein. For example, the methods of making the energy harvesting devices and/or sensors described herein can comprise: compressing a sheet of the two-dimensional material to form the membrane; disposing the membrane on the substrate; and electrically, magnetically, and/or mechanically coupling the component to the membrane and/or the substrate.

Compressing the sheet of the two-dimensional material can, for example, comprise applying a lateral compression force 271 across the sheet, as shown schematically in FIGS. 2A-2C. The lateral compression force can, for example, have a magnitude of 1 nanoNewton (nN) or more (e.g., 5 nN or more, 10 nN or more, 15 nN or more, 20 nN or more, 25 nN or more, 30 nN or more, 35 nN or more, 40 nN or more, 45 nN or more, 50 nN or more, 55 nN or more, 60 nN or more, 65 nN or more, 70 nN or more, 75 nN or more, 80 nN or more, 85 nN or more, or 90 nN or more). In some examples, the lateral compression force can be 100 nN or less (e.g., 95 nN or less, 90 nN or less, 85 nN or less, 80 nN or less, 75 nN or less, 70 nN or less, 65 nN or less, 60 nN or less, 55 nN or less, 50 nN or less, 45 nN or less, 40 nN or less, 35 nN or less, 30 nN or less, 25 nN or less, 20 nN or less, 15 nN or less, or 10 nN or less). The lateral compression force can range from any of the minimum values described above to any of the maximum values described above. For example, the lateral compression force can be from 1 nN to 100 nN (e.g., from 1 nN to 50 nN, from 50 nN to 500 nN, from 1 nN to 20 nN, from 20 nN to 40 nN, from 40 nN to 60 nN, from 60 nN to 80 nN, from 80 nN to 100 nN, from 5 nN to 95 nN, from 10 nN to 90 nN, or from 20 nN to 80 nN).

In some examples, the sheet of two-dimensional material has an original length and the compressed sheet of the two-dimensional material has a compressed length, for example as shown schematically in FIG. 2C, wherein the compressed length is shorter than the original length by an amount of from 0.01% to 1%.

In some examples, the buckling range of the membrane 265 can be 0.2 nm or more (e.g., 0.3 nm or more, 0.4 nm or more, 0.5 nm or more, 0.6 nm or more, 0.7 nm or more, 0.8 nm or more, 0.9 nm or more, 1.0 nm or more, 1.5 nm or more, 2.0 nm or more, 2.5 nm or more, or 3.0 nm or more). In some examples, the buckling range of the membrane can be 4.0 nm or less (e.g., 3.5 nm or less, 3.0 nm or less, 2.5 nm or less, 2.0 nm or less, 1.5 nm or less, 1.0 nm or less, 0.9 nm or less, 0.8 nm or less, 0.7 nm or less, 0.6 nm or less, or 0.5 nm or less). The buckling range can range from any of the minimum values described above to any of the maximum values described above. For example, the buckling range can be from 0.2 nm to 4.0 nm (e.g., from 0.2 nm to 2.0 nm, from 2.0 nm to 4.0 nm, from 0.2 nm to 1.0 nm, from 1.0 nm to 2.0 nm, from 2.0 nm to 3.0 nm, from 3.0 nm to 4.0 nm, or from 0.5 nm to 3.5 nm). The buckling range is generally equal to two times the average height of the one or more ripples. Mechanical buckling is inversion of the curvature of a ripple.

Forming the membrane into a pre-buckling state, by compressing the two-dimensional sheet as disclosed herein and illustrated by the example of FIG. 2, can slow the process of buckling so that the membrane 265 is capable of interacting and harnessing lower frequency vibrations, such as those associated with ambient conditions. If the membrane 265 is disposed onto the membrane substrate 258 using a strain-free method, then the membrane can self-compress into a pre-buckling state. For example, with graphene on copper, the copper can be etched off suing an iron chloride liquid solution. The graphene can remain floating on the surface of the solution alter the copper is removed. Next, the graphene can be lifted out of the solution and disposed on a membrane substrate 258 comprising a grid. Compressing or expanding the grid can alter the size of the ripples and alter the natural frequency of the spontaneous curvature inversion.

Figure 3A:
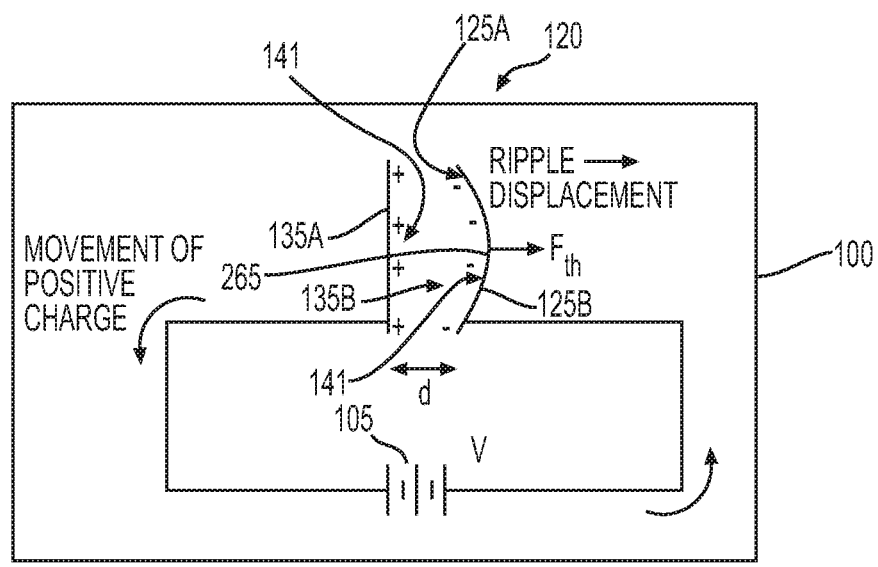
FIG. 3A is a schematic view of a variable capacitor circuit having one fixed plate and one displaceable plate as set forth herein.

In one embodiment shown in FIG. 3A, the membrane 265 is a freestanding membrane 265 having a first surface 125A and a second surface 125B. The first surface membrane 265 is subject to displacement due to the ripples 261 forming across the membrane 265 and forming peaks 286 and troughs 289 as described above.

FIG. 3A illustrates one non-limiting embodiment of certain fundamental mechanisms behind vibration energy harvesting using a constant voltage electrostatic method. FIG. 3A shows a variable capacitor 120 at the top, attached by conductors to a battery 105 at the bottom [2]. The variable capacitor 120 includes a first capacitor plate 135A and second capacitor plate 135B. The second capacitor plate 135B is subject to displacement due to a force Fth acting upon the second capacitor plate 135B. As noted above, the second capacitor plate 135B is formed of a material that collects charge and is sufficiently pliable to be displaced by ambient forces, either thermal or kinetic. The battery 105 initially places charge onto the capacitor 120, drawing energy from the battery. Since the two plates 135A, 135B each have an opposite charge, they are attracted to each other due to the Coulomb force. Nevertheless, a support structure of the variable capacitor 120 is holding them apart. Next, the second capacitor plate 135B (e.g., the right side of FIG. 3A) is moved by an external force to the right. It is notable that this force must overcome the electrostatic attraction that the two plates 135A, 135B have toward one another. This force is doing work on the electromechanical system. With the plates 135A, 135B of the capacitor 120 further apart, the capacitor can now store less charge than it currently has on the first and second capacitor plates 135A, 135B. This charge is subject to the equation, $C=Q/V$, where C is the capacitance of the capacitive region 141 that went down in value with increased separation between the plates 135A, 135B (i.e., as a distance (d) between the plates 135A, 135B increases, the capacitance decreases and vice versa). V is the battery 105 voltage which is constant, and Q is the total charge on the plates and within the capacitive region 141. Consequently, as the distance (d) increases, current (denoted according to standard notation of positive to negative direction) moves off the first plate 135A (e.g., the left plate as shown), back inside the battery 105 (recharging the battery), out the other side of the battery 105 and onto the second, displaceable plate 135B of the variable capacitor 120. The displacement due to the illustrated force Fri, of FIG. 3A reduces the overall charge on the variable capacitor 120. The external force is responsible for the work or energy required to move the charge. This illustration shows the basic physical mechanism, by which an external force can be used to move electrical charges off a variable capacitor 120.

Figure 3B:
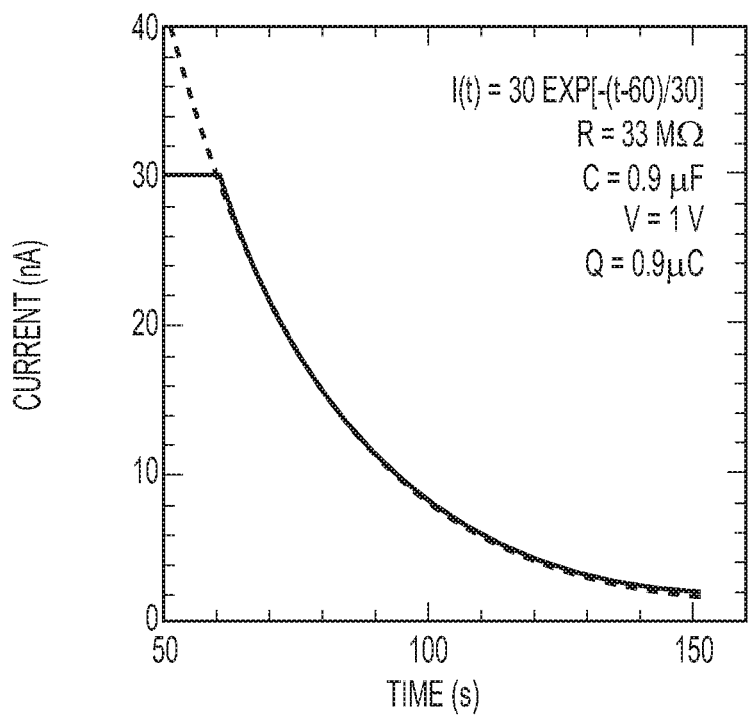
FIG. 3B is a plot of current in nanoamps discharged from a storage capacitor connected to the circuit of FIG. 3A.

In one embodiment and in accordance with the above disclosure, the second capacitor plate 135B (e.g., the displaceable plate on the right side of the variable capacitor 120 in FIG. 3) is freestanding graphene, and the external force moving the freestanding graphene comes from the thermally induced and/or kinetic motion of atoms in the freestanding graphene. FIG. 3B illustrates an example of a current response for the embodiment of a variable capacitor according to FIG. 3A. FIG. 3B is an example current plot across a load component 175, 275 that has harvested energy as stored charge from the example circuit of FIG. 3A. After harvesting the energy, a testing circuit is used to measure the collected charge by connecting a capacitor (C=0.9 microfarad) that served as the load component 175, 275 to a measurement circuit driven by the load component 175, 275 across a 33 megaohm resistor. From the measurements in the Figure, $I_{max}=30$ nA and the total stored charge is $Q_{max}=I_{max}RC=900$ nC. Also, total harvested energy is $U_{max}=Q^2/2C=450$ nJ. Average source power is $P=U_{max}/T=Q^2/2CT$, where T is the time spent harvesting energy. In the example of FIG. 3B, the variable capacitor 120 was charged with a 1V power supply.

Nothing in this disclosure limits the embodiments to any one configuration for charge displacement. For example, in another embodiment, the membrane 265 is an insulating material that is impregnated with charged particles that are then unable to move along the membrane. In this case, the membrane vibration will induce a current to flow without needing a voltage source. As described below, this embodiment may be dominated by current tunneling from a proximate electrode or by variable capacitance induced by the fixed charge on the membrane (i.e., an internally polarized embodiment). Also, as in other embodiments below, the induced current could charge a fixed storage capacitor or power a resistive load.

Figure 4A:
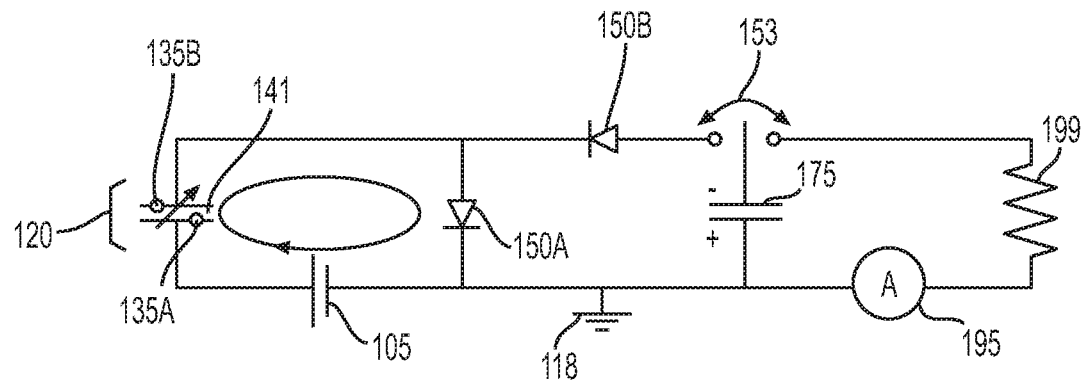
FIG. 4A is a schematic diagram of a variable capacitance across one fixed capacitor plate and one displaceable capacitor plate charging due to a voltage source as set forth herein.
Figure 4B:
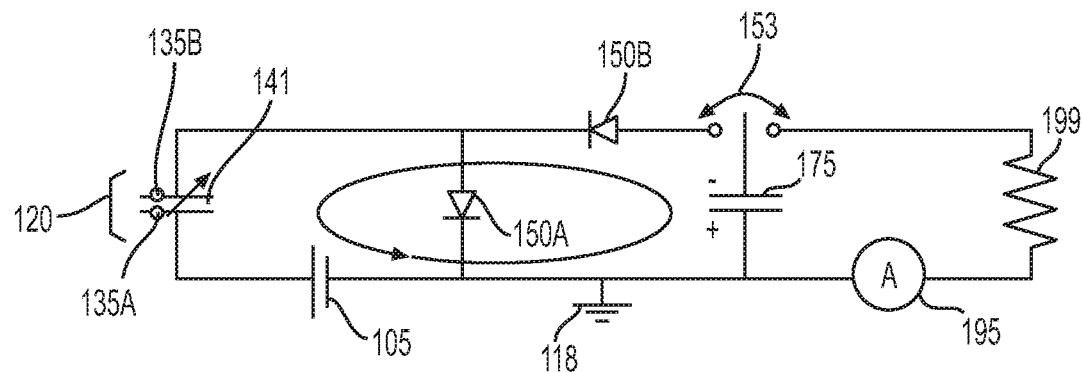
FIG. 4B is a schematic diagram of a variable capacitance across one fixed capacitor plate and one displaceable capacitor plate discharging to a fixed storage capacitor load and charging the voltage source as set forth herein.
Figure 4C:
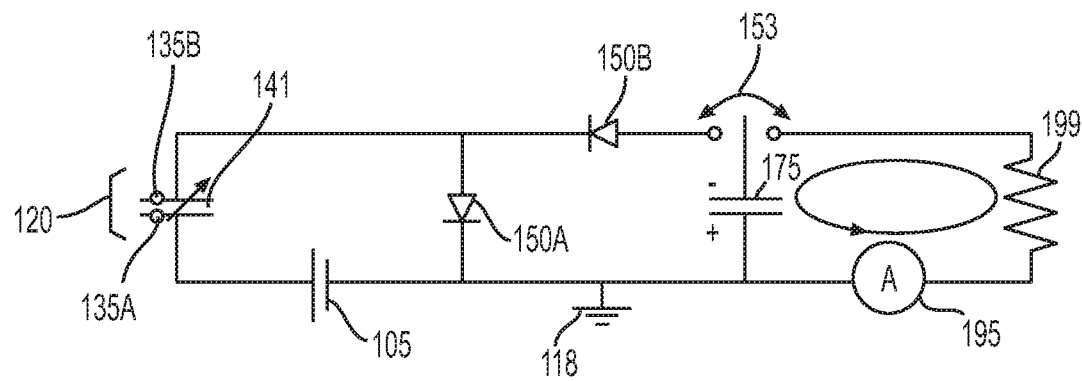
FIG. 4C is a schematic diagram of a storage capacitor discharging across a resistive ammeter load as set forth herein.

FIG. 4 illustrates another shows the energy harvesting electronic circuit. The circuit is reproduced three times (FIG. 4A, FIG. 4B, FIG. 4C) to show its three different functions [3, 4]. The circuit has one voltage source (e.g., battery 105), one variable capacitor 120 (including a first capacitor plate 135A and a second capacitor plate 135B), two diodes 150A, 150B, a switch 153, one fixed storage capacitor 175 connected as a first load component, and another switched load circuit including one resistor 199, and an ammeter 195 connected to ground 118. The first capacitor plate 135A may be in a fixed position, and the second capacitor plate 135B may be displaceable, such as the membrane 265 described above. In the embodiment utilizing a membrane for a capacitor plate 135B, a first surface 125A of the membrane faces the first capacitor plate 135A. A second surface 125B of the membrane is opposite the first surface 125A.

The top circuit diagram in FIG. 4A illustrates the initial charge flow onto the variable capacitor 120. Current only flows in the illustrated clockwise direction shown in the left part of the circuit—from the battery 105 to the variable capacitor 120, through the diode 150A and back to the battery 105. The energy, U required to charge the capacitor is $U=0.5\,C_{max}\,V$, where $C_{max}$ is the maximum capacitance of the variable capacitor 120 and V is the voltage on the power supply 105. This energy comes from the power supply 105. This circuit, showing the initial charge (clockwise in FIG. 4A), establishes an initial charge at a first distance (d) between the plates 135A, 135B of the variable capacitor 120. The left side of the circuit illustrated with clockwise current of FIG. 4A also establishes a maximum capacitance $C_{max}$ that the capacitive region 141 can achieve. The closer the capacitor plates 135A, 135B are positioned to each other in a given cycle of capacitor plate 135B displacement, the greater the capacitance between the plates will be achieved.

In the middle circuit illustrated as FIG. 4B, an external force moves one plate 135B of the variable capacitor 120 away from the other side (i.e., away from the first capacitor plate 135A) and thereby reduces the overall capacitance to $C_{min}$. A smaller capacitor holds less charge, therefore the excess charge must flow off the variable capacitor 120 through the battery 105 in the wrong direction (recharging it). This excess charge must exit the battery 105 on the other side, then flow to the fixed storage capacitor 175 in the middle of the circuit, through the switch 153, through the second diode 150B and back to the variable capacitor 120 to complete the circuit. This charge flow stores charge on the fixed storage capacitor 175. Each time the cycle is repeated, additional charge is placed on the fixed storage capacitor 175.

Once the fixed storage capacitor 175 is charged enough, then the switch 151 can be flipped to the right and the fixed storage capacitor 175 can be used to power the circuit on the right. In this case, the current runs through the resistor 199 and then through an ammeter 195 to measure how much charge was harvested by the variable capacitor circuit. The following formulas in the illustrated Tables may be used to illustrate the current and charge changes present in the circuit of FIGS. 4A-4C.

TABLE 1

Variable Capacitance $$C(t) = \frac{\varepsilon_o A}{d(t)}$$

$$\Delta C(t) = \frac{\varepsilon_o A}{d_o^2} \Delta d(t)$$

$$\Delta Q(t) = \frac{\varepsilon_o A}{d_o^2} \Delta d(t) V_{stm}$$

TABLE 1-continued

Variable Capacitance $$I_{\Delta C}(t) = \frac{\varepsilon_o A}{d_o^2} \Delta d(t) V_{stm} f$$

TABLE 2

Variable Tunneling $$I_T(t) = I_{stm}\, e^{-kG_{stm}\Delta d(t)}$$
$$I_{\Delta T}(t) = I_{stm} - I_{stm}\, e^{-kG_{stm}\Delta d(t)}$$
$$I_{\Delta T}(t) = I_{stm}\, k\, G_{stm}\, \Delta d(t)$$

TABLE 3 parallel currents add $$I_{ch}(t) = \frac{\varepsilon_o A f \Delta d(t)}{d_o^2} V_{stm} + k\, G_{stm} \Delta d(t) I_{stm}$$

$$\langle I_{ch} \rangle = \frac{\varepsilon_o A f \langle \Delta d \rangle}{d_o^2} V_{stm} + k\, G_{stm} \langle \Delta d \rangle I_{stm}$$

$$Q_{ch}(t) = \frac{\varepsilon_o A f \langle \Delta d \rangle}{d_o^2} V_{stm} t + k\, G_{stm} \langle \Delta d \rangle I_{stm} t$$

$$Q_{ch}^{max}(I_{stm}) = \frac{\varepsilon_o A f \langle d(t) \rangle}{d_o^2} V_{stm} T + k\, G_{stm} \langle d(t) \rangle T I_{stm}$$

Figure 1B:
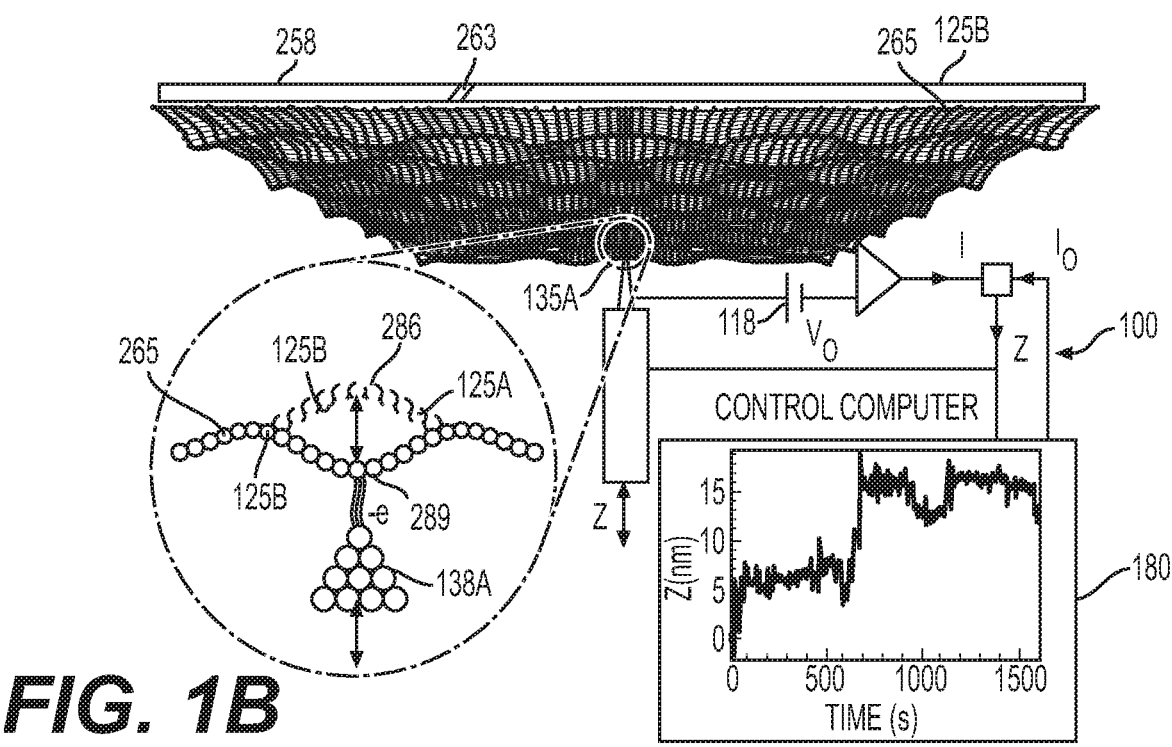
FIG. 1B is a schematic of an energy harvesting and energy sensing system as set forth in this disclosure.

FIGS. 5-10 illustrate the data resulting from use of the circuit layout shown in FIGS. 4A-4C when the first capacitor plate 135A is a tip 138A of a scanning tunneling microscope (STM) as shown in FIG. 1B. Nothing in this disclosure is limited to any variable capacitor plate being constructed of an STM tip, and the disclosure encompasses the variable capacitor 120 having plates 135A, 135B of any metal contact construction formed in any functional shape and/or part of other connected apparatuses. In one non-limiting example, however, a scanning tunneling microscope (STM) comprises a metal tip 138A that is made of a conductive material and configured to transmit and/or receive charge carriers to a receiving surface as discussed herein. As shown in the example of FIG. 1B, the STM positions the tip 138A over a sample (in this example a membrane 265) at close distances—mere Angstroms in some instances. In fact, the distances are so close that one use of an STM is to track atomic level changes in a topography that may be mapped by scanning the tip over the sample in a raster process. In a standard use for an STM, the distance of the tip from the sample may be adjusted in the z axis as the scanning occurs across the sample in the x-y plane. A voltage is applied between the tip 138A of the STM and a sample, with the tip having a defined shape that, in certain non-limiting embodiments, tapers to an atom wide tip of the conductive metal as shown in the pyramid shape of the tip 138A in FIG. 1B. In addition to standard uses of scanning tunneling microscopes (STMs), the use of an STM in the context of this disclosure includes, but is not limited to, a stationary STM positioned in a fixed space relative to a membrane 265 as described above. Electron tunneling between the tip 138A and a sample, in this case the membrane 265, produces a current that can be maintained in a feedback loop that controls the power supply 105. In one non-limiting embodiment of uses for a scanning tunneling microscope (STM), an STM can also be set up to place the tip in proximity to the sample, i.e., the membrane 265, and measure changes in charge accumulation at numerous set point currents applied to the STM. The changes in charge accumulation on a variable capacitor are then used to determine energy levels of quantum states in the sample (i.e., measuring energy level and charge availability of atomic level events in a sample). FIGS. 5-10 illustrate that for instances in which the STM tip 138A serves as the first capacitor plate 135A, different setpoints for the setpoint current of the STM can be used to test the power harvesting ability of a vibrating membrane as described above. The variable capacitor 120 in these examples includes a first capacitor plate 135A made up of the STM tip 138A and a second capacitor plate 135B made up of the membrane 265 or a portion thereof, which in this example is graphene. More specifically, and without limiting the disclosure to any one embodiment, the second capacitor plate 135B includes a first surface 125A of the membrane 265 on which charge is collected. And in yet another non-limiting embodiment, the tip 138A of the scanning tunneling microscope (STM) scans a surface of the membrane and collects data regarding charge on the variable capacitor and energy due to that charge at window regions 264 of the membrane 265, wherein the window regions 264 making up an overall membrane surface may have individualized atomic dimensions determined beforehand. Given that in certain embodiments, the STM tip 138A is stationary relative to the membrane 265, most proximate window regions may be analyzed as having larger dimensions than window regions at portions of the membrane farther away from the tip 138A. In other embodiments, window regions 264 that are remote from the tip may be statistically analyzed as contributing less charge to an overall harvesting operation. The dimensions of window regions under consideration and charge harvesting from each window region can be pre-planned by strategic tip positioning relative to the membrane 265. One non-limiting goal of the STM and membrane 265 setup is to control charge accumulation on a variable capacitor 120 formed between the tip and the membrane and provide for load components that harvest and/or utilize that charge accumulation for power.

Figure 5:
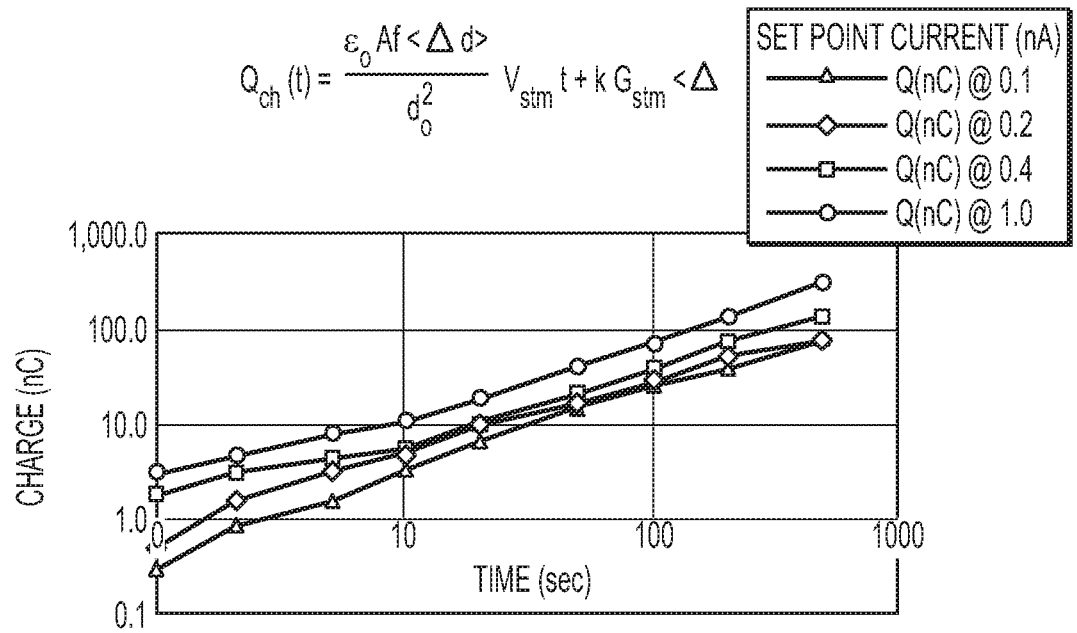
FIG. 5 is a plot of charge accumulated in nano-Coulombs in a storage capacitor after operating the circuit in FIGS. 4A and 4B for the time shown and the tunneling current set points for the microscope as disclosed herein.

FIG. 5 illustrates charge stored in nano-coulombs on the variable capacitor 120 from the kinetic energy of the freestanding graphene membrane 265 as a function of harvesting time in seconds. Each trace is acquired at a different STM setpoint current in nano-amps and follows the following equation:

$$Q_{ch}(t) = \frac{\varepsilon_o A f \langle \Delta d \rangle}{d_o^2} V_{stm} t + k G_{stm} \langle \Delta d \rangle I_{stm} t$$

Figure 6:
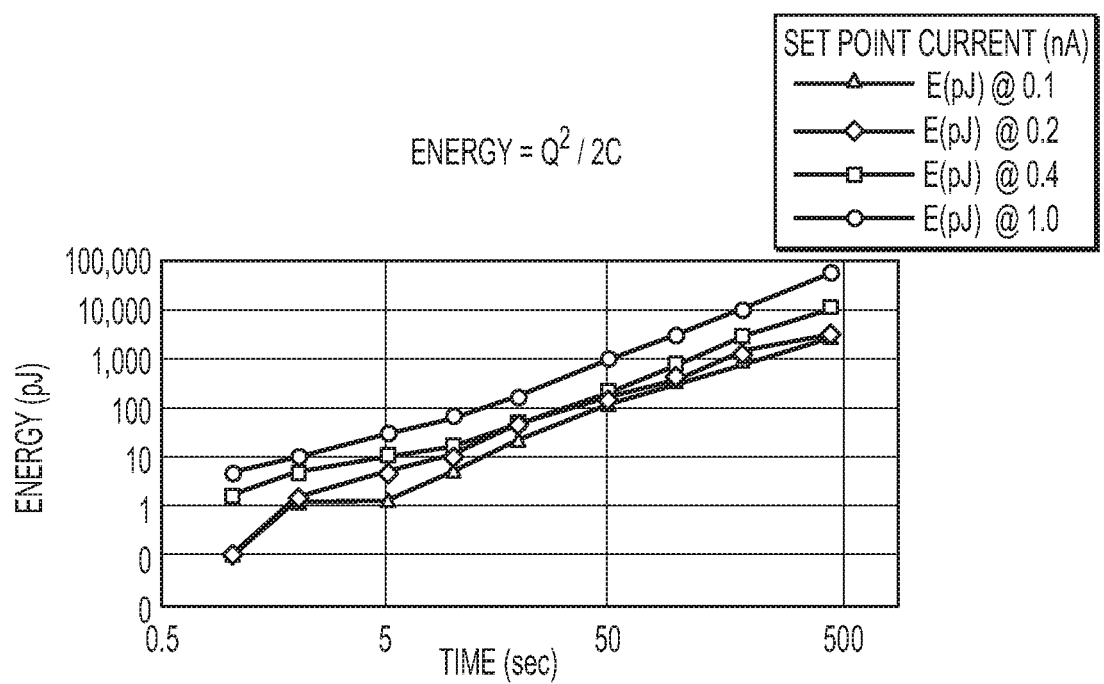
FIG. 6 is a plot of energy in pico-Joules stored in a storage capacitor after operating the circuit in FIGS. 4A and 4B for the time shown and the tunneling current set point currents for the microscope as disclosed herein.

FIG. 6 illustrates energy stored in pico-joules on the variable capacitor 120 from the kinetic energy of the freestanding graphene membrane 265 as a function of harvesting time in seconds. Each trace is acquired at a different STM setpoint current in nano-amps and follows the equation:

Energy=$Q^2/2C$

Figure 7:
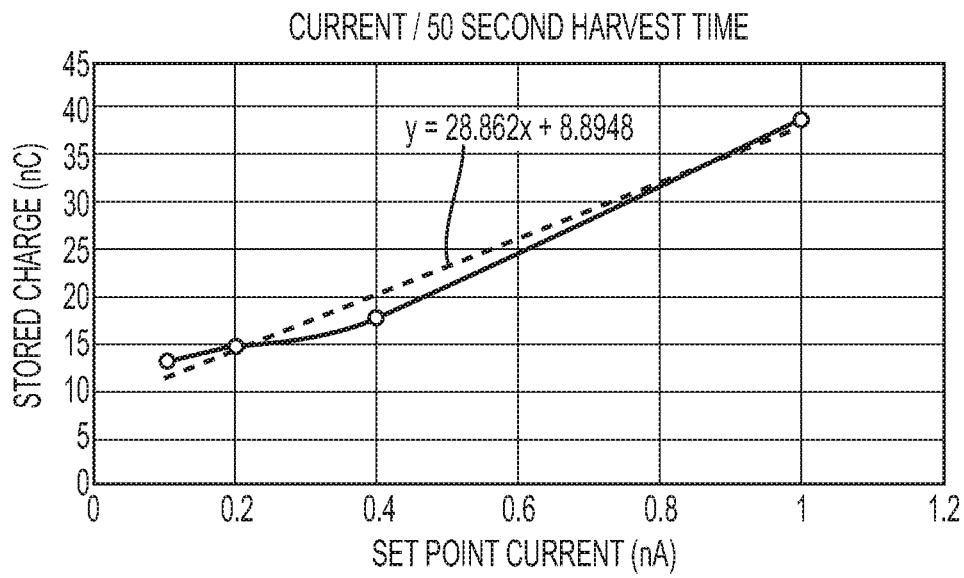
FIG. 7 is a plot of charge stored in nano-Coulombs in the storage capacitor after 50 second energy harvesting time at numerous set point currents for the microscope as disclosed herein.

FIG. 7 illustrates charge stored in nano-coulombs on the variable capacitor 120 from the kinetic energy of the freestanding graphene membrane 265 as a function of the STM setpoint current in nano-amps, and for a harvesting time of 50 seconds. The slope and intercept are equal to the terms in the mathematical expression.

Figure 8:
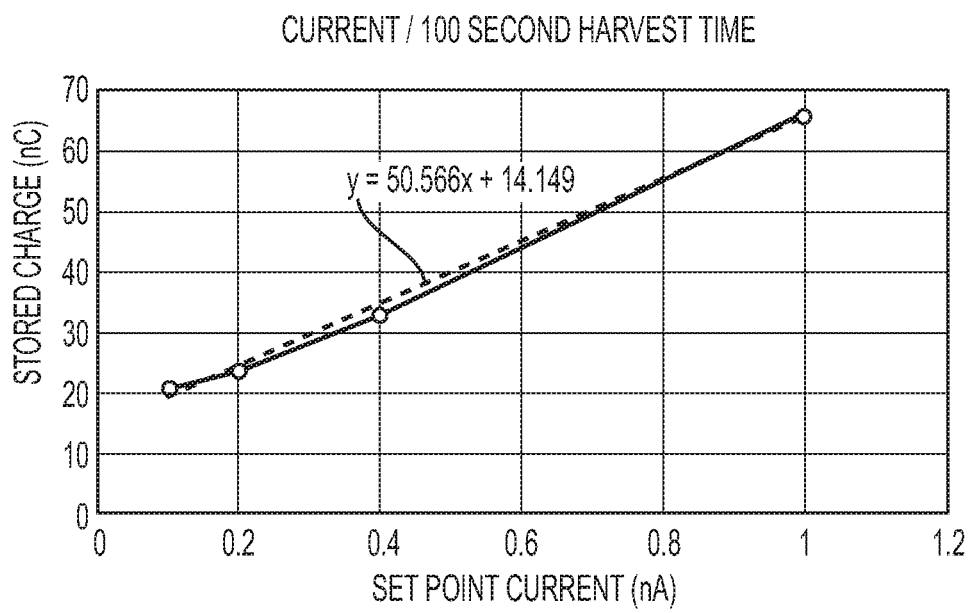
FIG. 8 is a plot of charge stored in nano-Coulombs in the storage capacitor after 100 second harvest time at numerous set point currents for the microscope as disclosed herein.

FIG. 8 illustrates charge stored in nano-coulombs on the variable capacitor 120 from the kinetic energy of the freestanding graphene membrane 265 as a function of the STM setpoint current in nano-amps, and for a harvesting time of 100 seconds. The slope and intercept are equal to the terms in the mathematical expression.

Figure 9:
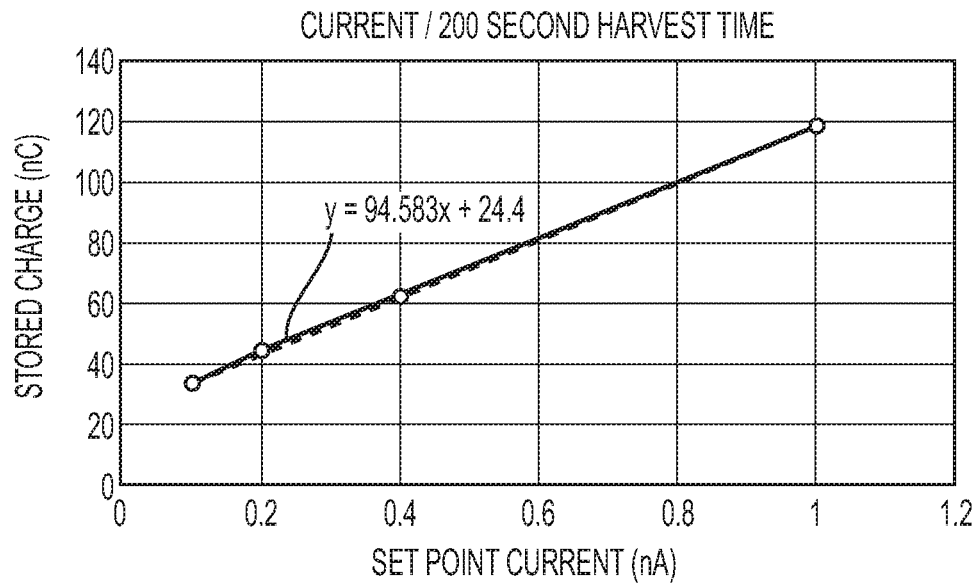
FIG. 9 is a plot of charge stored in nano-Coulombs in the storage capacitor after 200 second harvest time at numerous set point currents for the microscope as disclosed herein.

FIG. 9 illustrates charge stored in nano-coulombs on the variable capacitor 120 from the kinetic energy of the freestanding graphene membrane 265 as a function of the STM setpoint current in nano-amps, and for a harvesting time of 200 seconds. The slope and intercept are equal to the terms in the mathematical expression.

Figure 10:
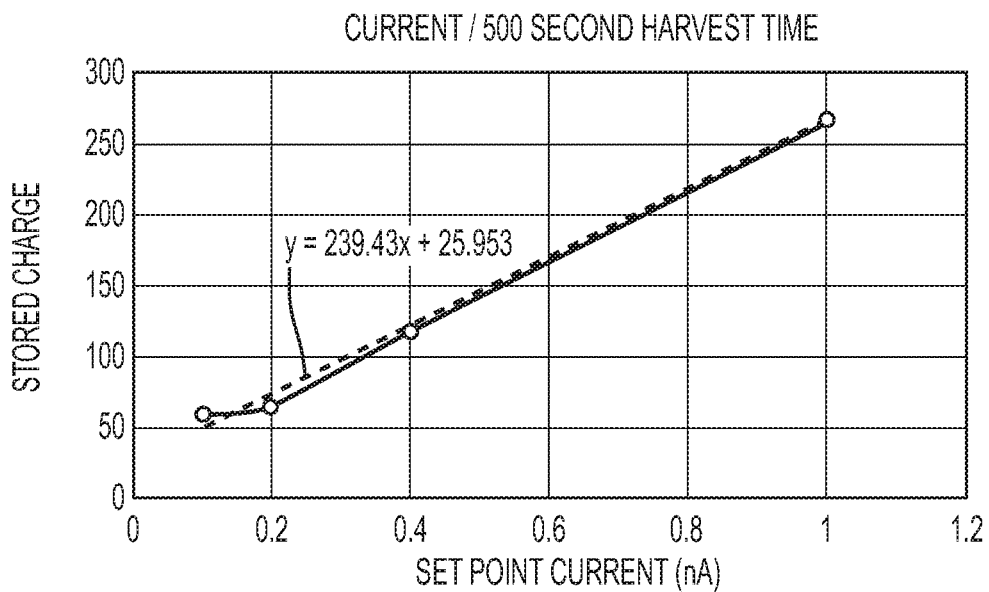
FIG. 10 is a plot of charge stored in nano-Coulombs in the storage capacitor after 500 second harvest time at numerous set point currents for the microscope as disclosed herein.

FIG. 10 illustrates charge stored in nano-coulombs on the variable capacitor 120 from the kinetic energy of the freestanding graphene membrane 265 as a function of the STM setpoint current in nano-amps, and for a harvesting time of 500 seconds. The slope and intercept are equal to the terms in the mathematical expression.

FIGS. 7-10 are established according to the following:

$$Q_{ch}^{max}(I_{stm}) = \frac{\varepsilon_o A f \langle d(t) \rangle}{d_o^2} V_{stm} T + k G_{stm} \langle d(t) \rangle T I_{stm}$$

Overall, FIGS. 4-10 of this disclosure are non-limiting examples of an energy harvesting arrangement for charge storage in a fixed storage capacitor 175. In other embodiments, when the circuit of FIG. 4 is used conjunction with an STM, the circuitry is also configured to measure the energy involved in a dynamic, atomic-scale event. The energy resolution can be at least one femto-joule. The test circuit explained above in regard to FIG. 3B illustrates one example of how a load component may be attached to the variable capacitor 120 of this disclosure and measure atomic scale charge transfer to model an event that changes the kinetic and thermodynamic response of a sample subject to ambient physical phenomena.

Figure 11:
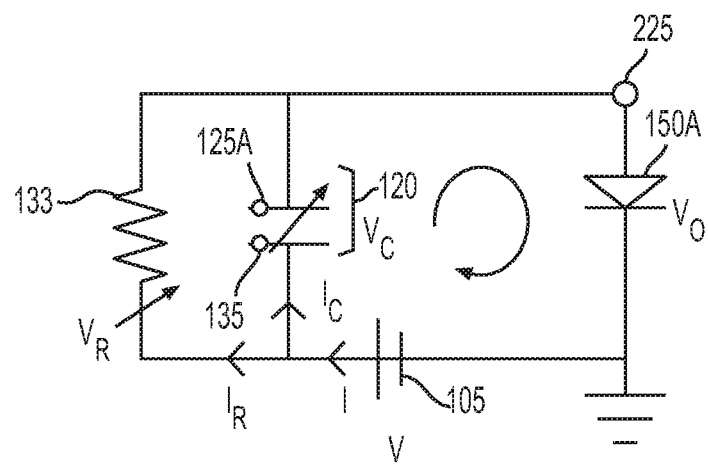
FIG. 11 is a schematic view illustrating sources of discharged current and tunneling current across a variable capacitor that inherently incorporates a variable resistance as disclosed herein.

FIG. 11 expands the concepts illustrated in the non-limiting circuit example of FIGS. 4-10 for broader use in multiple applications due to new methods of modeling the variable capacitor 120 of this disclosure. In the illustration of FIG. 4, the variable capacitor 120 section of the overall circuit apparatus 100 in FIG. 4 is actually inside an STM chamber. One side of the variable capacitor 120 is the STM tip 138A and the other side of the variable capacitor is the freestanding graphene membrane 265. The STM tip 138A is connected to the positive side of the power supply 105, which subjects the tip to a constant current that is maintained by a feedback loop controlled the power supply 105. As the freestanding graphene membrane 265 vibrates to establish ripples 271, the distance (FIG. 3A, ref. "d") between the graphene membrane 265 and a nearby metal electrode (the STM tip 138A) will naturally vary as respective ripples switch positions between peaks 286 and valleys 289. At the closest distance between the membrane 265 and the metal electrode 138A the capacitance will be the largest of about 1 femto-farad. At the largest distance between plates 135A, 135B of a variable capacitor 120 the capacitance will be the smallest at about 0.1 femto-farads. This change in capacitance is one source of power harvesting when a load component 175, 195, 199 is connected to the variable capacitor in a circuit configuration (i.e., with example diodes) allowing the variable capacitor to discharge in cycles across the load component.

As mentioned, the circuit of FIG. 4 is connected to the scanning tunneling microscope (STM). Freestanding graphene is the sample, because of its nature that causes the graphene to always be in motion [5], that heating it also causes mechanical buckling [6], and that each ripple will spontaneously invert its curvature [7]. In addition, it has been independently predicted that the thermal motion of nanostructured graphene can be harvested to provide 10 pico-watts of continuous power for a 1 nm by 17 nm ribbon [8].

For testing examples, in FIGS. 11 and 12, this disclosure shows results of using an STM in an Omicron® low-temperature, ultra-high vacuum system that was custom modified [9]. In particular, the electrical connection 225 to the freestanding graphene membrane 265 sample is isolated from the system and can be connected to an energy harvest electronic circuit 100 outside the vacuum of the STM chamber 219. This is also illustrated above in FIG. 3B showing hardware examples. As discussed above, minimum and maximum capacitances of the variable capacitor 120 may be computed for an STM setup with the STM tip 138A and a graphene membrane 265 forming the plates 135A, 135B of the variable capacitor 120. Note that a setpoint current of the STM is established via a feedback controlled voltage power supply 105 to the STM tip 138A to charge up the variable capacitor 120 to a first capacitance level (C). As shown below, the change in distance (FIG. 3A, distance "d") between the graphene membrane 265 and the tip 138A causes corresponding changes to the capacitance of the variable capacitor 120. When the tip and the membrane are closest, the capacitance between the two is at Cmax, and when the tip and the membrane are farthest apart, the variable capacitor 120 exhibits its minimum capacitance. The base capacitance C can be experimentally determined for use in particular applications, as "C" is dependent upon the selected setpoint current for the STM as well as the STM tip 138A range of motion for positioning in a fixed location relative to the membrane 265. The information below explains the relationships of the components of FIG. 11 resulting in particular characteristics on the variable capacitor 120.

During the capacitance increasing phase of the variable capacitor 120, when the membrane 265 and the tip 138A of the STM are sufficiently close as during a membrane trough period 289, the graphene membrane 265 loads up with charge Q up to Qmax. This event was described earlier in regard to FIG. 4A in which charge was forced across diode 150A, also shown by the arrow in FIG. 11 as clockwise current across diode 150A. The capacitance decreasing phase of FIG. 4A occurs during a peak 286 formation in the membrane 265 separating the variable capacitor plates 135A, 135B, and the graphene membrane 265 loses charge Qmax down to Qmin back to the STM. In the example of FIG. 4A, with the diode 150A, the set point current of the STM, and a feedback controlled voltage source 105 maintaining the setpoint current, the amount of charge available in the circuit stabilizes to a constant value Qmax, and the charge on the circuit of FIG. 4A is transported by the ripple effect of the membrane instead of relying only on electrical dynamics in the voltage source as the sole source of power in the circuit. After all, in the circuit of FIG. 4A, the voltage source is consistently replenished and recharged in the same cycle of peaks 286 and troughs 289 across the membrane. The membrane is doing the work in the circuit of FIG. 4A.

FIG. 11 explains in more detail the electrical phenomena at work in the circuit of FIG. 4A. In the circuit of FIG. 11, the variable capacitor 120 cycles between high and low capacitance with the ripple effect on the membrane 265. During trough periods when the membrane and the STM tip are in close proximity, the variable capacitor is configured to store charge up to Qmax. When the variable capacitor 120 diminishes in capacitance during peak periods of membrane ripples, positive to negative directed current is forced out of the STM tip 138A back into the battery 105, and as also shown in FIG. 4A, the diode 150A allows the current to flow in only one direction. FIG. 11 illustrates that when using the energy harvesting circuit with an STM, a new energy harvesting mechanism has been found. When the freestanding graphene membrane 265 is moving, forming the peaks 286 and troughs 289, the first charge harvesting mechanism comes from the capacitance of the tip-sample junction 138A, 265 changing in time, as already discussed above. A second charge harvesting mechanism comes from the electrons quantum-mechanically tunneling between the tip 138A and sample, such as but not limited to the graphene membrane 120. The magnitude of the tunneling current fluctuates when the tip-sample separation fluctuates. This second mechanism comes from tunneling theory [10]. However, similar to the variable capacitance, when the thermal force pulls the sample 265 away from the tip 138A, it is the thermal force doing the work of moving the charge. This is the energy collection phase of the motion. Utilizing existing thermal energy and vibration induced peaks and troughs of the membrane provides an avenue of adding energy to the circuits described in this disclosure and thereby moving charge without relying only on power stored in a battery or provided by another outside voltage source.

Having the distance between the plates of the variable capacitor close enough to have a high probability of the electrons tunneling enhances the energy harvesting signal. In other words, an initial placement of the tip 138A within a known range of motion in the z-axis of the tip relative to the x-y axis across the sample 265 can be adjusted to ensure charge tunneling under given conditions.

A variable capacitor 120 which also leaks current through a planned route across circuit components may be modeled as the equivalent circuit of FIG. 11, in which a variable resistor 133 and variable capacitor 120 are connected together in parallel, as shown. For the example of FIG. 11, both the capacitor and the resistor are variable, and the voltage across each is the same.

This disclosure shows that the total current I available for harvesting charge by the work of the ripple effect on the membrane 265 comes from both the variable capacitor 120 (Ic) and from the variable resistor 133 (the tunneling—$I_R$). Fundamentally, this is due to the model of the variable capacitor and the variable resistor being connected together in parallel. In various limits, the variable capacitor electrostatics or the tunneling current dominate the energy harvesting. At very close distances, the tunneling will dominate. This is the case for a typical, but non-limiting, STM setup. Utilizing existing thermal energy and vibration induced peaks 286 and troughs 289 of the membrane provides an avenue of moving charge to the fixed storage capacitor without expending the battery 105 as the only power source in the system.

Figure 12A:
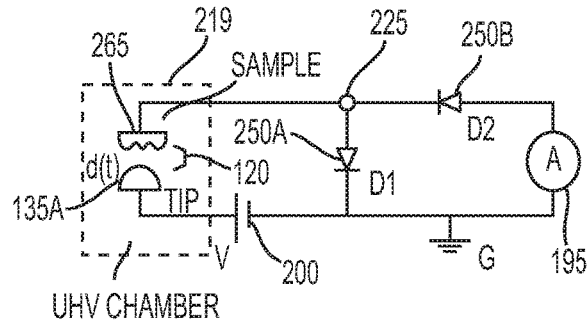
FIG. 12A is a schematic view of a sensor circuit utilizing an ammeter to measure either or both emitted current and tunneling current across a variable capacitance region as described herein.

FIG. 12A illustrates the embodiment of FIG. 11 but with an ammeter 195 as a load device that is also connected in series with a second diode 250B directing current back to a second plate 135B (e.g., the sample or membrane 265) of the variable capacitor. In the embodiment of FIG. 12A, the variable capacitor 120 is formed again by using the STM tip 138A as the first capacitor plate 135A and the graphene membrane 265 as the second capacitor plate 135B within a vacuum STM chamber 219. The electrical connection 225 to the membrane may be outside of the chamber 219 for access in connecting the diodes 250A, 250B. The ammeter 195 can measure current in real time, which in turn can be used to show charge accumulation on the variable capacitor 120, charge storage capacity on the variable capacitor, and energy present on the variable capacitor 120. These measurements may be taken during an atomic level event under consideration on a sample, which may be the membrane 265 discussed above. It is notable that FIG. 12A represents the first figure in this disclosure by which a load device such as the ammeter 195 is connected directly in parallel with the variable capacitor 120 and the charge-up diode 250A without a switch separating a load charging circuit (FIGS. 4A, 4B) and discharging circuit (FIG. 4C). The positive current directions of FIG. 12A will match that of FIG. 4A during trough periods of the sample, or membrane 265, i.e., charging the variable capacitor, and then match FIG. 4B during peak periods of the membrane discharging the variable capacitor. The charging and discharging of the variable capacitor 120 (a first mechanism for harvesting charge), along with the variable resistor effect discussed in regard to FIG. 11 (the second mechanism for harvesting charge), work in tandem to provide charge to a load component, which in FIG. 12A is an ammeter 195. The circuit configuration of FIG. 12A, therefore, provides current path in a first direction across the battery 200 during maximum capacitive periods (i.e., membrane troughs bringing the membrane closer to the tip) and then a second current path across the ammeter 195 during minimum capacitance periods (i.e., membrane peaks moving the membrane away from the tip). In this way, the vibration of the membrane leading to the above described ripple effect allows for the variable capacitor 120 to move the charge onto and off of the plates 135A, 135B of the variable capacitor 120 to switch current direction. The result is that the variable capacitor operating as a first mechanism for energy harvesting provides an alternating current source.

Figure 12B:
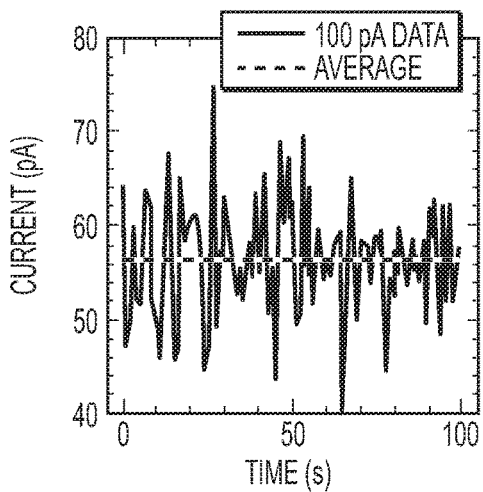
FIG. 12B is a plot of discharged current over time from a variable capacitor across an ammeter when using freestanding graphene as disclosed herein.
Figure 12C:
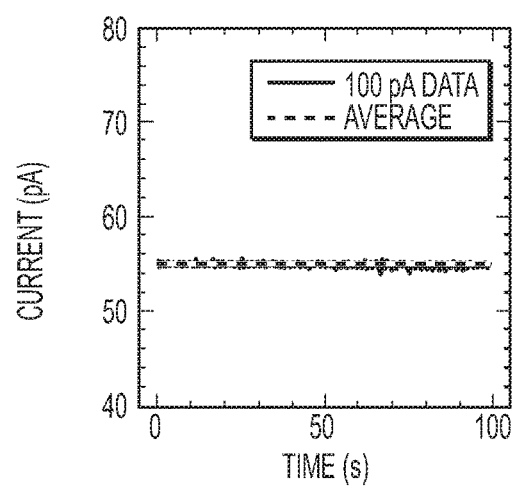
FIG. 12C is a plot of tunneling current over time from a variable capacitor across an ammeter when using rigid graphene as disclosed herein.
Figure 12D:
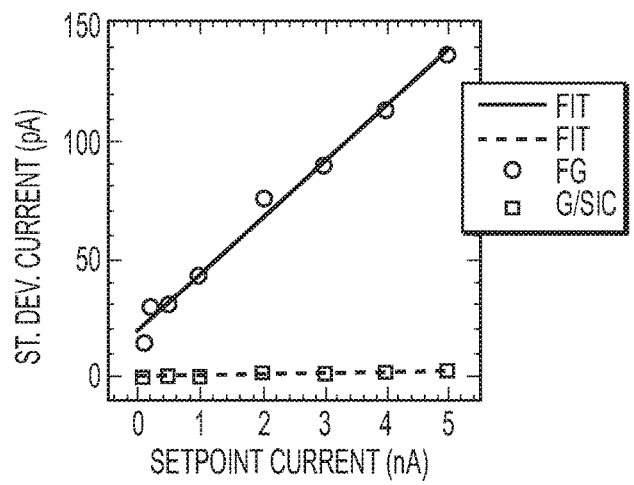
FIG. 12D is a plot of standard deviation values for discharged current for both freestanding graphene and rigid graphene as a function of setpoint tunneling current for a scanning tunneling microscope as disclosed herein.

The current response of the first mechanism for energy harvesting—charge from the variable capacitor 120—is illustrated in FIG. 12B for current across the ammeter 195 in a 100 second collection time. The current shown in FIG. 12B illustrates current stored and emitted across the variable capacitor 120 during the time period for a sample of freestanding graphene membrane 265. FIG. 12C illustrates the second mechanism available for energy harvesting by additional current in the system provided by charge tunneling across the variable capacitor 120, and as noted above this second mechanism may be modeled as tunneling current between the tip of an STM (or any other metal electrode discussed herein) and the membrane 265. The charge tunneling across the variable capacitor 120 is proportional, but not identical to, the setpoint current that the STM of one non-limiting example is designed to track in a steady state operation of the tip of the microscope. FIGS. 12C and 12D show the difference when a freestanding graphene membrane 265 serves as the sample and second capacitor plate 135B. In other words, the embodiments of this disclosure illustrate that for different applications and conditions under consideration, one can use the STM tip 138A as the first capacitor plate 135A and use a membrane inherently subject to thermal forces and vibration induced kinetic energy as a second capacitor plate 135B. The ambient forces on the system, including but not limited to, thermal energy and vibration induced by the surrounding structures (such as standoff posts 210 in layered configurations, membrane substrate 258), can provide the energy needed to move charges into or out of the system. The overall harvested charge accumulation includes charges from the variable capacitor 120 and additional charges available for harvesting by carriers tunneling across the variable capacitor plates 135A, 135B, as modeled with the variable resistor 133 of FIG. 11. In some embodiments, the tunneling charges dominate the overall average charge available for harvesting, and the tunneling charges are generally proportional to the setpoint current of the STM voltage source, as illustrated in FIG. 12D.

The range of the energy harvesting can be modulated by selecting appropriate STM set points, STM tip position, range of motion of the STM tip relative to an opposite capacitor plate, and the membrane 265. As shown in FIG. 2, the membrane may be chosen and/or engineered for a desired ripple formation (e.g., distances between peaks and troughs) by selecting a particular grid substrate 258 for the membrane 260, aperture or cell size for the grid, and any compressive forces on the membrane. These factors are available to set up a system that provides harvesting current across a system that fluctuates about a tunneling current value with peak and trough formation in the membrane. FIG. 12C illustrates one example of the tunneling current across the capacitor for the same 100 second harvesting period of FIG. 12B. As illustrated by FIG. 12D, a setpoint current from the STM is a steady value that the STM strives to maintain and the standard deviation is close to zero for the setpoint current. The same zero deviation is shown for the tunneling current mechanism that is the above described second component of any harvesting operation. It is also notable that the emitted charge current from the variable capacitor 120 as shown in FIG. 12B is largely centered about the tunneling current values shown in FIG. 12C. Again, this tunneling current value of FIG. 12C is directly related to the setpoint current of the STM. Finally, the plot shown in FIG. 12D illustrates that as the setpoint current of the STM increases, the standard deviation of the current values available for harvesting from the emitted charge from the variable capacitor 120 is much greater. These characteristics are available as data points for designing harvesting systems or energy sensing systems with the circuits described herein. Test results indicate that for the circuit of FIG. 12A, when the tip 138A is 2 nm or closer to the sample (i.e., the membrane 265), the tunneling electron current (modeled as variable resistor 133 in FIG. 11) dominates. When the tip is 2 nm or farther from the sample, the variable capacitance term dominates.

The arrangement of components set forth in FIGS. 12A-12D further illustrate options in polarizing the charging circuit of FIG. 4A with either internally polarized components or externally polarized components. In FIG. 12A, the voltage source 200 is connected as an external polarization device inserting not only charge into the circuit but also playing a role the direction of current across diodes 250A, 250B as well as the overall energy available to carriers inserted onto the variable capacitor 120. In other embodiments, a product according to this disclosure may be configured to be operational after the voltage source 200 is removed from the circuit and the remaining components are connected to a metal electrode serving as the first capacitor plate 138A. In this scenario, a voltage source provides charge to the circuit that remains therein after the voltage source is removed, making the circuit pre-polarized with charge for use with samples in the absence of a direct voltage source connected during use.

Figure 12E:
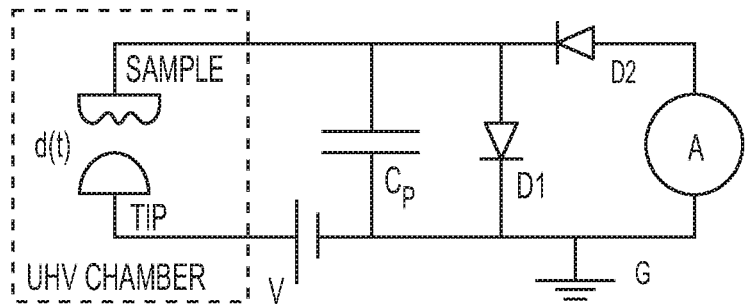
FIG. 12E is a schematic view of a sensor circuit with inherent parasitic capacitance utilizing an ammeter to measure current across a variable capacitance region as described herein.
Figure 12F:
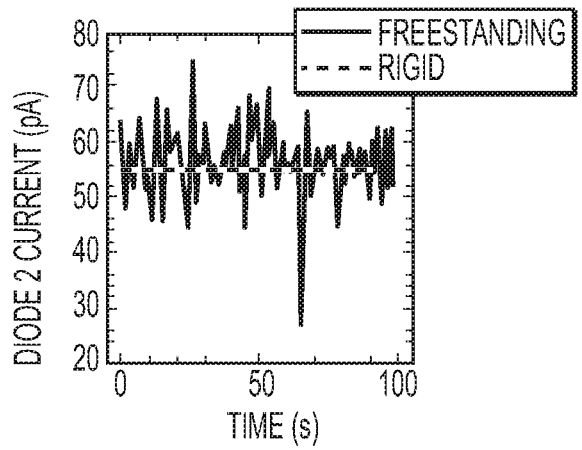
FIG. 12F is a plot of harvested current over time from a variable capacitor across an ammeter for both freestanding graphene and rigid graphene as disclosed herein.
Figure 12G:
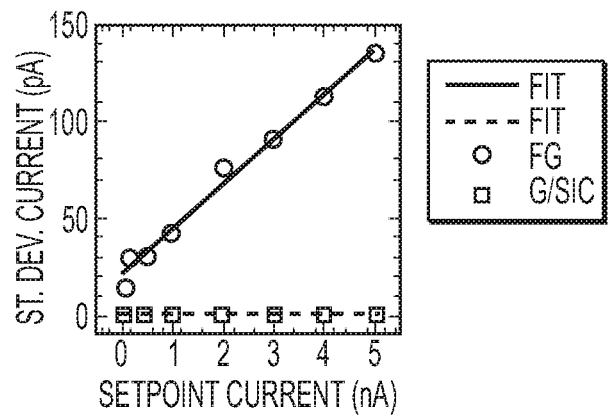
FIG. 12G is a plot of standard deviation values for discharged current for free standing graphene membrane and a rigid sample of graphene on silicon carbide as a function of setpoint current for a scanning tunneling microscope as disclosed herein.

FIGS. 12E, 12F, and 12G illustrate more details of the physical phenomena at work when the tunneling current dominates a circuit as described herein. These plots show the current flowing through diode 250B, when the system is dominated by tunneling. The important discovery is that the current fluctuates in a considerable measure when the sample is freestanding graphene. When the sample is rigid, those fluctuation go away.

A measure of the fluctuations is given by the standard deviation (st. dev.) The lower plot shows how the standard deviation is much larger for the freestanding vs. rigid graphene and that this is changes linearly with the setpoint current as shown by the theory above. By extrapolation, this line to zero tunneling current, the fluctuations still persist and give a value of about 10 pA. This 10 pA of current could be used as a power source. The tunneling current dominates the circuit pursuant to the formula below:

$$I_{\Delta T}(t) = I_{stm} e^{-k\Delta d(t)}$$

Figure 12H:
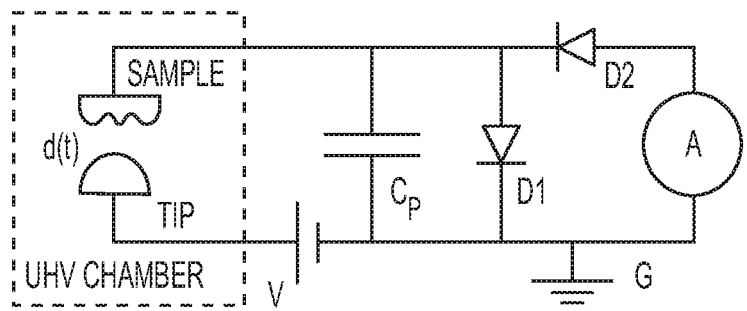
FIG. 12H is a schematic view of a sensor circuit utilizing an ammeter to measure either or both emitted current and tunneling current across a variable capacitance region as described herein.
Figure 12I:
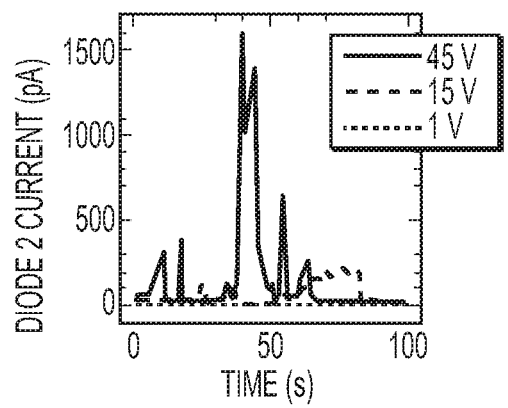
FIG. 12I is a plot of harvested current with no tunneling current over time from a variable capacitor across an ammeter for three different bias voltages as disclosed herein.
Figure 12J:
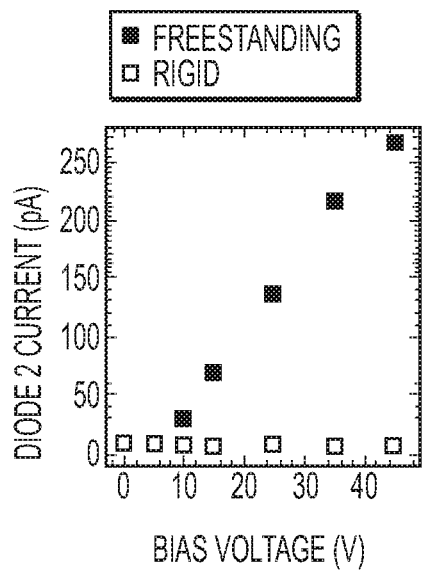
FIG. 12J is a plot of harvested current with no tunneling current as a function of setpoint bias voltage for a scanning tunneling microscope as disclosed herein.

FIGS. 12H, 12I, 12J illustrate more details of the physical phenomena at work when the variable capacitor is the dominant source of energy in the circuit. These plots show the current flowing through diode 250B, when the system is dominated by variable capacitor 120. No electrons are flowing from tip 138A to sample 265, but the electrostatic induction force is making the current. The important discovery is that current flows through diode 250B simply because the freestanding graphene membrane 265 is constantly moving and has a voltage source charging it. The lower plot shows the current vs. voltage. And it matches the theory above. All of this current can be used as a power source. The variable capacitor dominates the circuit pursuant to the formula below:

$$I_{\Delta C}(t) = \frac{\varepsilon_o A f \Delta d(t)}{d_o^2} V_{stm}$$

Figure 13:
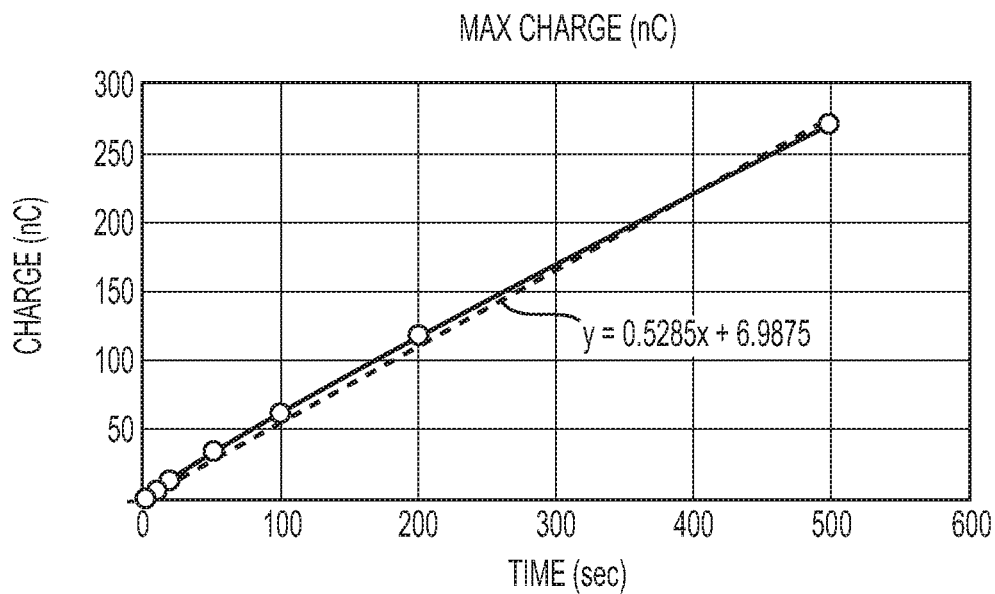
FIG. 13 is a plot of maximum charge stored in nano-Coulombs in a storage capacitor as disclosed herein during various harvest times.
Figure 14:
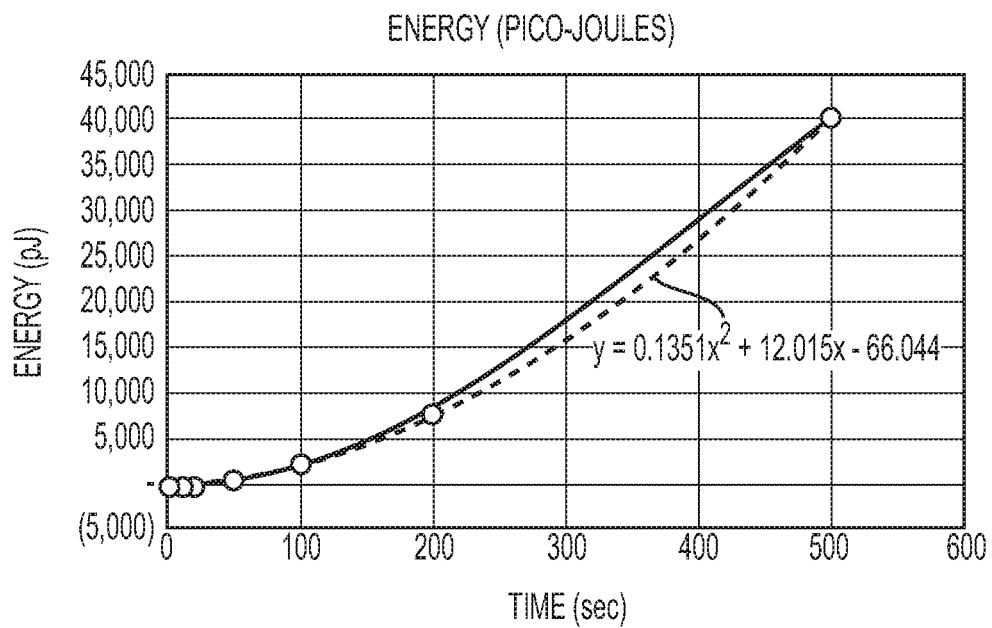
FIG. 14 is a plot of maximum energy in pico-Joules stored in a fixed capacitor as herein during various harvesting times.
Figure 15:
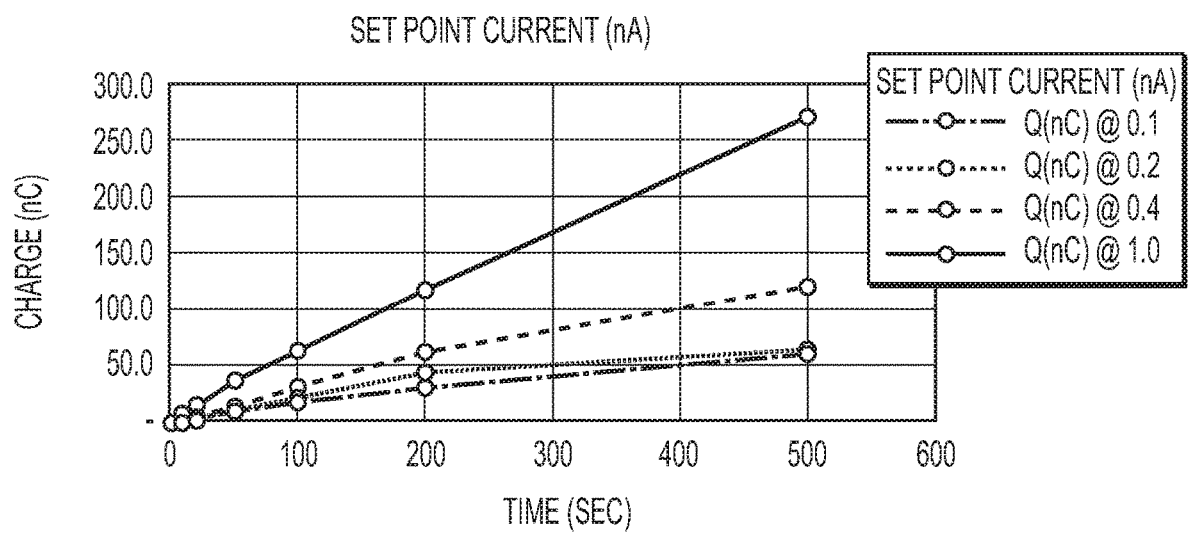
FIG. 15 is a plot of maximum charge stored in nano-Coulombs in a fixed storage capacitor as disclosed herein during various harvesting times across different tunneling set point currents.
Figure 16:
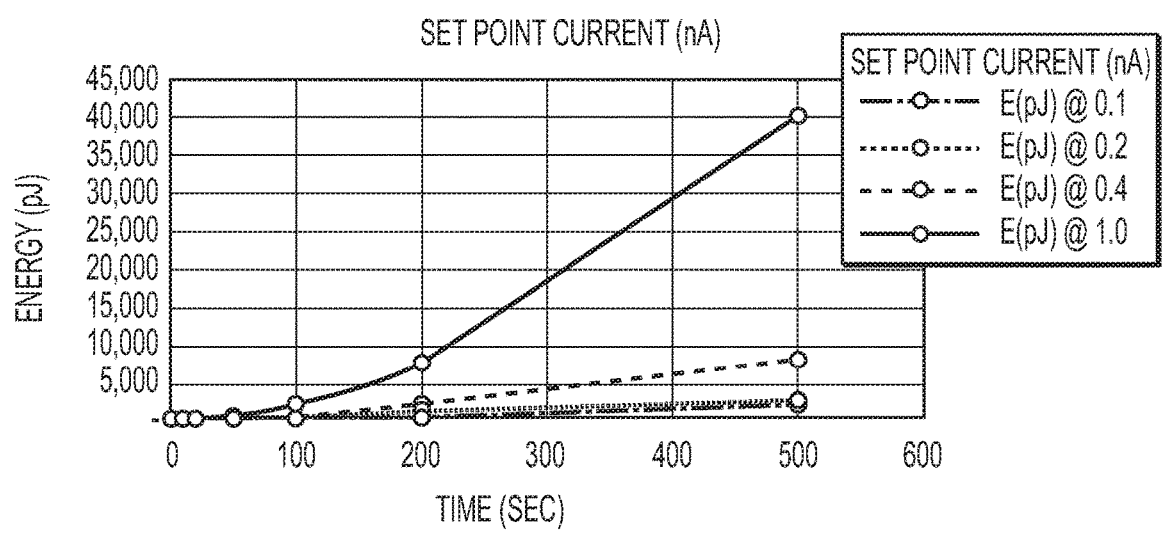
FIG. 16 is a plot of energy stored in a fixed storage capacitor as disclosed herein during various harvesting times across different set point currents.

FIGS. 13-16 show data gathered from the system of FIGS. 4, 11, and 12A, recognizing that energy and stored charge come from two mechanisms described above—the variable capacitor discharge and tunneling current across the variable capacitor. FIG. 13 illustrates corresponding energy in pico-joules accumulated on the storage capacitor from the freestanding graphene as a function the energy harvesting time in seconds. FIG. 14 measures charge in nano-coulombs accumulated on the storage capacitor from the freestanding graphene as a function the energy harvesting time in seconds. The different STM current setpoints 0.1, 0.2, 0.4 and 1.0 nano-amps are shown. FIG. 15 shows measured charge in nano-coulombs accumulated on the storage capacitor from the freestanding graphene as a function the energy harvesting time in seconds. Again, the different STM setpoints 0.1, 0.2, 0.4 and 1.0 nano-amps are shown. FIG. 16 illustrates measured energy in pico-joules accumulated on the storage capacitor from the freestanding graphene as a function the energy harvesting time in seconds. The different tunneling current setpoints 0.1, 0.2, 0.4 and 1.0 nano-amps.

Figure 17A:
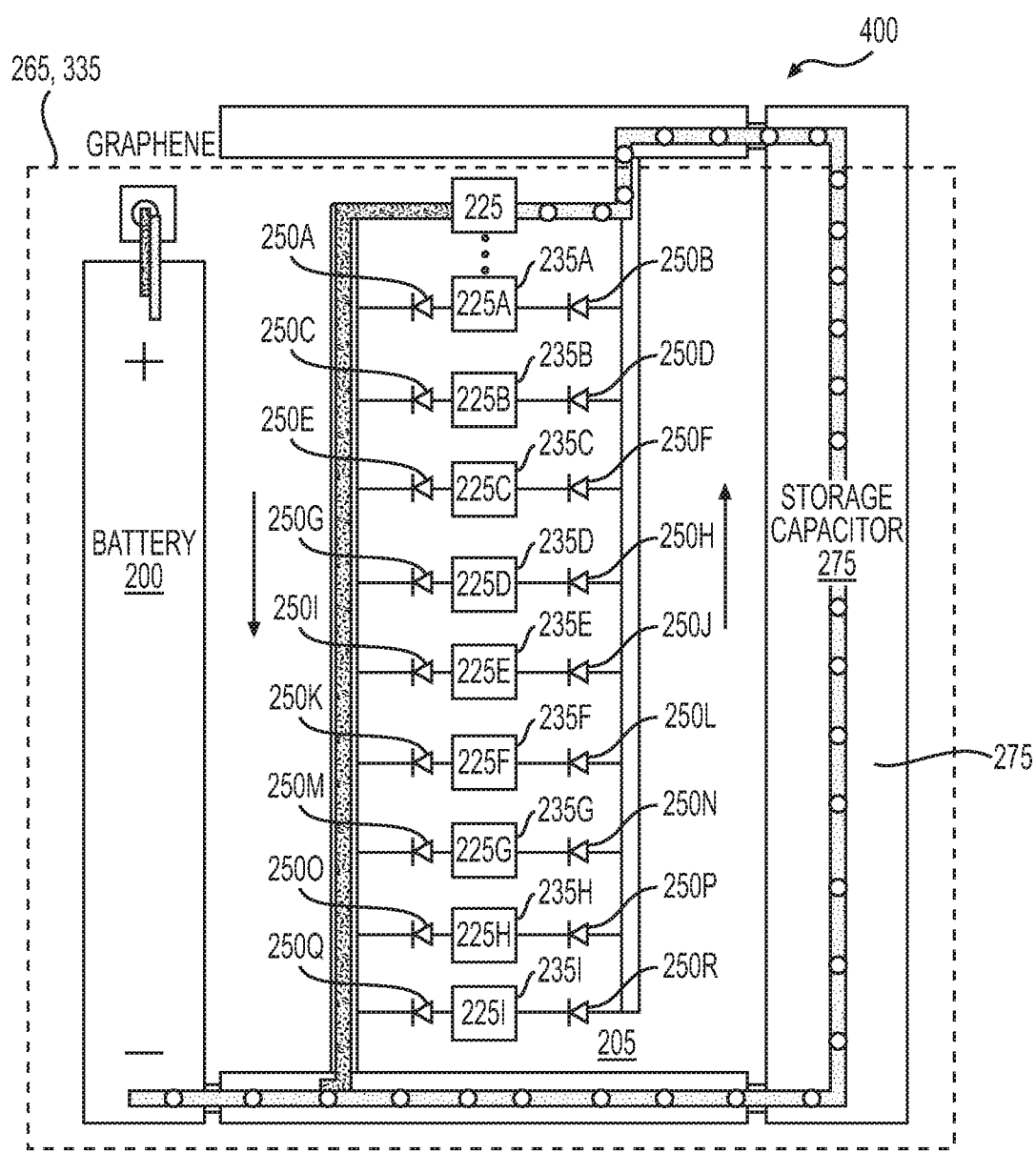
FIG. 17A is a schematic view of an array of variable capacitors in an energy harvesting circuit according to the disclosure herein.
Figure 17B:
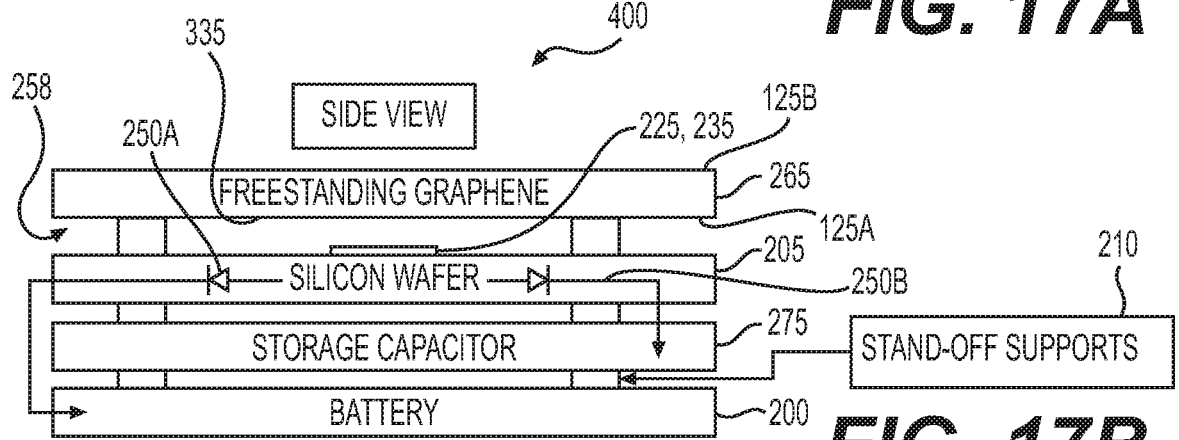
FIG. 17B is a cross section view of a layered array of variable capacitors in an energy harvesting circuit according to the disclosure herein.
Figure 18A:
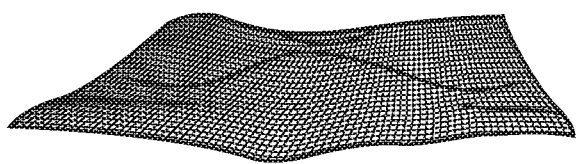
FIG. 18A is a schematic illustration of naturally occurring ripples in freestanding graphene.
Figure 18B:
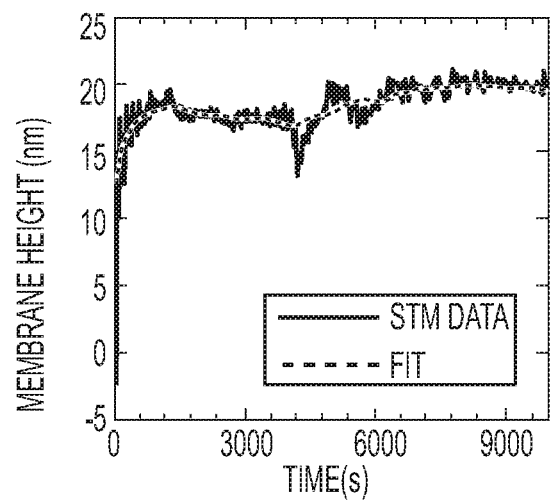
FIG. 18B is a graphical illustration of raw STM height-time data series acquired over 10,000 s shown with a trend line obtained from a low-pass Wiener filter algorithm to isolate large-scale fluctuations.
Figure 18C:
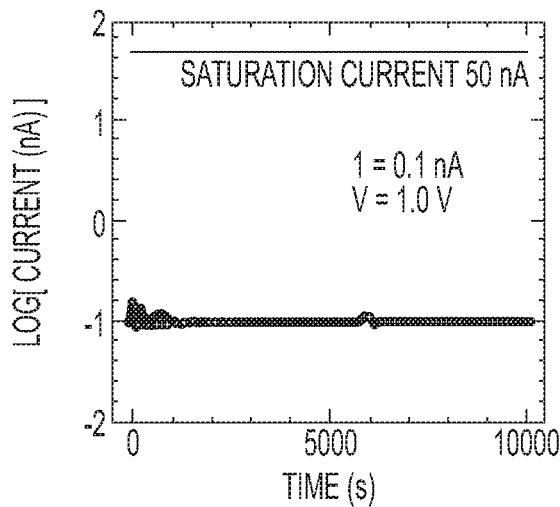
FIG. 18C is a graphical illustration of measured tunneling current associated with the data shown in (b).
Figure 18D:
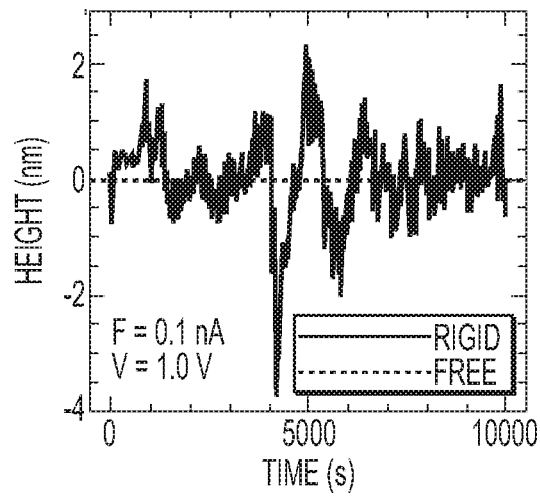
FIG. 18D is a graphical illustration of background subtracted height-time data showing only the fluctuations in the membrane height. The data shown at zero height is the control data acquired from a rigid graphene sample.
Figure 18E:
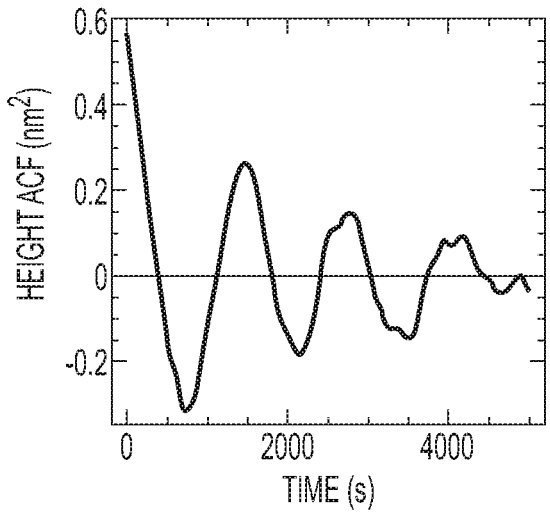
FIG. 18E is a graphical illustration of height autocorrelation function (ACF) calculated from the background subtracted data shown in FIG. 18D.
Figure 18F:
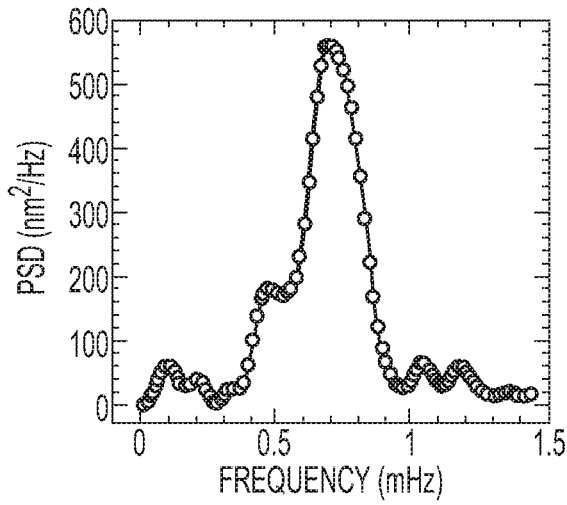
FIG. 18F is a graphical illustration of power spectral density (PSD) calculated from the STM data shown in FIG. 18B.
Figure 19A:
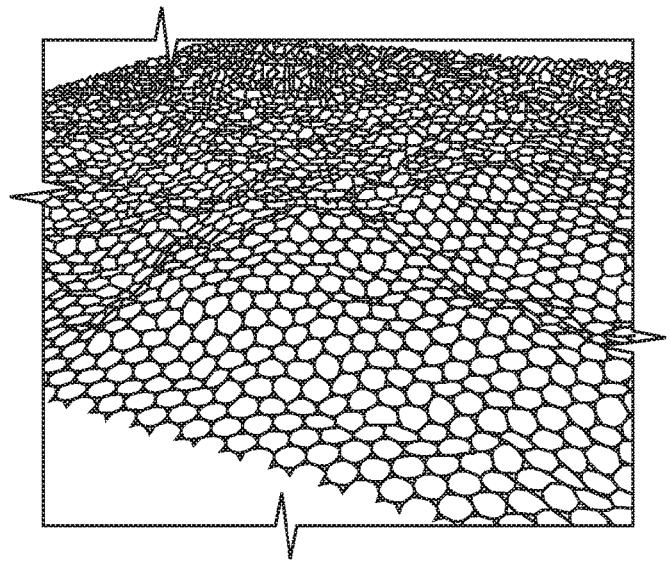
FIG. 19A is a schematic illustration of molecular dynamics in a convex ripple geometry.
Figure 19B:
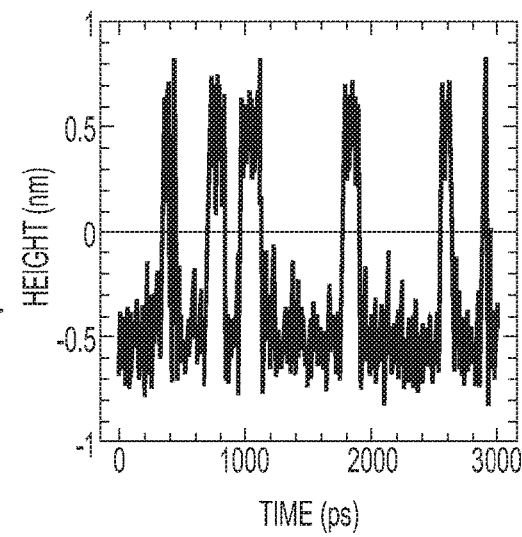
FIG. 19B is a graphical illustration of simulation output height-time series.
Figure 19C:
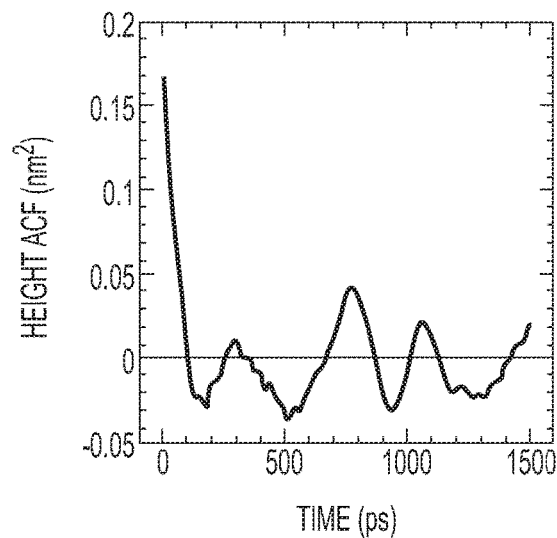
FIG. 19C is a graphical illustration of a height autocorrelation function.
Figure 19D:
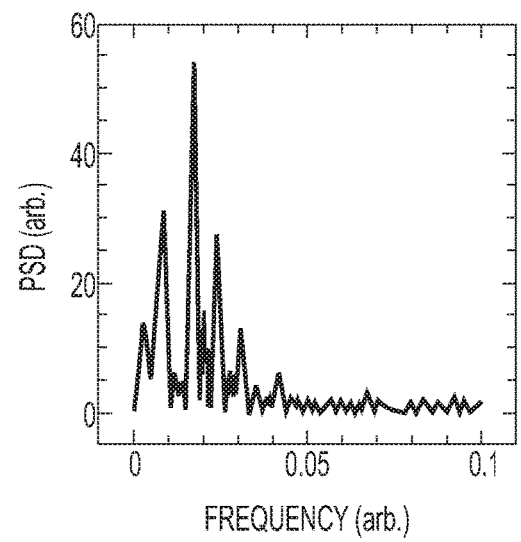
FIG. 19D is a graphical illustration of power spectral density of a height-time series.
Figure 20A:
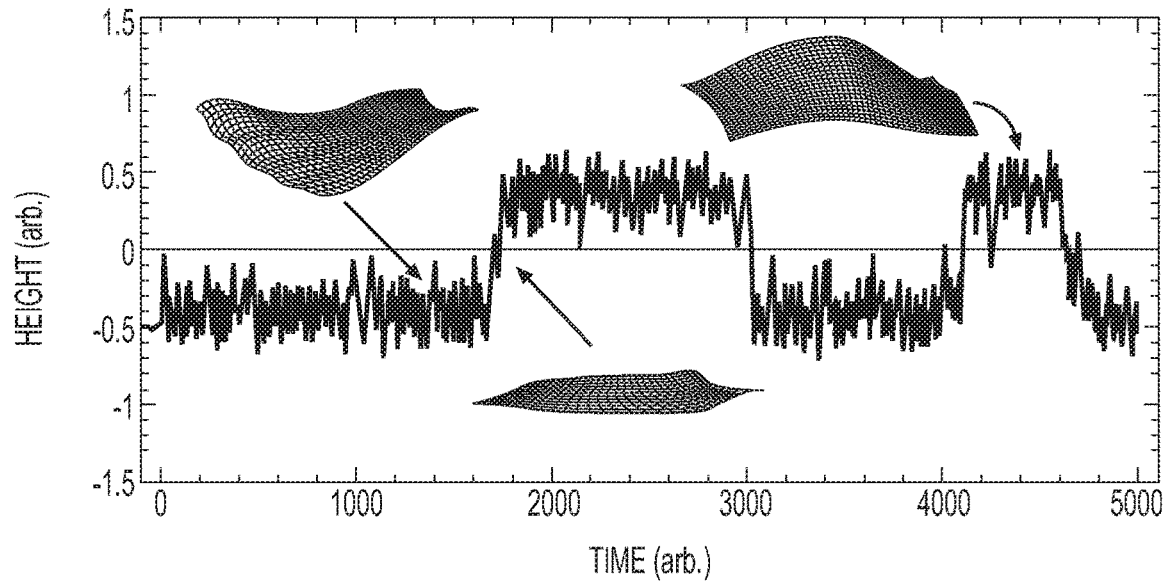
FIG. 20A is a graphical illustration of respective simulation output height-time data of the spin-membrane model and configurations at three different times.
Figure 20B:
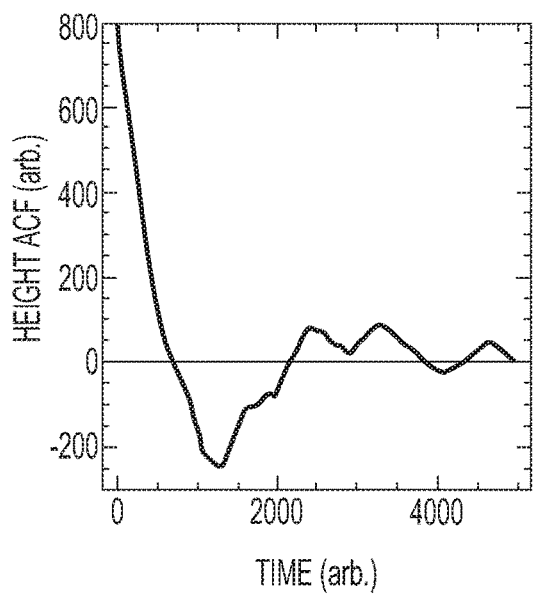
FIG. 20B is a graphical illustration of height autocorrelation function ACF.
Figure 20C:
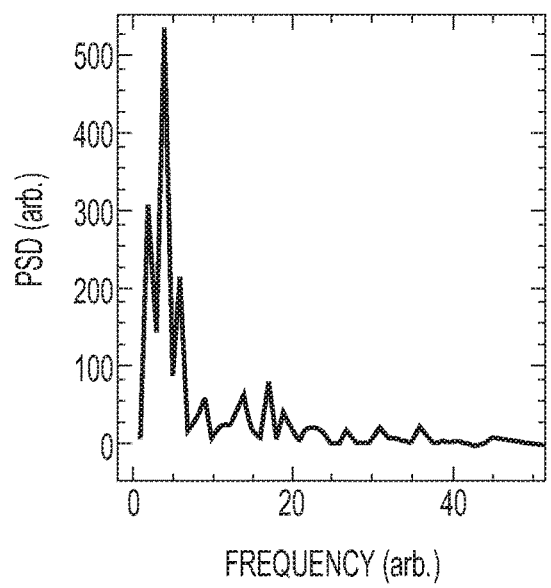
FIG. 20C is a graphical illustration of power spectral density.

FIGS. 17A and 17B are schematic illustrations of a silicon-based integrated circuit 400 with potentially millions of the energy harvesting elements (225). This design only has one power supply 200 and one storage capacitor 275. A first path (denoted with dashes "- - - -") is when the current is adding charge to the graphene membrane, while the second path (denoted with dots "• • • •") is when the current is adding charge to the fixed storage capacitor 275. The silicon has an array of diode pairs 250 with a metal contact 225 in between each pair of diodes. The metal contacts 225 serve as the above-mentioned energy harvesting elements of the system. Above the metal contact 225 is the freestanding graphene 265 and it is in constant motion, forming peaks 286 and troughs 289 as described above. Each small electrode 225 will be used to transport charge into the storage capacitor 275 as the graphene membrane oscillates. This is one method for harvesting energy at the nanoscale with millions of graphene ripples each contributing electrical charge to the capacitor.

For illustration purposes and without limiting this disclosure to any one configuration, the embodiment of FIGS. 17A and 17B are notable in that the contacts 225A-225I (or up to 225n with n being any number of contacts) serve as the traffic direction point for a variable capacitor 120 to be charged and discharged in accordance with the earlier described embodiments. The graphene membrane 265 covering the essential components can be used as a first capacitor plate 335 and the metal contact 225 may be used as the second capacitor plate 235 to form a variable capacitor 120. The membrane may cover the entire circuit as shown or at least the metal contacts 225 to form the variable capacitor. This variable capacitor 120 operates the same as the embodiments above in regard to the rippling of the membrane 265 occurring due to ambient thermal and vibrational kinetic energy causing the membrane 265, and thus one of the capacitor plates to be displaced and then return (emitting and storing charge in cycles). The cycles cause a corresponding change in the charge on the metal contact 225 such that when the capacitive region between the metal plate 225 and the membrane 265 increases in distance between the plates, the charge collected on the metal contact is displaced toward the storage capacitor for harvesting. When the capacitive region between the plates 235, 335 of the variable capacitor 120 is at its smallest (i.e., the plates are closest together during a ripple trough), the capacitive charge is at Cmax with charge collected on the metal contact 235. In the example shown for the integrated circuit 400, during peak ripple times in a window region of the graphene membrane 265, positive charge carriers collected onto the metal contact are directed into the storage capacitor for current flow in the direction of the upward arrow (i.e., charging the fixed storage capacitor 275). During trough ripple times in a window region of the graphene membrane 265, positive charge carriers are further collected onto the metal contact with the negative carriers directed onto the graphene membrane 265 for current flow in the direction of the downward arrow (i.e., charging the voltage source 200).

FIG. 17B shows a side view of a cross section of the integrated circuit shown in FIG. 17A. A layered integrated circuit 400 includes the above described voltage source or battery 200, a fixed storage capacitor 275, and a harvesting circuit formed in a substrate such as but not limited to a silicon wafer 205. The freestanding membrane 265 is formed over the structure, and in this non-limiting example, the membrane is made of graphene. The diodes 250 are formed in the silicon wafer substrate 205. Stand-off supports 210 ensure proper separation and are sources of thermal as well as kinetic ambient energy. The freestanding graphene membrane 265 has the same above-described first surface 125A and second surface 125B with the first surface serving as a capacitor plate 335. The silicon wafer includes a metal contact 225 that is another capacitor plate 235 as discussed above. In certain embodiments that do not limit this disclosure, the freestanding graphene membrane 265 may be incorporated into a grid 258 that defines window regions for pairing with the metal contacts in forming the variable capacitor disclosed herein.

Numerous computerized components may be incorporated into all embodiments of this disclosure, and in particular an STM will include processors, memory, and computerized instructions to carry out scanning functions as described and shown in FIG. 1B as computer 180. Other computers may be used in conjunction with the STM, and this disclosure incorporates all necessary processors, hardware, memory devices, programmable interfaces and the like to fulfill the goals of the embodiments set forth in this document.

Example

Einstein's kinetic theory of Brownian motion made it possible to quantify the vast, renewable resource of earth's thermal energy [E1]. This energy is found in the random, jittery motion of every liquid and gas atom and molecule. These atomic-scale, noisy vibrations have been observed using scanning tunneling microscopy (STM) [E2, E3]. They have been used to induce regular motion in a mechanical oscillator when coupled via stochastic resonance [E2]. Furthermore, a Carnot cycle with a single Brownian particle has also been achieved and shown to follow the framework of stochastic thermodynamics [E4, E5]. Yet, harvesting energy from this motion has been elusive [E6, E7]. To harvest thermal energy, the thermoelectric effect has historically been used. Here, the amount of energy harvested is proportional to the temperature difference between the ends of a conductive material. An innovative extension of this idea was recently made by Cottrill et al. [E8]. Using graphene, metal foam, and octadecane, a large area of high thermal-conductivity material was combined with a phase-change material. This slowed the transfer of heat and created a perpetual thermal gradient tied to the diurnal cycle.

Feynman, in his 1964 lecture series, dismissed the possibility of obtaining useful work from Brownian motion. Nearly thirty years later, Magnasco confirmed that while Feynman was correct, his machine was immersed in an ideal thermal bath, in which time correlations are negligible. Magnasco then showed that if the thermal bath has long-time correlations, it can do work [E7]. Since then, the thermodynamics of systems with long-time correlations has become an active area of research. For example, it has been theoretically shown that such systems produce excess heat without violating the second law of thermodynamics [E9]. In this manuscript, the first three figures demonstrate that 2D rippled membranes have motion with long-time correlations and that this is due to a many-body effect. The last figure shows that this new type of thermal motion is large enough to do useful work.

New research has found that freestanding, two-dimensional (2D) materials offer great promise in accessing organized sources of vibrational energy. These crystalline membranes have strongly-bonded interconnected lattice structures, which naturally generate the coherent motion of thousands of atoms [E11]. For example, unstretched freestanding graphene (one such 2D material) exhibits a rippled morphology, with adjacent regions alternating between concave and convex curvature [E11]. The nanometer-sized ripples are the result of coupling between the subtle stretch of graphene's strong carbon bonds as it bends [E12] and electron-phonon coupling [E13]. Furthermore, these atomic membranes are constantly shifting between a large number of equivalent, low-energy, rippled morphological configurations [E14], visually similar to the movement of the ocean's surface. A key dynamic process occurs when the local curvature of the ripples spontaneously inverts from concave to convex: the ensuing lattice strain communicates the new orientation of the ripple to others nearby, forming a stochastic feedback network [E15, 16]. Understanding these complex, dynamic properties is critical to harvesting thermal energy from freestanding graphene and other 2D materials.

In this study, researchers confirm that rippled freestanding graphene membranes exhibit coherent motion, and demonstrate harvesting its collective kinetic energy (see Supplemental Material for materials and methods) [E17]. A simplified crystalline model of freestanding graphene featuring multiple concave and convex ripples is shown in FIG. 18(*a*). A biased STM tip, mounted at the end of a piezoelectric tube scanner, approaches the membrane from below (STM not shown). A typical time series for the STM-measured height taken from the center of the graphene is shown in FIG. 18(*b*). Note the enormity of the observed movement when compared to typical atomic corrugations of 0.01 nm and to a measurement of rigid graphene shown at the zero-height position in FIG. 18(*b*). The wait-time probability distribution for this data set was calculated. It follows a simple exponential ($r^2 > 0.995$), identifying it as a Poisson process. The simultaneously measured tunneling current, shown in FIG. 18(*c*), remained well above zero and well below amplifier saturation, even when the membrane height changed significantly. Thus, successful tracking of its movement was demonstrated. The contribution of tunneling current fluctuations to variations in the tip-sample distance was found to be negligible compared to the contribution of membrane height fluctuations. In addition, the absolute value of the cross-correlation coefficient between the measured height and tunneling current was determined to be less than 0.01.

One aim of this work is to show that large-scale fluctuations occur in freestanding graphene when compared to rigid graphene. To isolate these fluctuations from any overall drift, researcher supplied a low-pass Wiener filter to the original data, which produced the fit line shown in FIG. 18(*b*). The result after subtraction of the drift had overall height fluctuation remaining at ~5 nm. For comparison, a typical STM trace acquired from a rigid sample (i.e., monolayer graphene grown on SiC) is also shown. In previous work, researchers observed two-time height autocorrelations in about 10% of raw STM height-time data sets [E14]. Here researchers show that time correlations are often hidden within large-scale height shifts, necessitating background subtraction to become evident. From the height-time series z(t) shown in FIG. 18(*d*), researchers compute its height autocorrelation function ACF (see Supplemental Material for materials and methods), which is shown in FIG. 18(*e*). The large height changes and the oscillatory ACF are evidence of significant coherent, collective motion of atoms in the membrane. In fact, it is not physically possible for a single-bonded carbon atom to move so far without neighboring atoms also moving along with it. The power spectral density PSD of z(t) is shown in FIG. 18(*f*). It has a dominant peak around 5-10 mHz, which is far below the fundamental vibration mode of freestanding graphene in the GHz range [E18]. What causes this surprisingly low frequency that dominates the large coherent movement of the graphene is discussed in the following section.

Elasticity theory yields a flexural frequency of ~10 GHz for a typical ripple measuring 10 nm by 10 nm, or twelve orders of magnitude higher than the experimental result (see Supplemental Material for elasticity theory for buckled freestanding graphene) [E17]. This difference arises due to the long escape time needed to surpass the energy barrier between concave and convex ripple orientations [E18]. To confirm the organized motion of ripples, researchers performed molecular dynamics (MD) simulations on a pre-buckled, square graphene membrane (15×15 nm2) in vacuum. The sample contained 10 000 carbon atoms with a fixed boundary and no STM tip (see Supplemental Material for molecular dynamics simulations) [E17]. A snapshot of the membrane in a convex geometry is shown in FIG. 19(*a*). The movement of the central atom with 3×106 time steps (1 per fs) at a high temperature (3000 K) shows the height fluctuating above and below the fixed boundary in FIG. 19(*b*). High temperatures were used to speed up the simulations using temperature accelerated dynamics [19]. Here 1 ns corresponds to about 1 ms. While the timescale of the MD simulations is not the same as that of the STM experiments, researchers do find ripple curvature events all contain similar inversion dynamics, independent of the timescale. The random movement results in numerous curvature inversions from above the fixed boundary to below. The height-time series z(t), shown in FIG. 19(*b*), was used to compute its autocorrelation function ACF, which is shown in FIG. 19(*c*). It displays decaying oscillations similar to those observed in the experiment. The power spectral density PSD of z (t) is shown in FIG. 19(*d*). A few dominant low frequency peaks can be seen. Thus the complex internal dynamics of the graphene membrane, naturally lead to low-coherent motion with two-time height autocorrelations similar to the STM data.

The MD simulation shows that ripple-dynamics conform to motion in a double-well potential with a long-escape time. The entire membrane moves coherently from convex to concave. Note that, in the simulation, the boundary atoms are fixed and the sample is pre-stressed whereas the actual boundary of a ripple is another ripple, which influences internal dynamics through lattice strain. Nevertheless, unstressed freestanding graphene has been shown to form ripples spontaneously [E12]. In addition, electron-phonon coupling generates stresses that produce buckling and rippling [E20]. To further confirm the experimental results and gain further insight into the complex dynamics of these transitions, researchers also modeled the graphene as an elastic membrane of point masses. These represent ripples on a hexagonal lattice, each of which is subject to a random upward or downward force. The latter arising from the coupling between the ripples via two-state spins that interact antiferromagnetically. While the point-sized masses satisfy Newton's second law, the two-state spins exchange energy with a thermal bath and flip according to Glauber's Monte Carlo-like update [E15, E16]. Here, the spins model the internal interactions that promote the non-flat configuration: electron-phonon coupling as well as the effect of the multiplicity of chemical bonding [E12, E13, E20]. See Supplemental Material for antiferromagnetic 2D spin-membrane model [E17].

Thus the STM data, together with MD simulation and antiferromagnetic spin-elastic membrane model, confirm that rippled freestanding graphene membranes exhibit coherent collective motion. In this section, researchers demonstrate that this motion may be exploited to generate an electrical current. There are four known methods for harvesting electrical energy from vibrating sources: electromagnetic, piezoelectric, magneto-restrictive, and electrostatic. Researchers use electrostatics, through the variable-capacitance effect, by incorporating the STM tip-sample junction into an electronic circuit. To the best of the knowledge, this type of circuit has never been attached to an STM before. To achieve this, the system was first customized to electrically isolate the STM sample from the rest of the chamber and from ground [E21]. A vacuum electrical feedthrough allowed access to the sample from outside the chamber. This unusual circuit [E22, E23] was first developed as an ultra-high efficiency, varying-capacitance machine for generating electrical power when driven by wind or human sources. Using diodes, the circuit separates the work done when adding charge to the variable capacitor from the work done when removing charge from the variable capacitor [E22, E24]. The STM tip-sample junction is the variable capacitor for the circuit.

For clarity of the electrical circuit exposition, researchers ignore the tunneling of electrons between the tip and sample (see Supplemental Material for vibration energy harvesting during tunneling) [E17]. Also, researchers limit the discussion to one vibration cycle, where the sample first moves away from a stationary STM tip and then returns to its original position. As the tip-sample distance, d(t) increases, the capacitance of the junction decreases. For a constant bias voltage, the total static charge stored at the tip-sample junction must decrease with decreasing capacitance. Thus, as the tip-sample distance increases, excess positive charge flows off the tip and moves backward through the circuit into the power supply, through the ammeter that records it, through diode 2, and on to the sample. If the power supply is a rechargeable battery, then it is recharged during this cycle [24]. It is essential to realize that the amount of work done during this part of the cycle is not driven by the battery, but by the force that separated the sample from the tip, overcoming their electrostatic attraction (e.g., wind, human, or in this case thermal). Note, the current flowing through diode 2 (D2C) has been used to charge a capacitor (not shown), thus enabling the storage of the harvested current.

During the other half of the cycle, as the tip-sample distance decreases and the capacitance increases, the total charge stored at the tip-sample junction will increase. Charge now flows through diode 1, and not through the ammeter. The energy expended in this half of the cycle by the power supply was resupplied during the other half of the cycle (discussed above). For this circuit, the power supply does not play any role in the net exchange of energy with the system [E23].

It is possible for the STM feedback circuit to supply energy to the system by moving the STM tip away from the sample, which would result in a D2C. Researchers avoided this by collecting data without feedback control. To do so, researchers incrementally backed the STM tip away from the sample using the coarse motion stage until the distance was too great for the electrons to tunnel through the vacuum barrier. In this position, to ensure that the STM feedback would not move the STM tip, researchers raised the setpoint current (SPC) to the maximum (5 or 50 nA). Next, researchers increased the bias voltage and systematically observed a spikey, time-dependent current flow through diode 2. Three different bias-voltage results are presented, showing that the current increases with bias voltage. The dependence is clearer where the average current for a large number of data sets is shown. These results are consistent with the expectation that an increasing bias voltage adds charge to the tip-sample capacitor junction, thereby increasing the electrostatically induced current. Researchers repeated this experiment with numerous STM tips, at different locations on the sample, and with many different samples. In addition, researchers found that when a rigid graphene sample is used, either zero induced current or the setpoint current for all voltages is obtained. The rigid graphene data set also confirms the absence of electron field emission, which is reasonable given the relatively low temperatures and low voltages used in the experiments.

There are several noteworthy aspects to the energy harvesting demonstration. The collective kinetic energy of the buckling, which is being converted into stored electrical charge, is equal to the local temperature. All other thermal energy harvesting methods, such as the thermoelectric effect, derive their energy from a temperature difference. In addition, the method eliminates the STM feedback circuit from the measurement, which would continuously adjust the STM tip position to maintain the desired tip-sample distance and effectively minimize the movement of the sample. With the STM feedback unable to move the STM tip, the role of the moving freestanding graphene is isolated and quantified. Accordingly, in the configuration, the STM tip functioned only as a nearby stationary metal electrode. This suggests that an integrated circuit could replace the STM tip-diode circuitry, opening the potential for scalability. Finally, the setup proves that the dynamic properties of freestanding graphene persist even under the influence of an externally applied electric field. And, more importantly, graphene's organized thermal motion and electrostatic coupling are large enough to make energy harvesting feasible [E25]. More specifically, when the graphene ripple flips away from the STM tip, the work done to overcome the electrostatic attraction between the tip and sample is derived from the thermal force behind this motion. The diode circuit harvests only this energy.

In this setup, the charged graphene membrane is similar to a charged microphone membrane. Using the circuit described above, researchers convert the collective kinetic energy of the moving charges into a DC current source. With graphene, the kinetic energy is its thermal energy $kBT$, rather than sound pressure. The total mechanical power of a thermal ripple has been estimated at 1 pW/nm2 [E18], or about 400 pW/ripple [E26]. This value is consistent with the finding of 30 pA of induced current at 10 V, if researchers assume an effective area of 50 nm by 50 nm. Ultimately, the energy transfer is driven by coupling between the charges in the freestanding graphene and the charges within the STM tip (i.e., an electric dampening coefficient) [E27, E28]. This phenomenon is similar to regenerative braking. Dampening removes kinetic energy from the freestanding graphene, equivalent to lowering the local temperature. Even at a reduced temperature, however, the ripple will continue to move because its low-energy modes are available over a very wide temperature range. For example, electron mobility measurements show that flexural phonons are the dominant scattering mechanism, even at temperatures as low as 10 Kelvin [E29]. Of course, the individual ripple temperature will not fall that low. Graphene has an extraordinary thermal conductivity, at least ten times that of copper [E30]. The sample is thermally connected to the external ambient environment through its mechanical support, so heat will flow. This configuration is not in thermal equilibrium; instead, it is a steady-state open system.

While the power harvested by the setup is low, its power density is sizeable, exceeding that of wind (~1 W/m2) and solar (~10 W/m2). In addition, this new thermal source can be continuously harvested. An additional benefit of electrostatic generators is their size (see Supplemental Material for wafer design). Compared to electromagnetic generators, the much less commonly used electrostatic generators are at least 100 times smaller. This offers a significant advantage in powering small devices, such as those needed for the Internet of Things [31]. Wireless sensor nodes with modern circuit designs, for example, operate at a very low duty cycle, consuming only 35 pW of power in standby mode and 226 nW of power in active mode [32].

In summary, the correlated dynamics of atomic-scale fluctuations of a freestanding graphene membrane were studied using point-mode scanning tunneling microscopy. Using MD simulations and the antiferromagnetic spin-elastic membrane model, researchers have shown that ripples naturally invert their curvature, at which time thousands of atoms move coherently. The measurements reveal that the out-of-plane motion of the membrane is extremely large. Its movement, or organized Brownian motion, originates from thermal energy and interactions between ripples, naturally forming a stochastic feedback network. Researchers have successfully converted this significant kinetic energy to an electrical current for storage. Vibration energy harvesting is a new and exciting source of renewable energy derived from ambient temperatures.

Materials and Methods

For this study, monolayer graphene (a sample in which less than 10% is multilayer graphene) was commercially grown on Ni. It was then directly transferred to a 2000-mesh, ultrafine copper grid featuring a lattice of square holes (each 7.5 μm wide) and bar supports (each 5 μm wide). Scanning electron microscope images confirmed 90% coverage of the grid. An Omicron ultrahigh vacuum (UHV), low-temperature STM (base pressure 10-10 mbar) operated at room temperature was used for the height-time measurements. The graphene film was mounted toward the sample plate on standoffs, allowing the STM tip to approach through the grid's holes. This provided a stable support for the graphene while it was under the electrostatic attractive influence of the bias voltage. To find the center of the membrane, researchers move the STM tip laterally until researchers find the edge of the copper grid, then move the tip to the center. The entire STM chamber rests on an active, noise-cancelling, vibration isolation system. It is powered using a massive battery bank with an isolated building ground to achieve exceptionally low mechanical and electrical noise.

Data for this study were acquired using STM tips fabricated in-house, using constant-current (feedback on) tunneling conditions, with the topography scan set to point mode (no x- or y-scanning) Researchers have operated the STM in scanning mode, but the motion of freestanding graphene is so rapid that the resulting images are too blurry to be useful. For this reason, the group was the first to acquire data in point mode. These data sets show the height fluctuations in time for a single location. Researchers then analyzed the data sets as one-dimensional random walk events, discovering that the movement of the membrane is extremely noisy. Even if 50 volts is applied between the graphene and the STM tip, the graphene continues to move. Researchers adapted the system to allow continuous recording of 16-bit data for both the actual tunneling current and the tip height at a rate of 800 Hz for a time span of 104 s, yielding 8×106 data points per channel Researchers independently monitored the STM tip-sample drift and found that it is non-stochastic, with a speed of less than 1 nm/hr. Researchers collected data from multiple membranes with fixed imaging conditions spanning several orders of magnitude in tunneling current (0.01-10 nA) and bias voltage (0.01-10 V), all at room temperature. When imaging the graphene surface with atomic resolution, researchers observed only monolayer graphene that was defect-free over a scale of microns.

To calculate the height ACF, researchers start with z(t) shown in FIG. 1(d) as an array of height values indexed 1 to N and compute: where t indexes from 0. This expression is often called the auto-covariance function, as ACF(0) is the variance of the first half of the data set. To calculate the power spectral density, researchers utilize the Wiener-Khinchin theorem and compute the Fourier transform of ACF (t).

Elasticity Theory for Buckled Freestanding Graphene

To model the low-frequency oscillations, researchers first use elasticity theory, which yields the lowest flexural frequency, where D, ρh, k are bending stiffness, areal mass density, and allowable wave vector, respectively. For a 10 nm by 10 nm ripple of graphene, $f_0=10$ GHz, which is twelve orders of magnitude higher than the observed frequency. The physics missing from this model is the known rippled morphology of the membrane. To incorporate this, researchers first imagine compressing the graphene, thereby allowing ripples to form due to the essentially incompressible, strong carbon bonds. For illustration purposes, a narrow cross-section of a graphene ripple after in-plane compression is shown in FIG. 5(a). Compressed graphene will curve either up or down because its carbon bonds are highly flexible. From the geometric shape of a typical 20 nm wide ripple, the relationship between the compression strain and height is shown in FIG. 5(b). A ripple has two equivalent low-energy configurations, concave and convex, naturally forming a double-well potential energy profile, as shown in FIG. 5(c). The energy barrier is given by $\alpha\varepsilon^2$, where α is an energy constant, calculated to be $\alpha\varepsilon^2=1.2$ eV for a strain of 0.1%, and $\varepsilon=(L_o-L)/L_o$ is the compressive strain [E18]. The ripple inverts its curvature by crossing the barrier at Kramer's rate. From the geometry of a typical ripple, researchers find that $\alpha\varepsilon^2=0.7$ eV, which reduces the flexural frequency by a factor of $10^{12}$. In general, ripple formation exponentially reduces the flexural frequency expected from elasticity theory. The curvature inversion transition rate versus ripple height is shown in FIG. 5(d). Note that the rate spans more than fifteen decades as the ripple height varies by only one angstrom.

Molecular Dynamics Simulations

To confirm the organized motion of ripples, researchers performed molecular dynamics (MD) simulations on a pre-buckled square graphene membrane (15×15 nm2) containing 104 carbon atoms with boundary atoms fixed and no STM tip. The simulations were done in vacuum and performed in LAMMPS using the AIREBO potential. A Nosé-Hoover thermostat was used to maintain a constant temperature and the equations of motions were integrated using a time step of 1 fs. The system was first equilibrated for 3.0 ns, beginning with the initial configuration. The subsequent trajectory, from a production run of 15.0 ns, was used in the analysis. High temperatures sped up the simulations using temperature accelerated dynamics [19].

Antiferromagnetic 2D Spin-Membrane Model

This model provided further confirmation of the organized motion of ripples. Researchers consider point masses placed on the nodes of a hexagonal lattice that interact through harmonic springs. At each site, the mass is linearly coupled to a two-state Ising spin. Spins are antiferromagnetically coupled. The Hamiltonian is: where represent the values of the spins, height and momentum, respectively, for mass m placed at site iiii of the hexagonal lattice shown in FIG. 6. The dynamics of the system consists of Hamilton's equations of motion for (uij,pij), and stochastic dynamics at temperature TT for σij, see [E15,E16] for more details.

As mentioned in the main text, the spin dynamics mimic the effect of electron-phonon coupling and the multiplicity of chemical bonding for carbon [E12,E13,E20]. The equations of motion for the positions of the masses are integrated using Verlet's algorithm, which includes an external force ffσσiiii acting on the mass at site iiii (see Hamiltonian). At each time step, one lattice site is selected randomly; its spin flips according to Glauber's version of the Monte Carlo simulation, with probability rate [E16]: where δ is a parameter that sets the characteristic time scale for spin flips and T is the bath temperature measured in energy units [E16]. In numerical simulations, the time step is 1/(δN), where N is the number of lattice nodes. Results shown in FIG. 3 of the main text were produced using the height of a point mass at the central position of the system, analogous to the STM experiments.

Vibration Energy Harvesting During Tunneling

In contrast to the results presented in the main text, here researchers consider tunneling of electrons between the STM tip and sample in the electronic circuit shown in FIG. S3(a). The tip-sample junction forms a leaky capacitor, as charge can pass through the vacuum barrier. Consequently, the current flowing through diode 2 has two possible origins. One is due to the variable capacitance of the tip-sample junction (as discussed in the main text), while the other is due to tunneling current fluctuations. These two terms add to give the following expression:

Where e0 is the permittivity of free space, A is the effective area of the tip-sample capacitive junction, f is the frequency of the ripple oscillation, Δd(t) is the change in distance between the tip and sample, do is the tunneling current setpoint distance, Vstm is the bias voltage applied to the STM tip, Istm is the tunneling setpoint current (SPC), and k is the tunneling wavenumber. When the tip-sample distance is 2 nm or less, the tunneling term dominates; for larger distances, the variable capacitance term dominates.

When the STM is tunneling, this setup can be used to quantify the energetics of atomic-scale dynamic activities. In doing so, it's important to note that the current flowing through diode 2 depends on the SPC. This is shown in the equation above, as well as in the data in FIG. S3(b). Part of the D2C is a result of the feedback circuit doing work to maintain a constant tunneling current. Fluctuations in the tunneling current cause the feedback circuit to move the tip in an effort to keep it at do. These fluctuations occur at a high frequency where the response time of the circuit is a limiting factor due to parasitic capacitance. As a result, when current stops flowing through diode 2, it discharges with a long time constant. Before the D2C has time to appreciably decrease, the varying tunneling current has already reached diode 2 again. The result shown in FIG. S3(b) is independent of the applied bias voltage and the feedback gain setting. Researchers have also tested the circuit with Ge diodes and Schottky diodes, which perform better at higher frequencies. However, they suffer from reverse leakage current, which reduces the overall harvested charge.

When freestanding graphene is compared with rigid graphene, the average value of the D2C is the same, while the standard deviation differs considerably, as shown in FIG. S3(c). When the SPC is 100 pA, the D2C fluctuates by about 10 pA for freestanding graphene, but only by about 0.1 pA for rigid graphene. As the SPC is increased, the standard deviation increases for both due to sample heating. Nevertheless, the size of the fluctuations remains roughly 100 times larger for the freestanding sample. On average, the feedback is successful at tracking the freestanding graphene's movement, but unsuccessful instantaneously. One may extrapolate the freestanding graphene current fluctuations to zero tunneling current and predict that the fluctuations will still contribute about 20 pA.

Wafer Design

It is not practical to use an STM for applications. Therefore, a wafer-based design is presented in herein. In the top view of FIG. 17A, the sequence of small squares 235 represents metal contacts in lieu of the STM tip. Diodes 250 are formed on either side to regulate the charge flow. Graphene 265 is overlaid on top of this structure using stand-offs, which can be more clearly seen in the side view. This design uses two capacitors (200, 275). A first capacitor (265, 335) charges the graphene and allows the charge to be shuttled on and off, while the second capacitor (275) stores the harvested charge. The wafer designs described in the figures illustrate examples that are not limiting of the disclosure. For example, substrates may include not only silicon, but also silicon dioxide, silicon carbide, gallium arsenide, flexible substrates, flexible printed circuits, organic substrates, organic electronics, or any substrate capable of having diodes formed within the substrate.

Figure 21A:
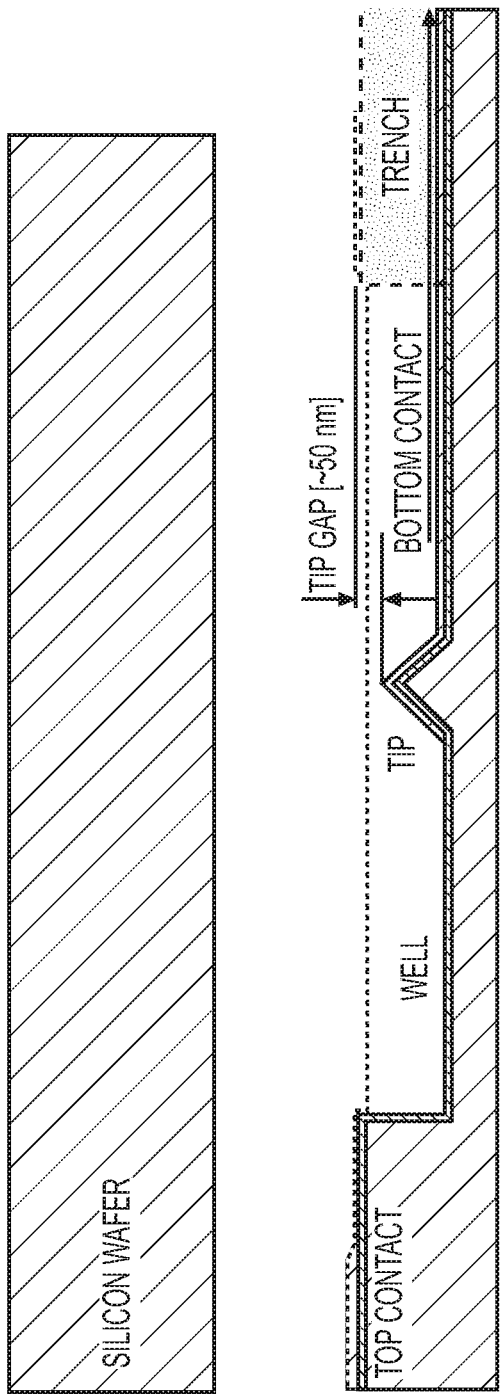
FIGS. 21A-21R are iterative illustrations of steps for forming an energy harvesting circuit according to this disclosure using electron beam patterning.
Figure 21B:
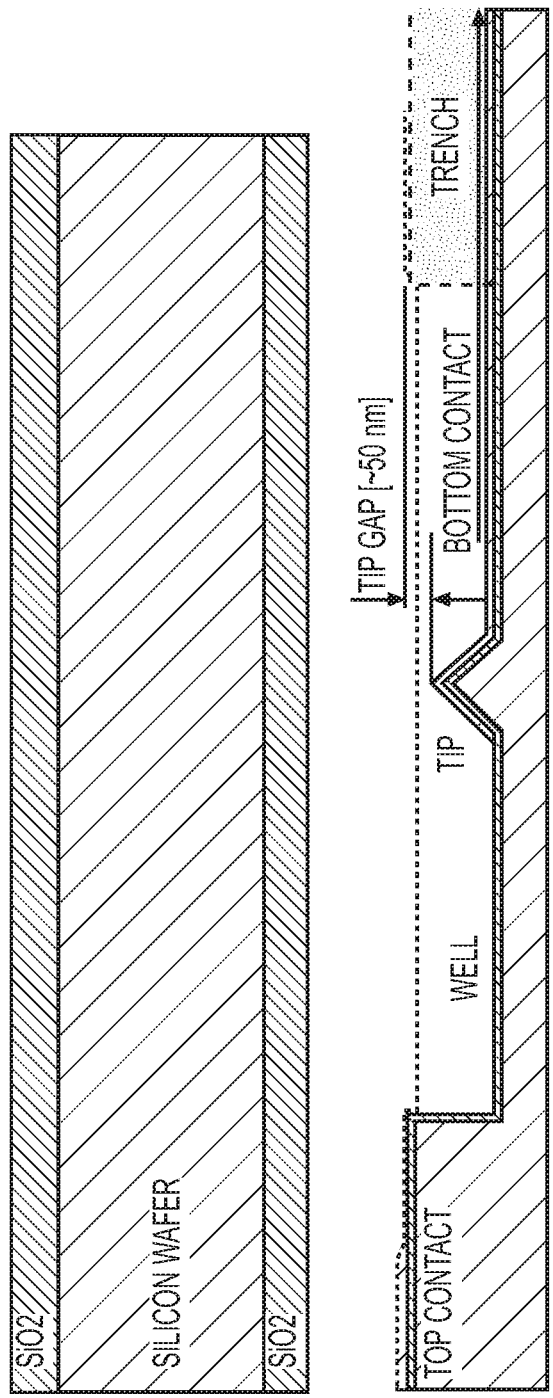
Figure 21C:
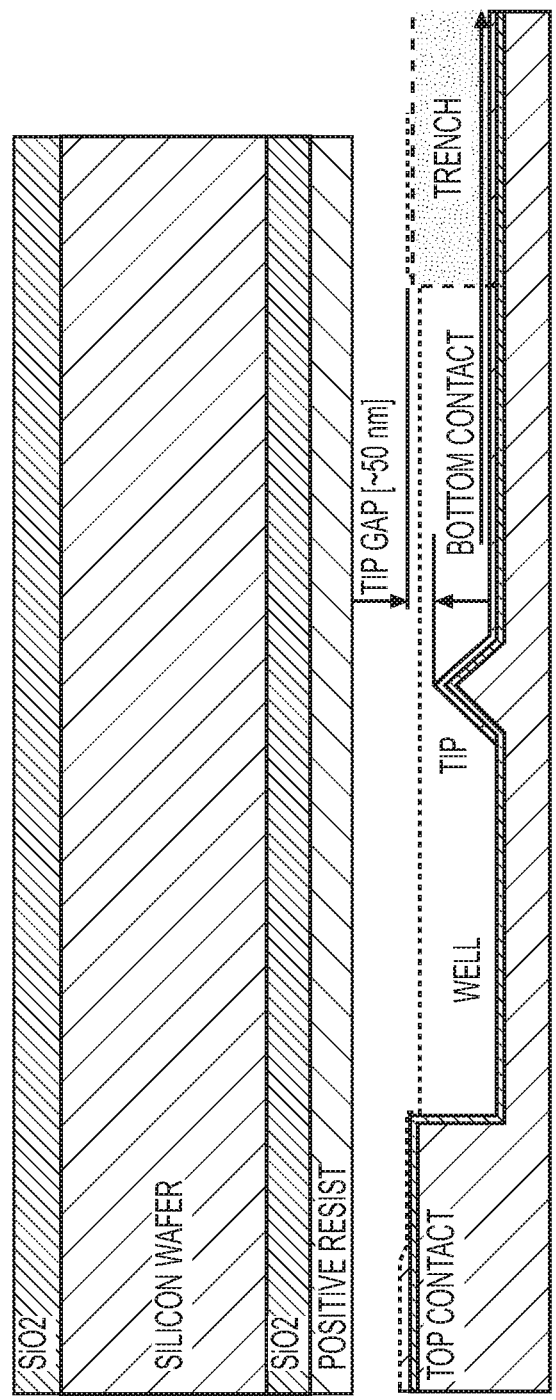
Figure 21D:
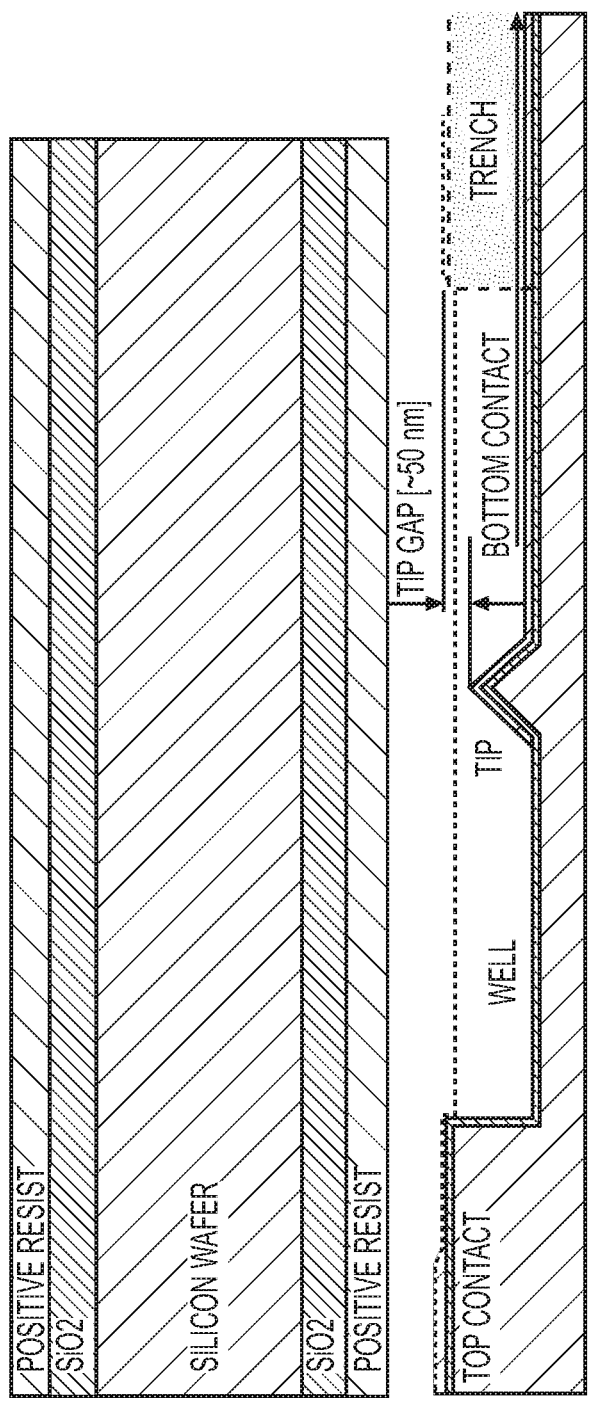
Figure 21E:
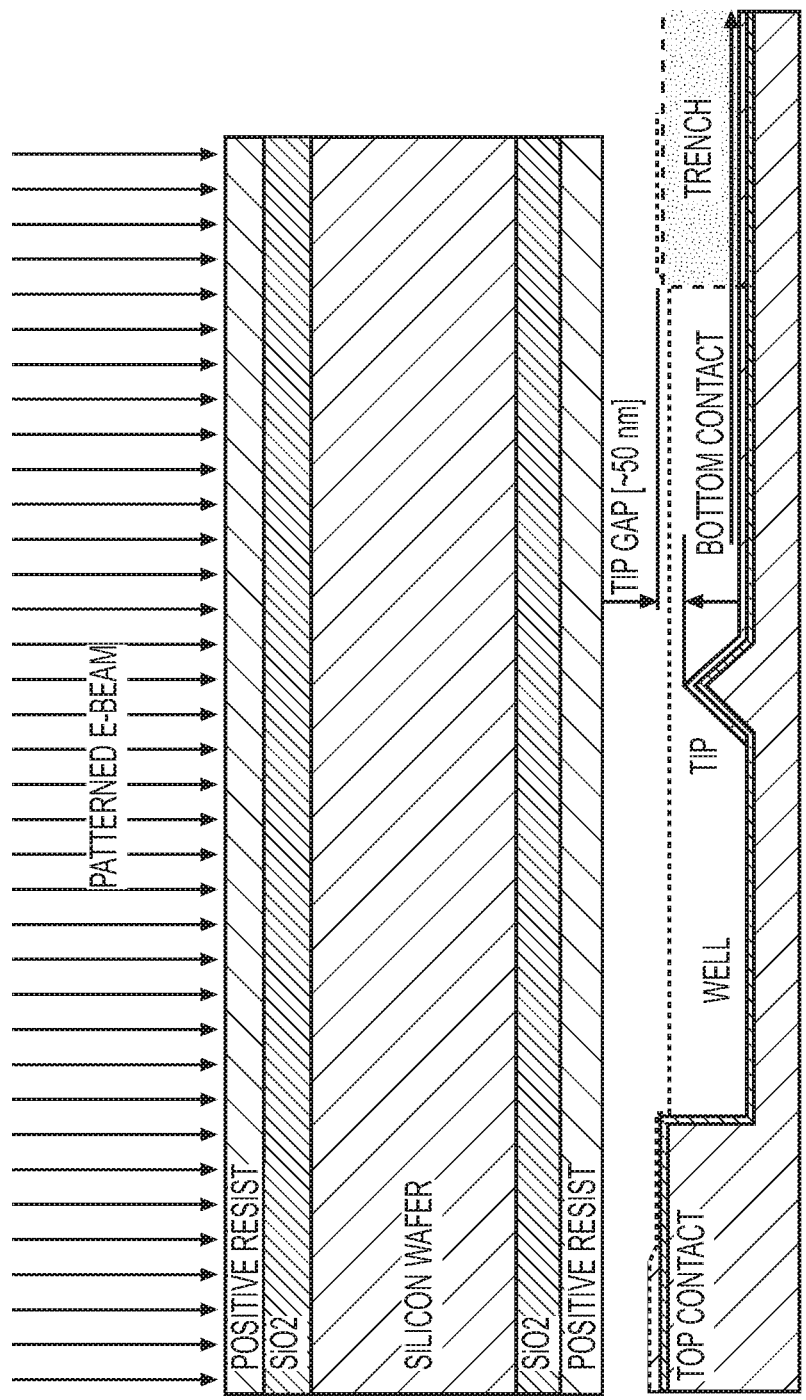
Figure 21F:
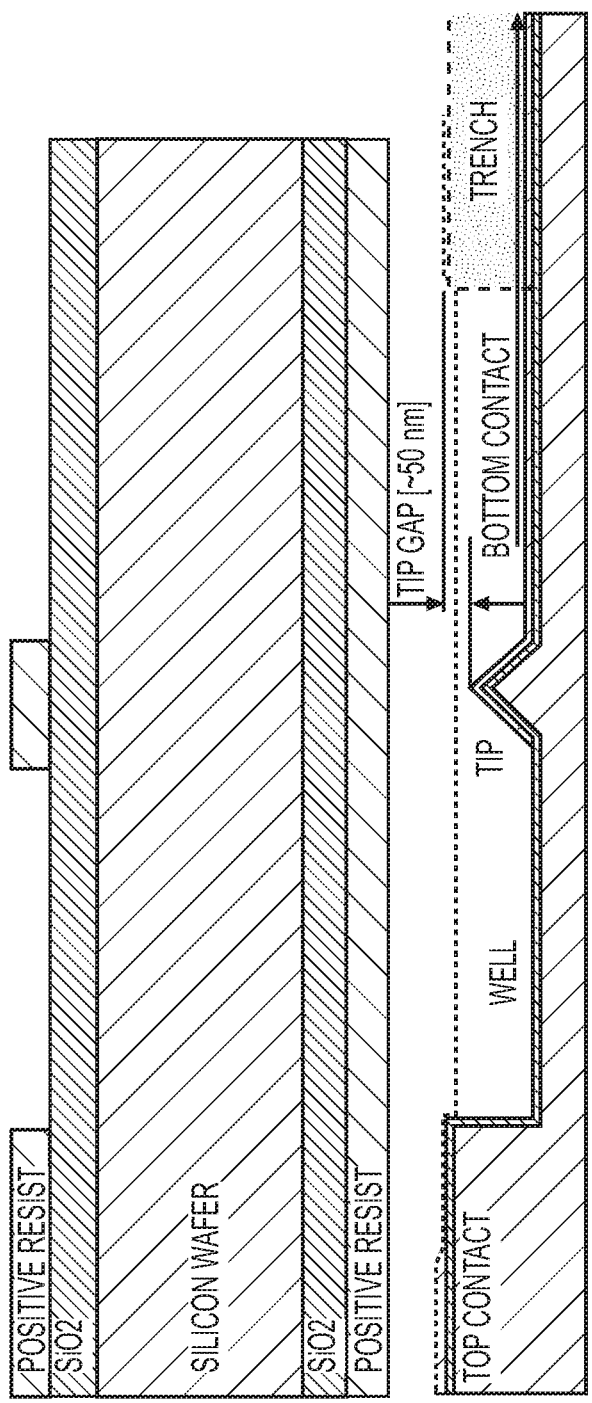
Figure 21G:
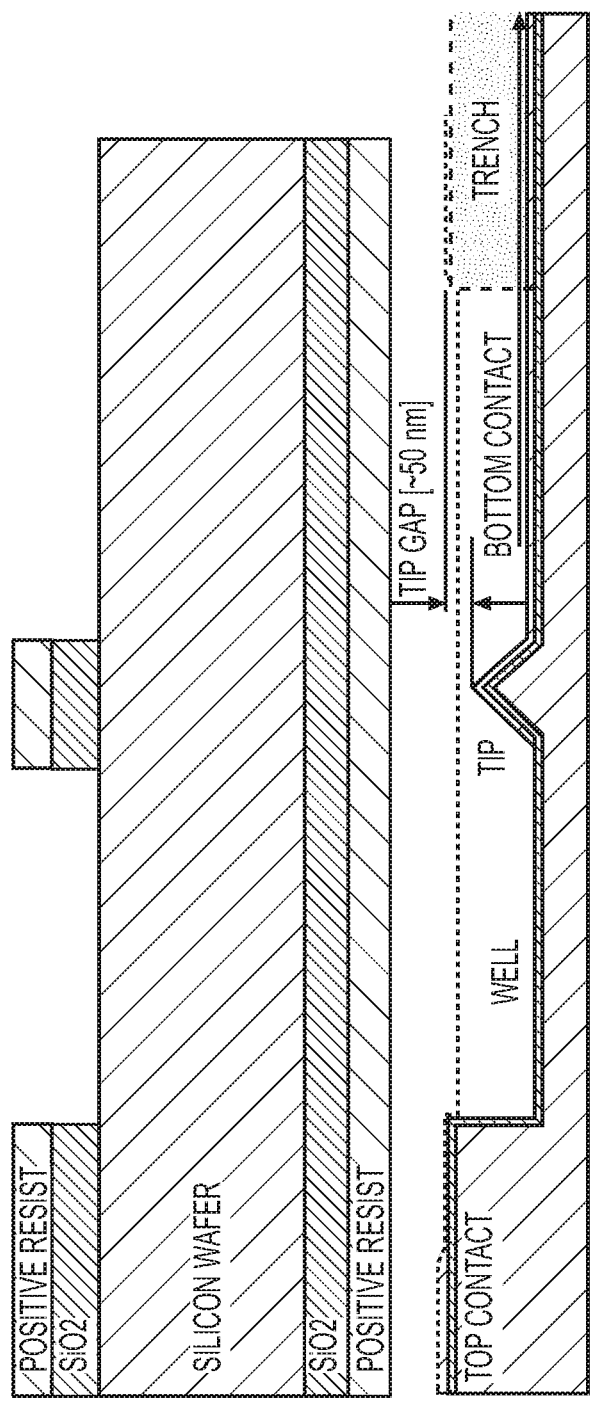
Figure 21H:
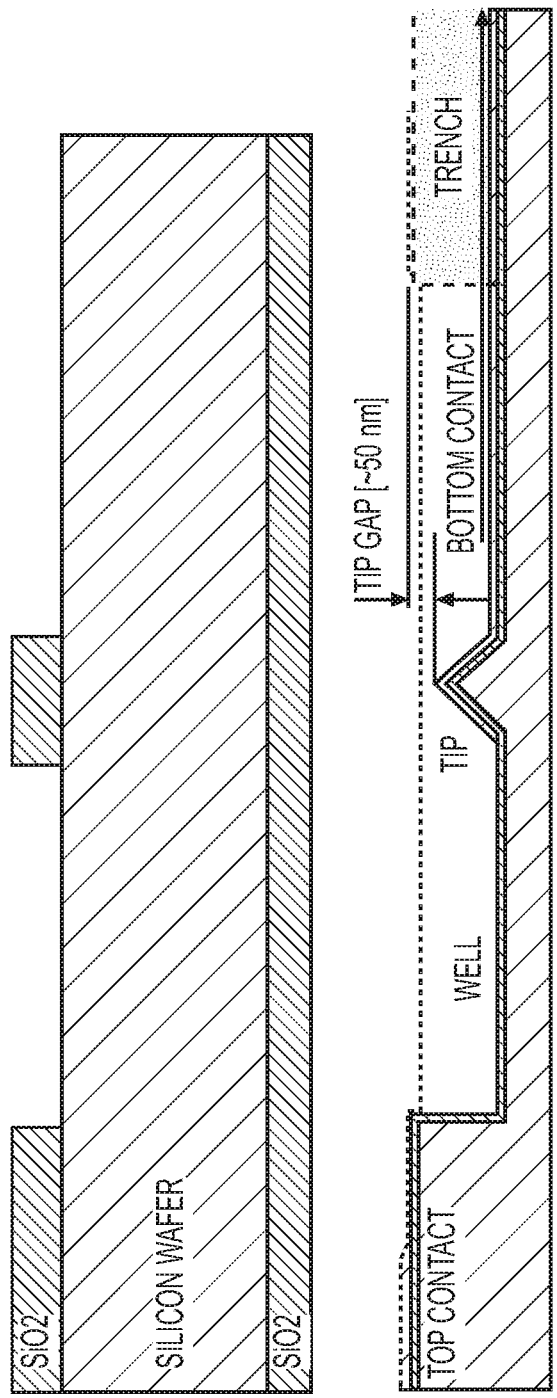
Figure 21I:
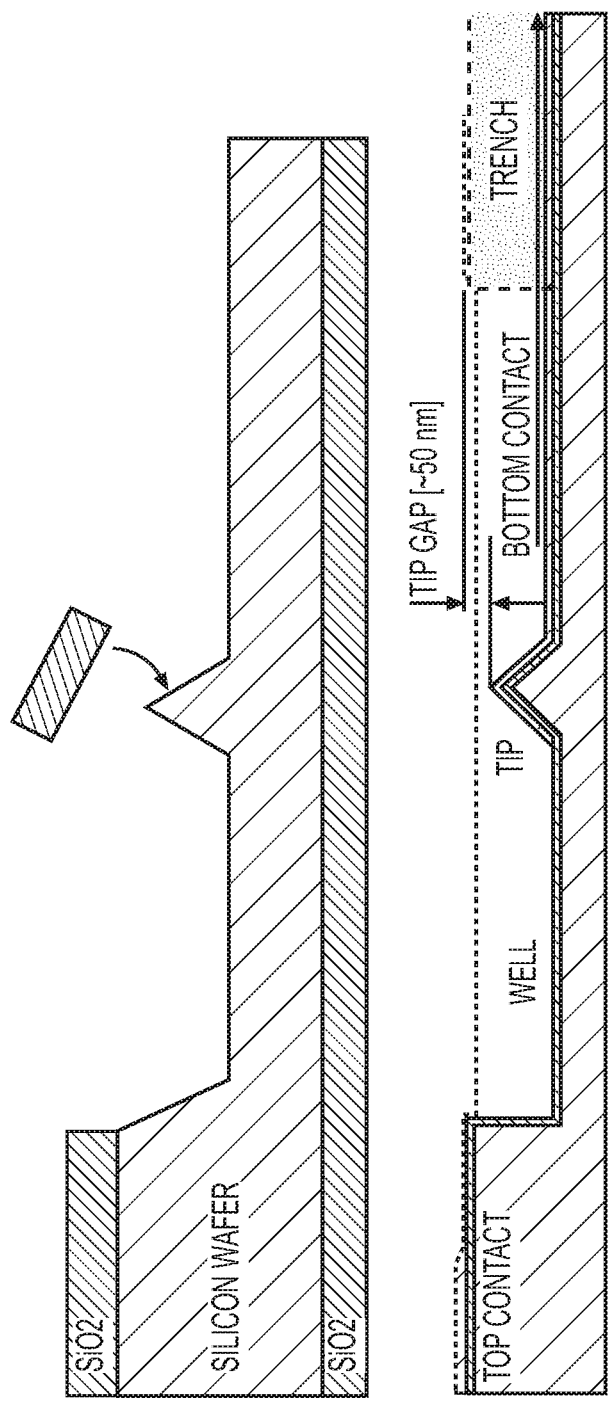
Figure 21J:
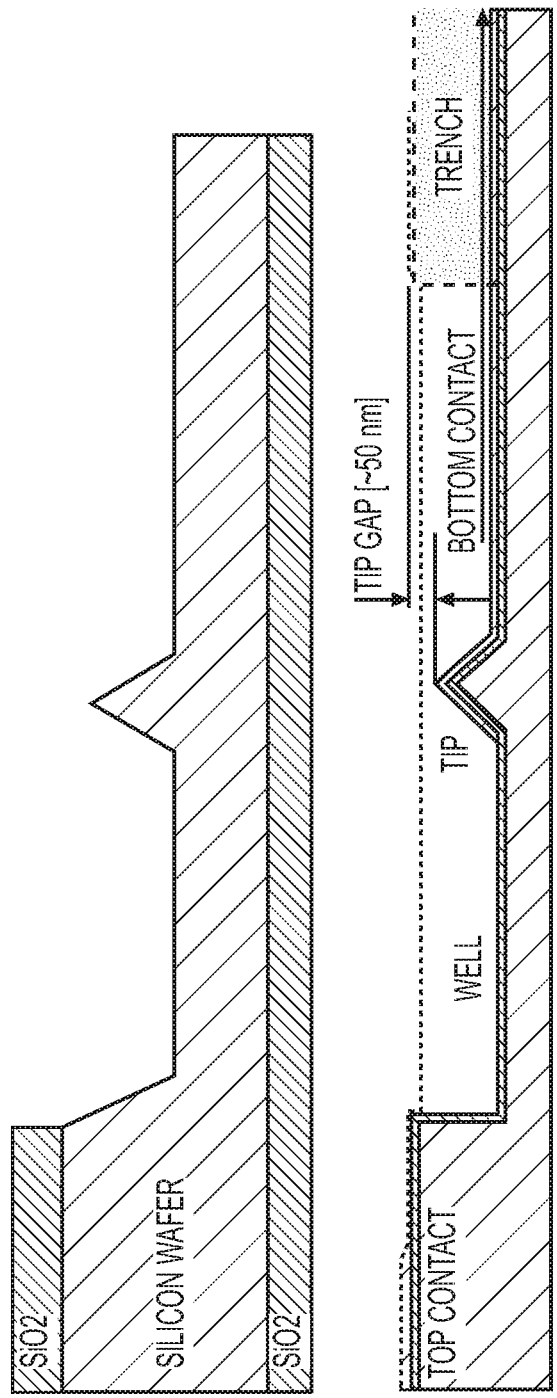
Figure 21K:
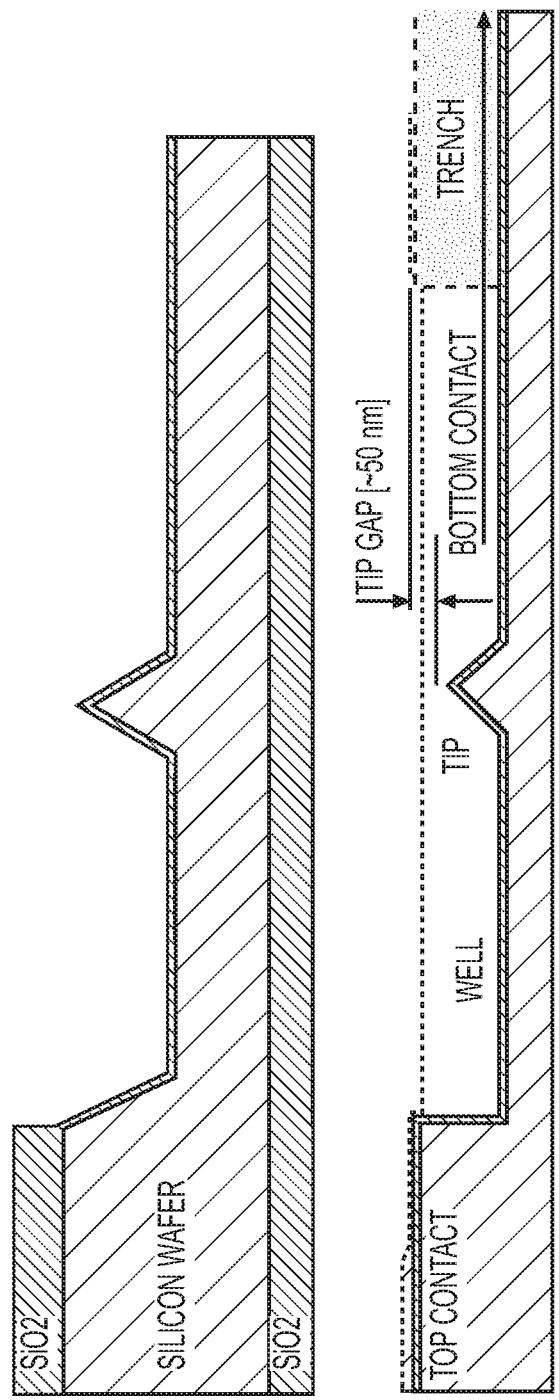
Figure 21L:
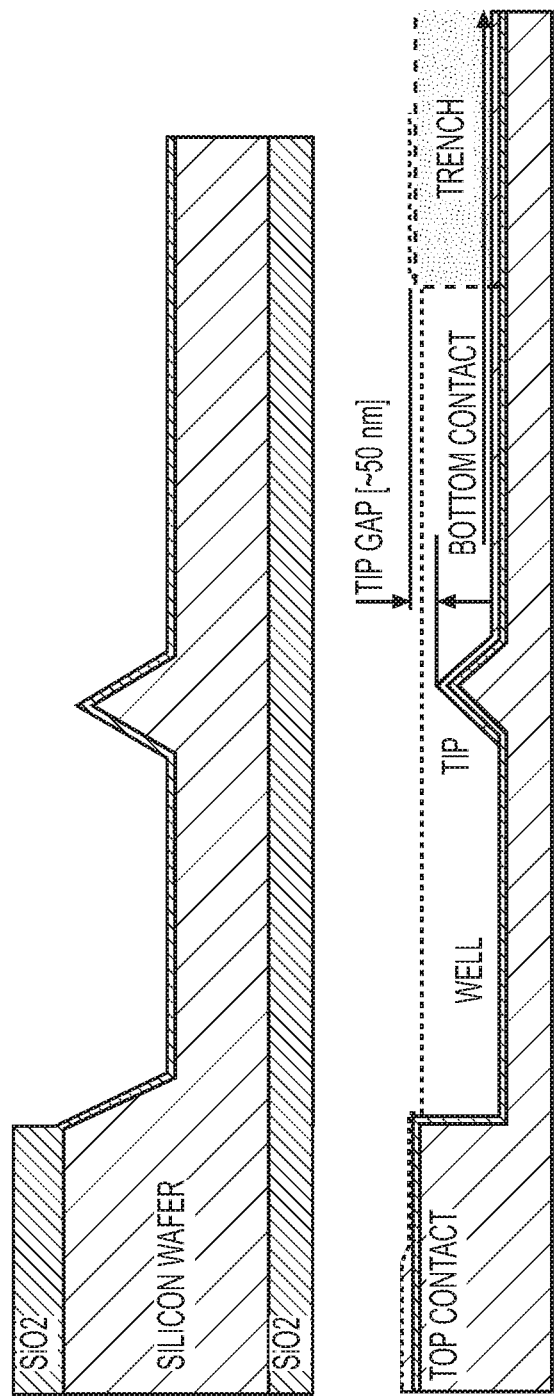
Figure 21M:
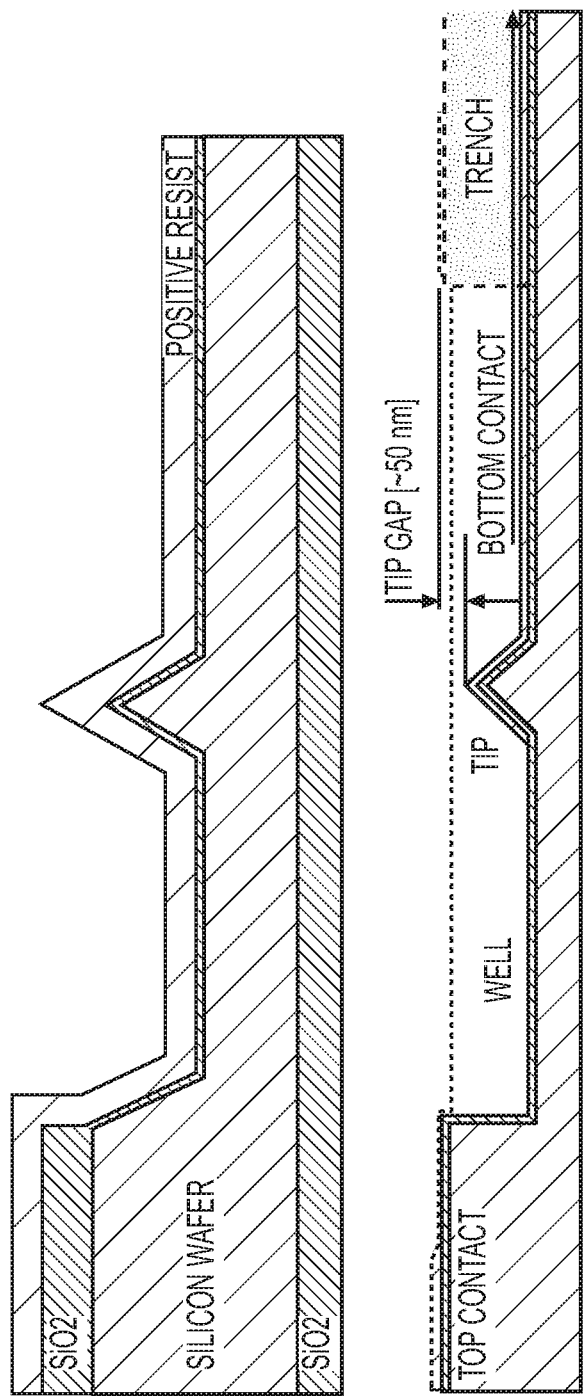
Figure 21N:
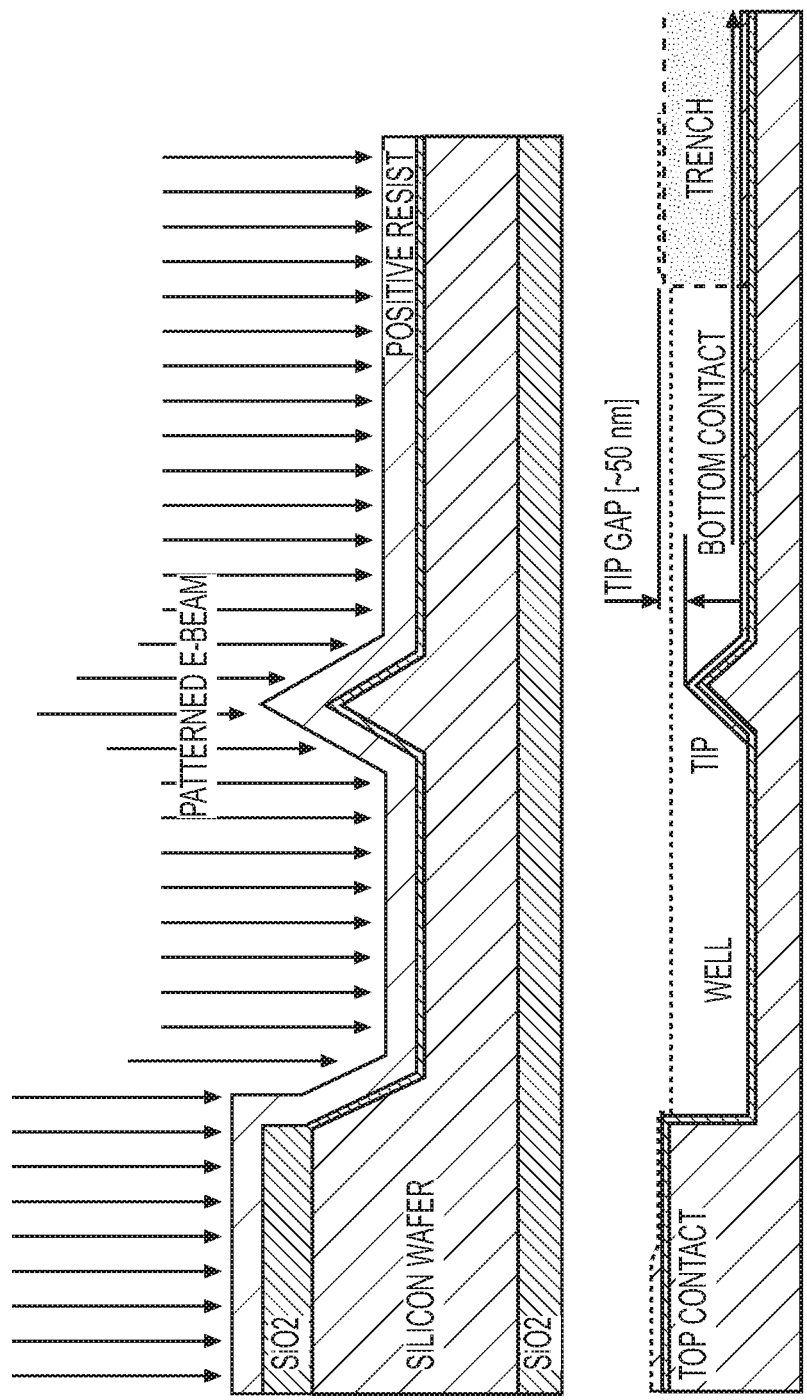
Figure 210:
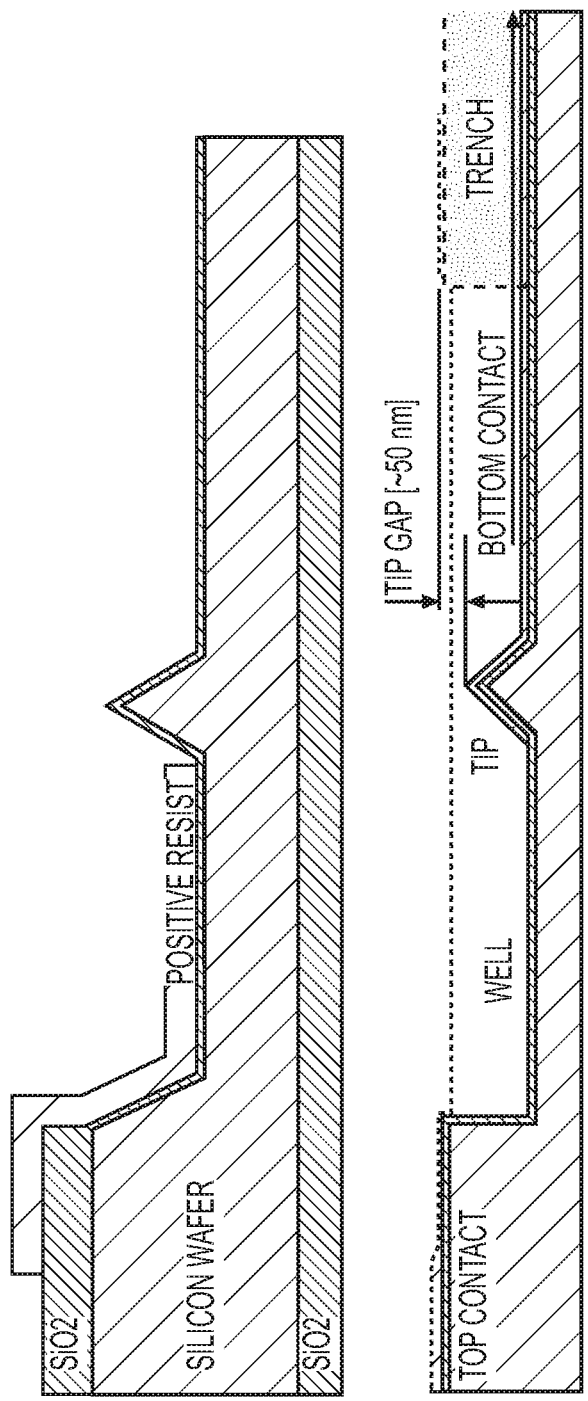
Figure 21P:
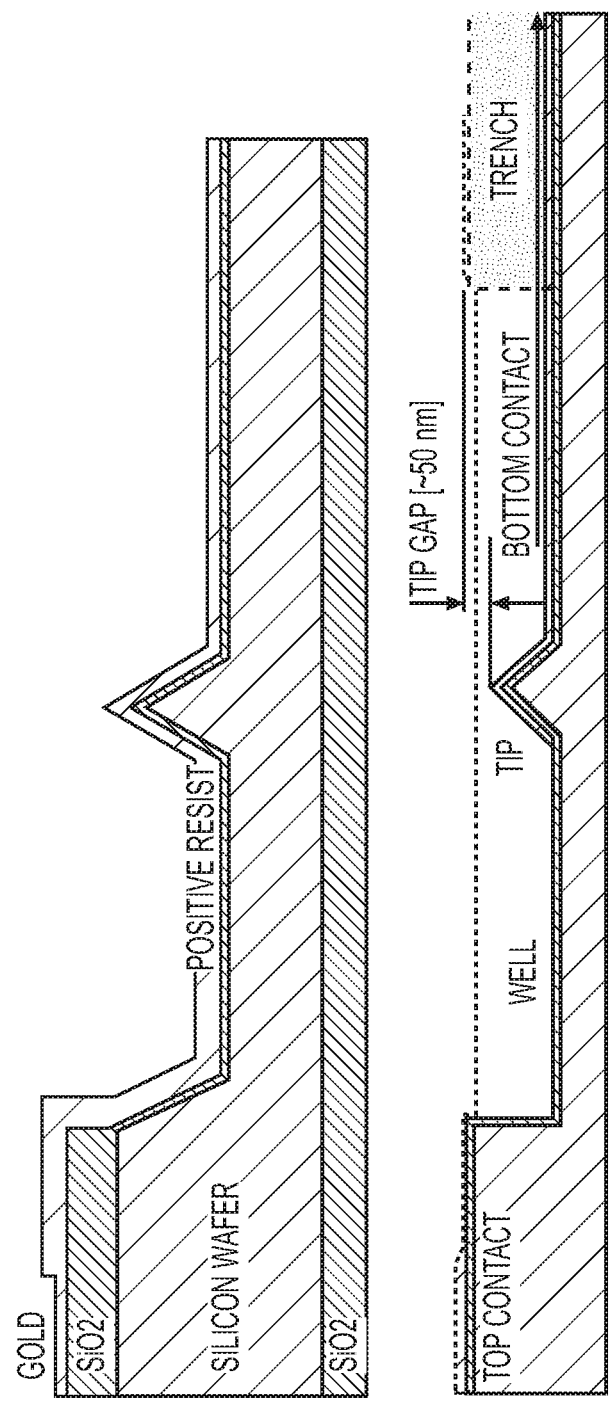
Figure 21Q:
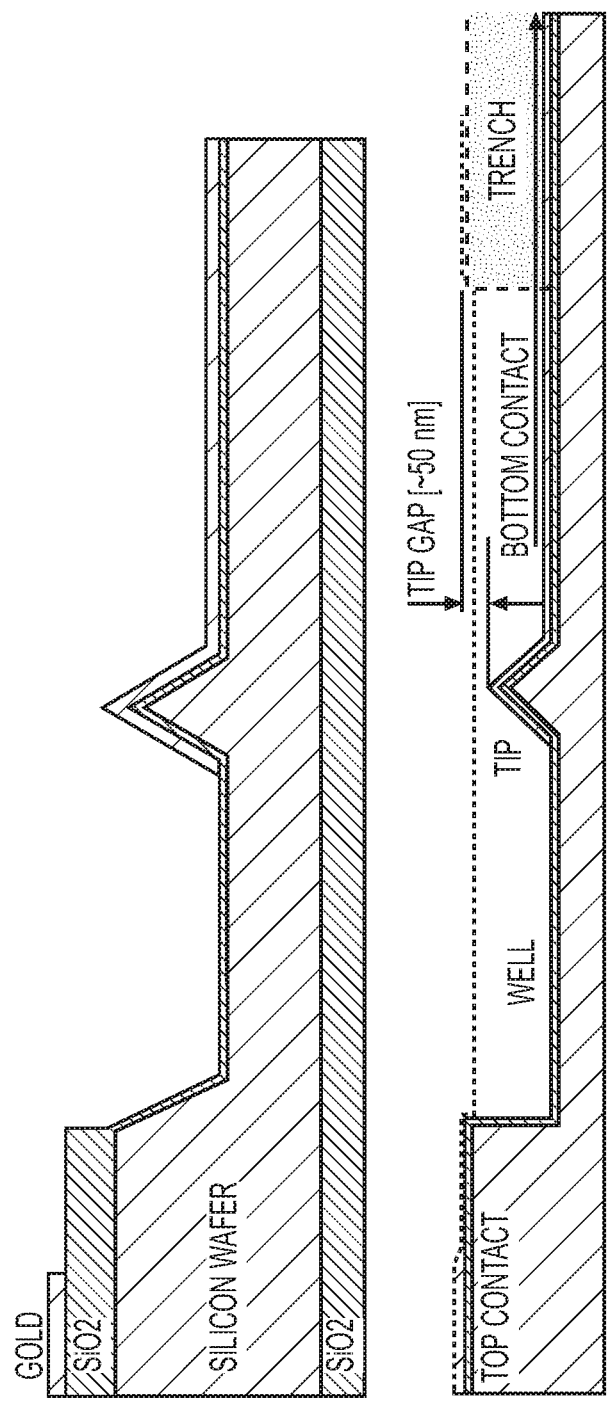
Figure 21R:
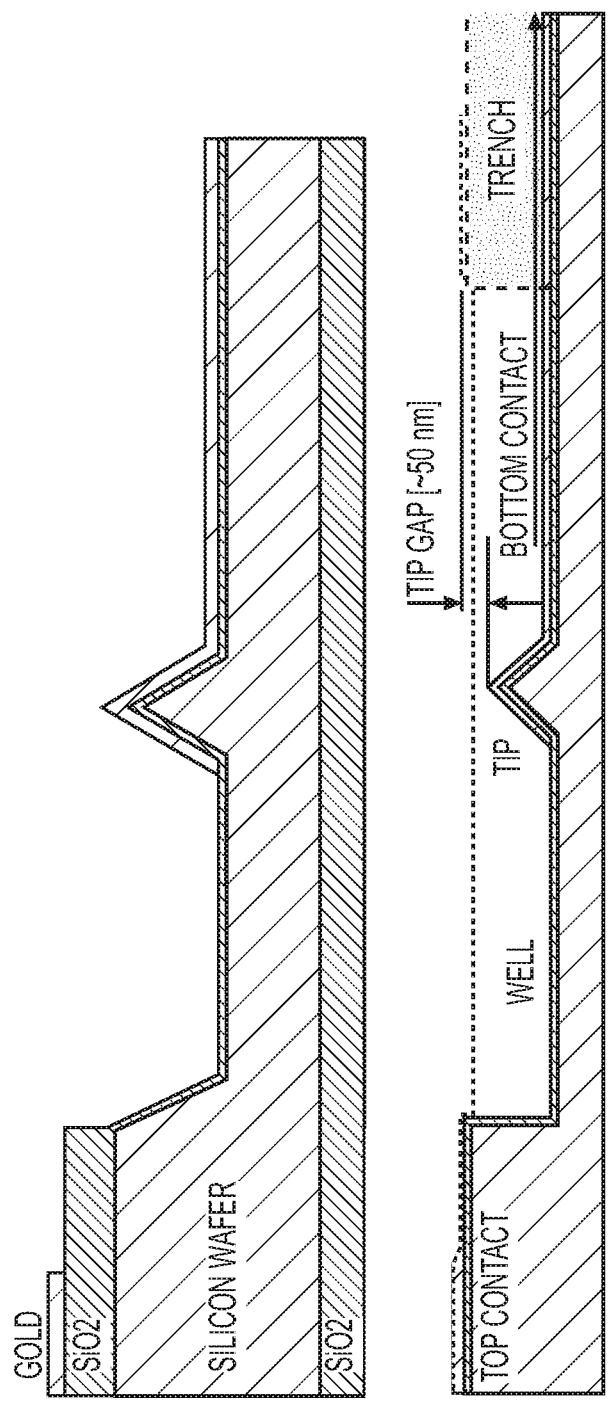

FIGS. 21A-21R illustrate example procedures, that are not limiting of the disclosure, for forming a device according to this disclosure with electron beam fabrication steps as follows:

FIG. 21A. Begin fabrication process with a 4" 100> silicon wafer 500 microns thick;

FIG. 21B. Oxidize the wafer to establish a specified SiO2 layer thickness (e.g., 300 nm);

FIG. 21C. Spin coat resist back side of wafer and soft bake; EL-6 MMA spun at 5000 rpm, bake 4 min; wafer/piece supported on sides during back side bake to prevent front side contamination;

FIG. 21D. Spin coat resist on front side of wafer and bake/harden; CSAR 62 diluted 1:1 in anisole, spin at 5000 rpm, bake 4 min;

FIG. 21E. Align Positive Mask 1 to front side of wafer and e-beam expose resist coating; 300 uC/cm$^2$ at 50 keV;

FIG. 21F. Develop positive resist on both sides of wafer, inspect, and bake resist; 20 sec n-amyl acetate, 15 sec MIBK:IPA 1:3, IPA rinse; followed by O2 plasma de-scum (30 s at 75 W, need to check other settings in Nano O2 plasma etcher); Resist thickness: 100 nm (CSAR 62); Pattern width: 4 μm;

FIG. 21G. Patterned isotropic wet etch of SiO2 layer with BOE; BOE 5:1, 3 min 30 sec; post etch inspection; resist/oxide thickness: >4,000 A; keep wafer wet when placed in BOE;

FIG. 21H. Ash Remove the remaining Resist (HC note: I think this will regrow a few nm of oxide and may inhibit the etch in the next step. I would remove the resist in Remover PG and acetone, followed by IPA rinse); Specifications: O2 Plasma clean/remove photo resist; 256 W; 0.3 Torr; O2 flow: 220 sccm; 15 min; Post clean inspection; Oxide thickness: >3,000 A; Dektak 3030 Profilometer FIG. 21I. Step-wise anisotropic wet etch silicon to specified depth. The depth of etch is like a critical design/fab parameter to establish the desired graphene/tip gap; Specifications: (all these need to be rescaled to work with 50 mL of water for ebeam); Mix surfactant/water mixture, 550 mg of Triton X-100 to 5.5 liters water; Mix KOH/soapy water mixture, 2000 grams KOH pellets to 5.5 liters water; Heat mantle of solution to 50 deg C.; Etch wafer for ~15 (TBD) min (~2,000 A/min), dump rinse, and SRD; Post etch inspect for >14,000 A depth; Repeat as necessary to achieve depth;

FIG. 21J. Profile the wafer to inspect features; measure silicon etch thickness: Dektak 303 profilometer; native to trench: >6,000 A (oxide & silicon etch depth); Native to tip: >0

FIG. 21K. Thermally oxidize wafer to form an insulating layer of SiO2, thickness of SiO2 layer is likely to be a critical parameter for establishing the desired graphene/tip gap. Specifications: Insert wafer in oven at 800 deg C. in N2 atmosphere for 30 min; 02 atmosphere at 1,100 deg C. for 332 (TBD) min; N2 atmosphere at 1,100 deg C. for 5 min N2 atmosphere at 900 deg for 45 min; Measure oxide thickness, Gaertner ellipsometer, 1,000-1,600 (TBD) A; 3,000 A takes 5 hrs 31 min 23 sec; Consumes 1,320 A of silicon, so growth is an increase of 1,680 A; 4,482 A on initial oxide; consumes 1,972.4 A of silicon so 2,510.2 A grow on top; Difference is 830 A;

FIG. 21L. Profile the wafer before metal deposition; Specifications: Dektak 303 profilometer; Native to trench: >4,400 A (oxide & silicon etch depth); Native to tip: >1,400 A (oxide to unetched oxidized silicon tip);

FIG. 21M. Spin coat positive e-beam resist on the front side of wafer; Specifications: CSAR 62 diluted 1:1 in anisole, potentially spun and baked multiple times to get required thickness;

FIG. 21N. Align positive mask 2 pattern to front side of wafer and alignment fiducials marks established by positive mask 1, expose resist; Specifications: 300 μC/cm2, 50 keV;

FIG. 21O. Develop Positive Resist and remove undeveloped material; Specifications: 20 s n-amyl acetone, 15 sec MIBK:IPA 1:1, IPA rinse;

FIG. 21P. Vapor deposit chrome/gold. The thickness of metal may be a critical parameter in establishing the desired graphene/tip gap; Pump down chamber two hours (Churchill lab): 1×10−6 torr 50 A Cr, 500 A Au;

FIG. 21Q. Remove e-beam resist; Soak in 50:50 Remover PG: acetone two hours, ultrasonic bath with acetone, IPA rinse;

FIG. 21R. Final inspection of fabricated wafer; Specifications: Measure profile w/ oxidized silicon pyramid tip: Dektak 3030 profilometer; Native to metal on trench: >3,900 A (oxide & silicon etch depth); Native to metal on tip: >900 A (oxide to unetched oxidized silicon tip).

Figure 22A:
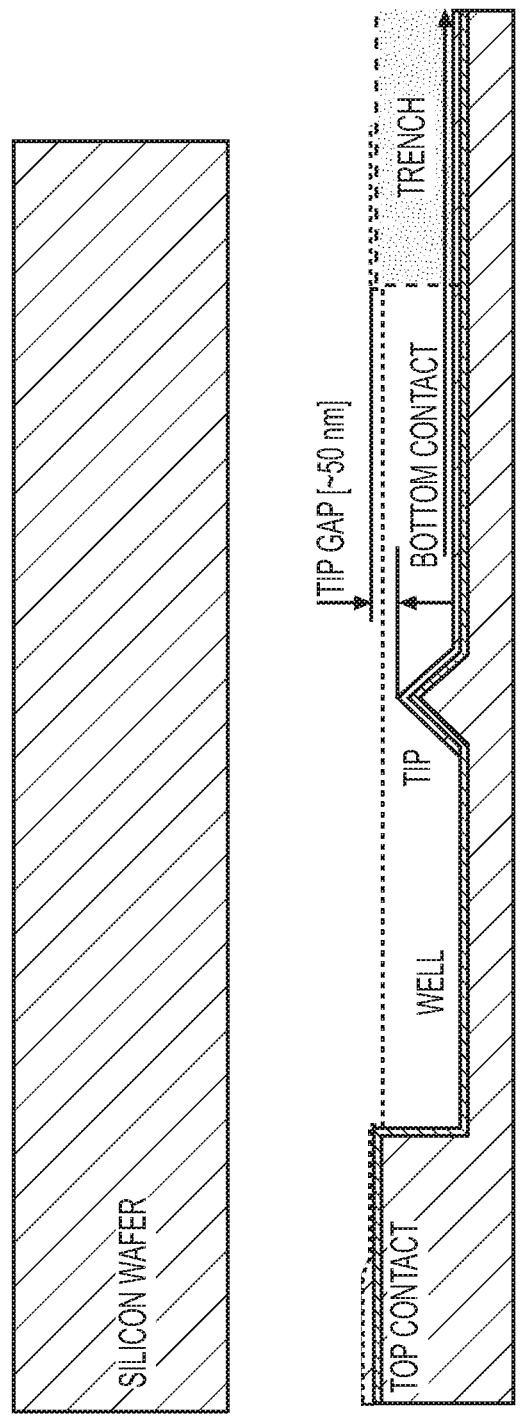
FIGS. 22A-22R are iterative illustrations of steps for forming an energy harvesting circuit according to this disclosure using photolithography.
Figure 22B:
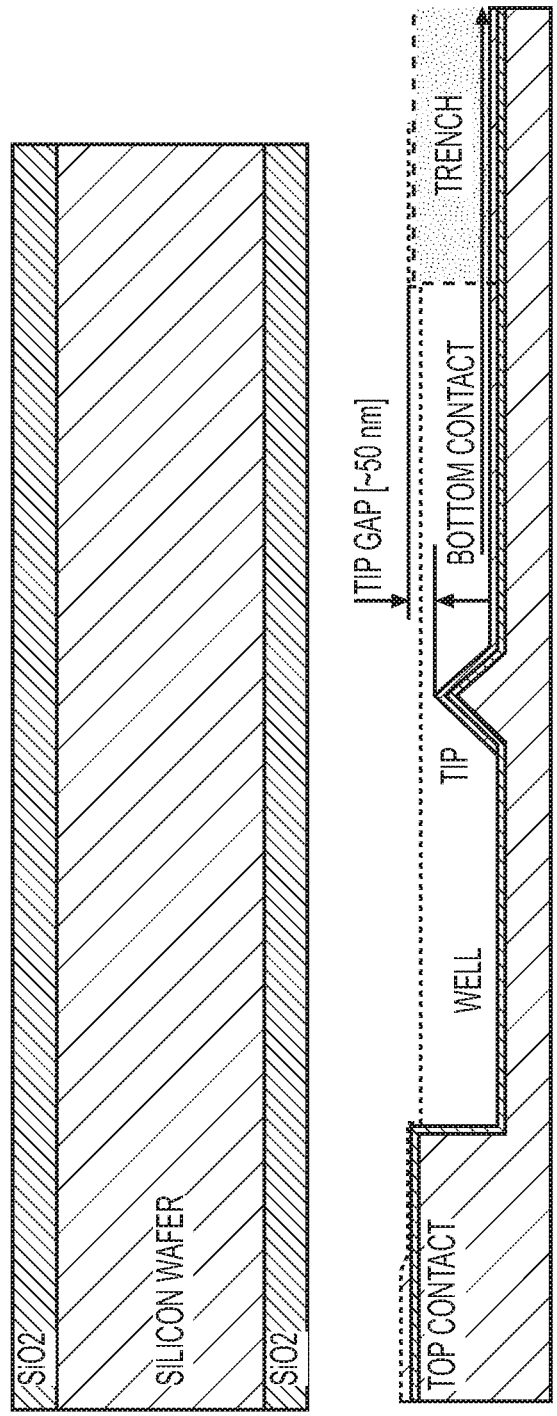
Figure 22C:
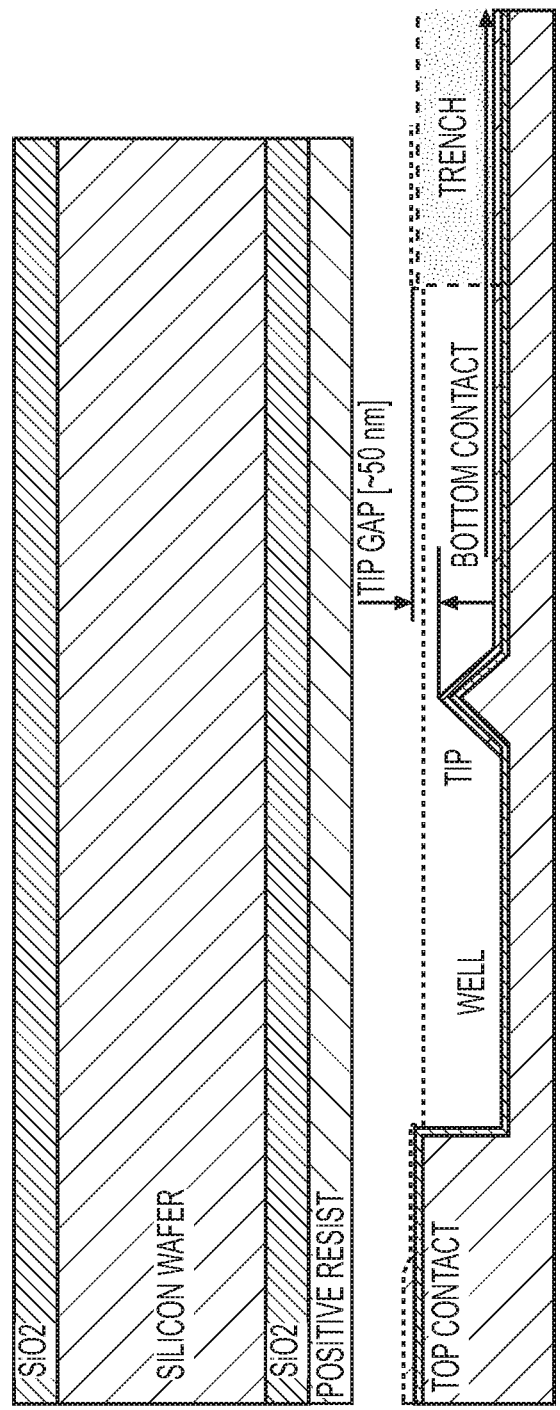
Figure 22D:
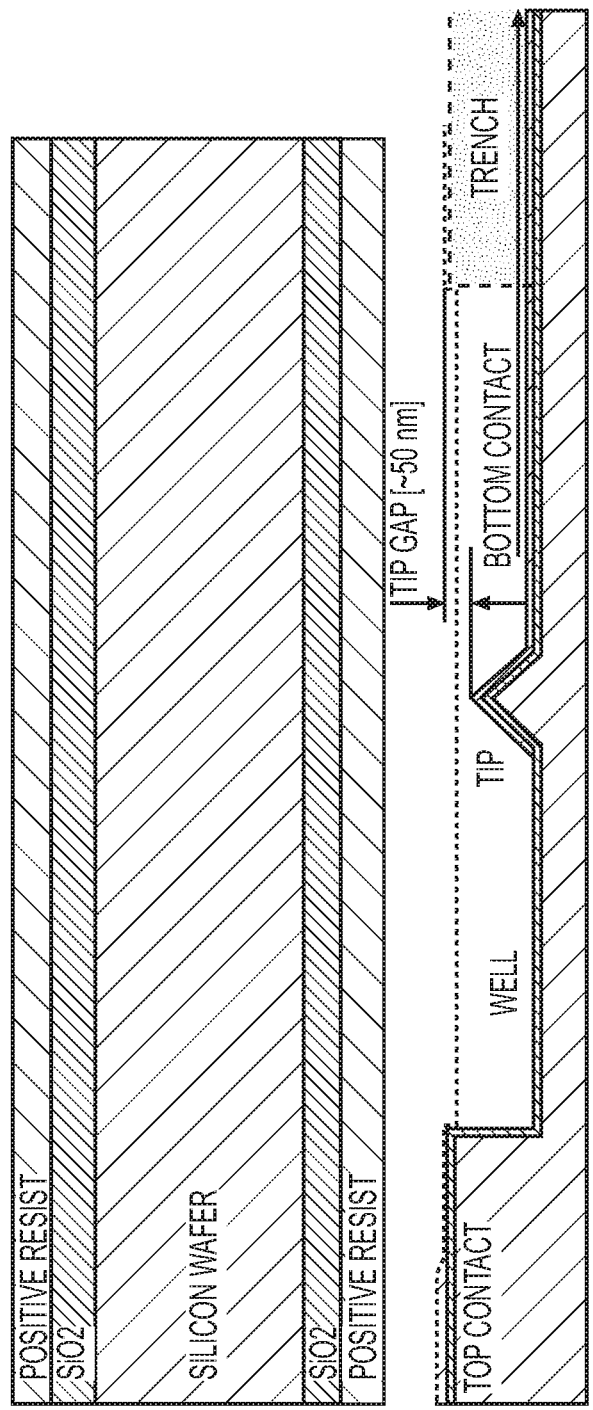
Figure 22E:
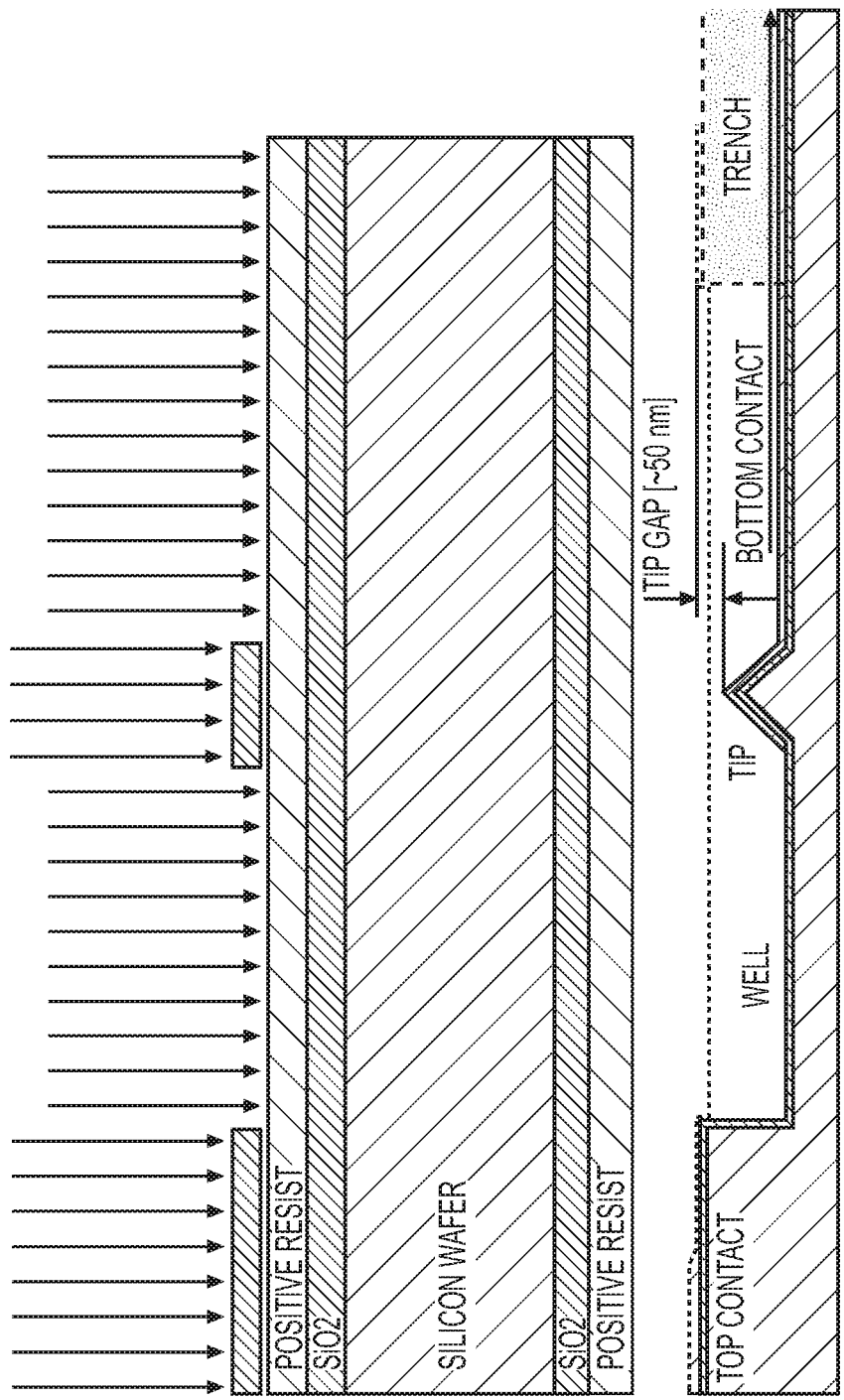
Figure 22F:
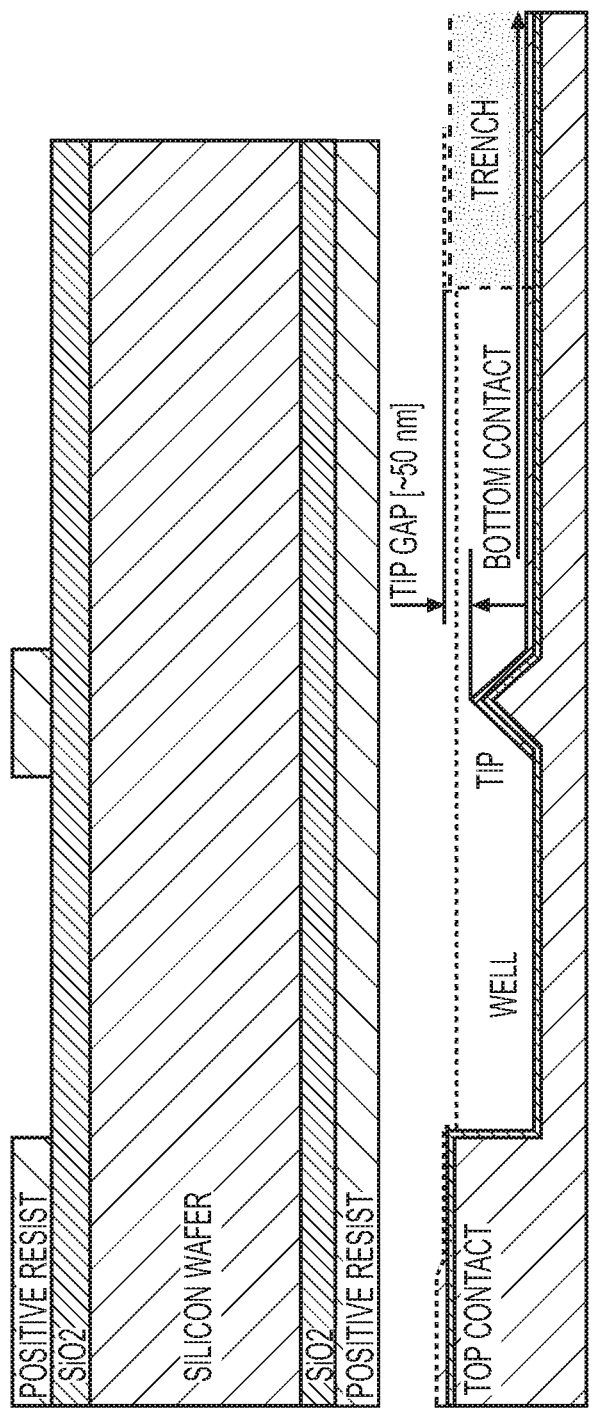
Figure 22G:
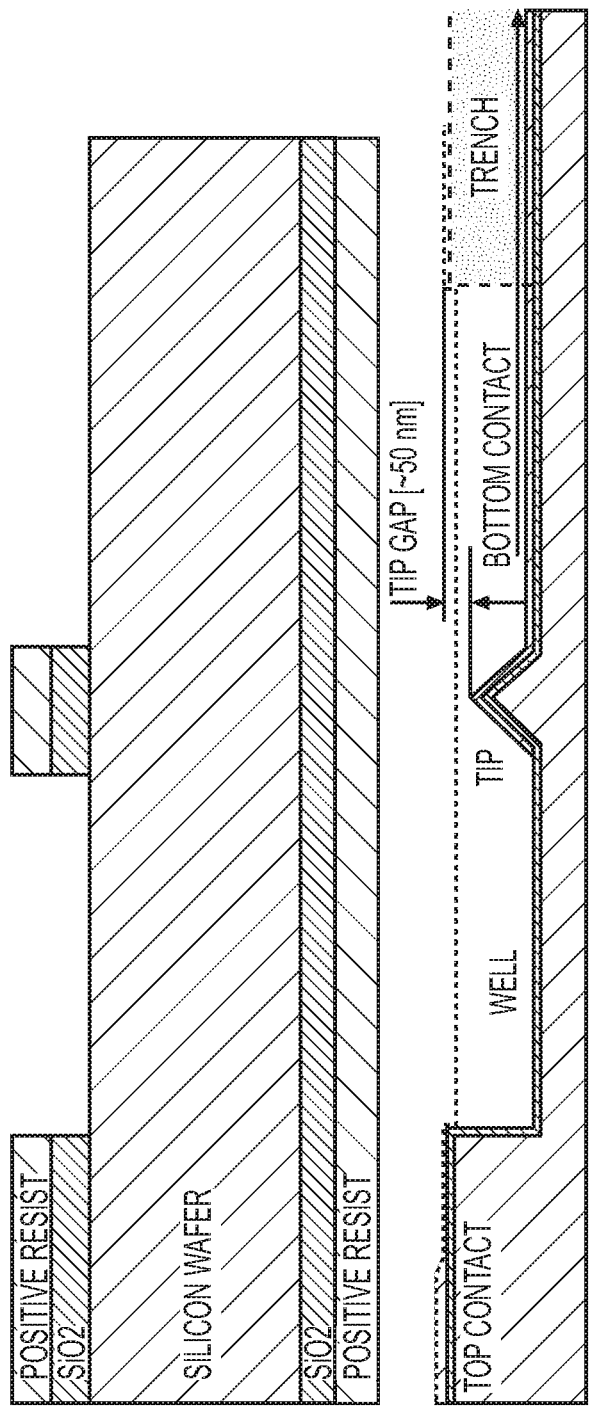
Figure 22H:
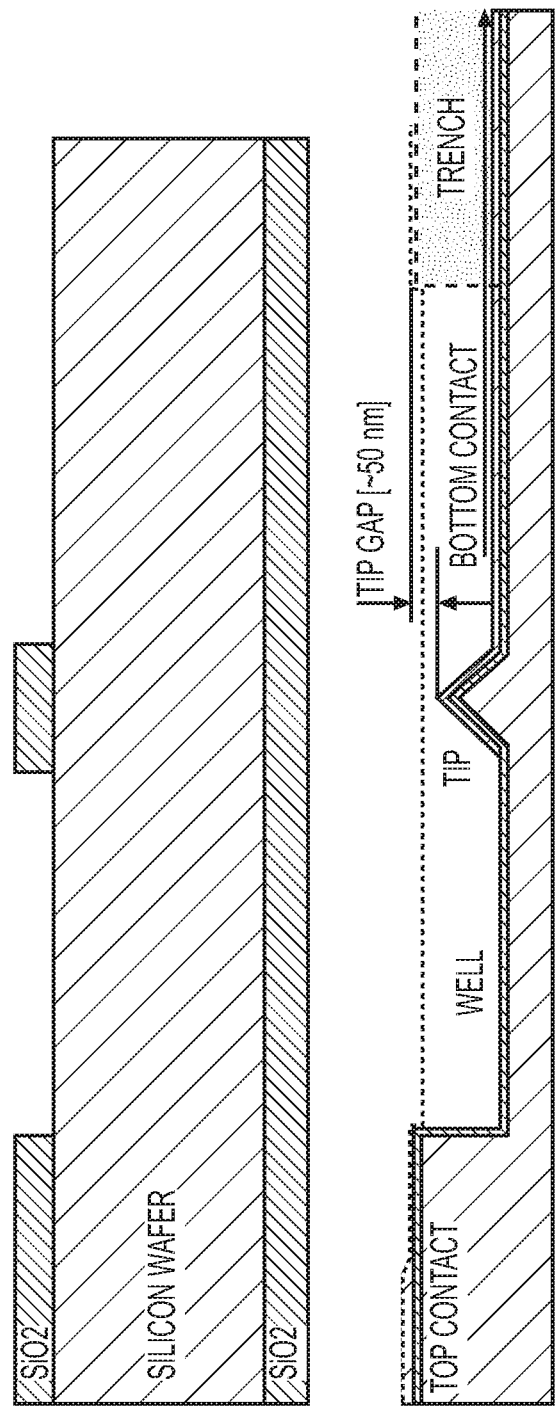
Figure 22I:
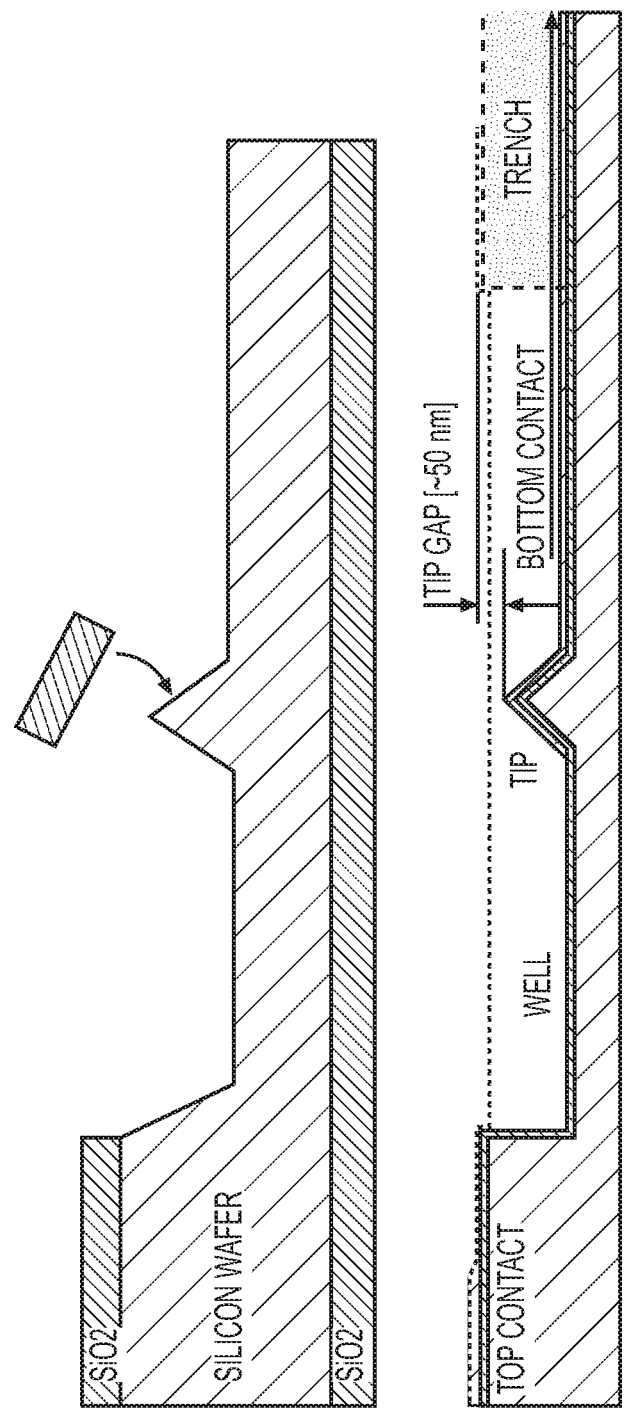
Figure 22J:
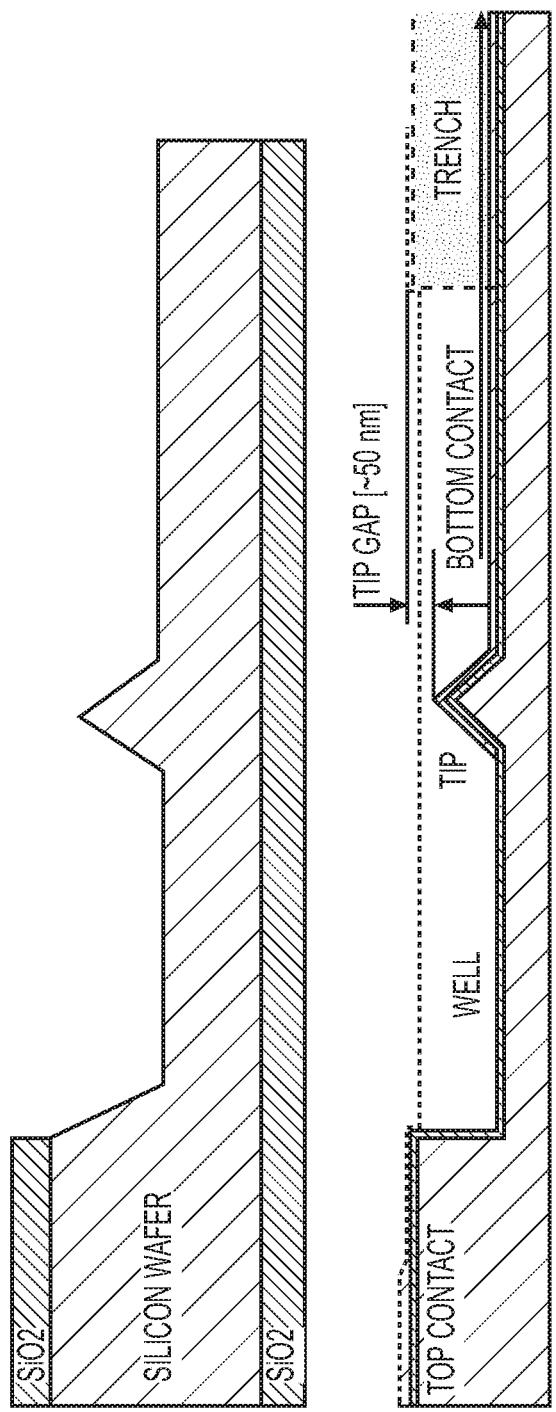
Figure 22K:
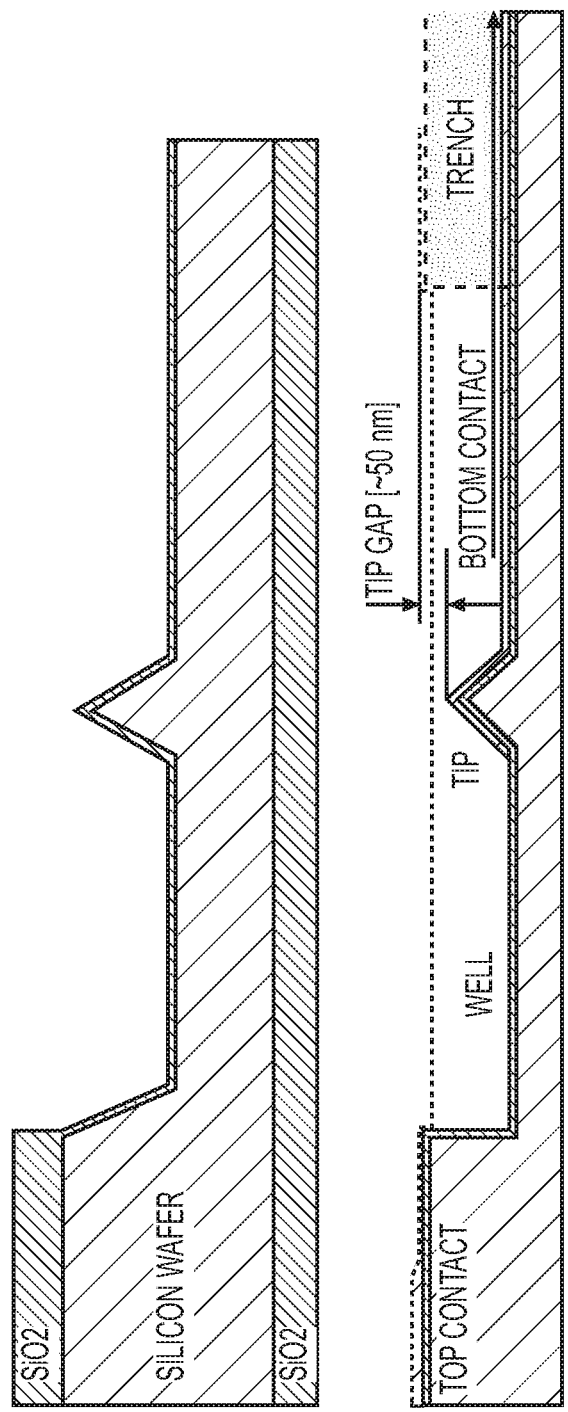
Figure 22L:
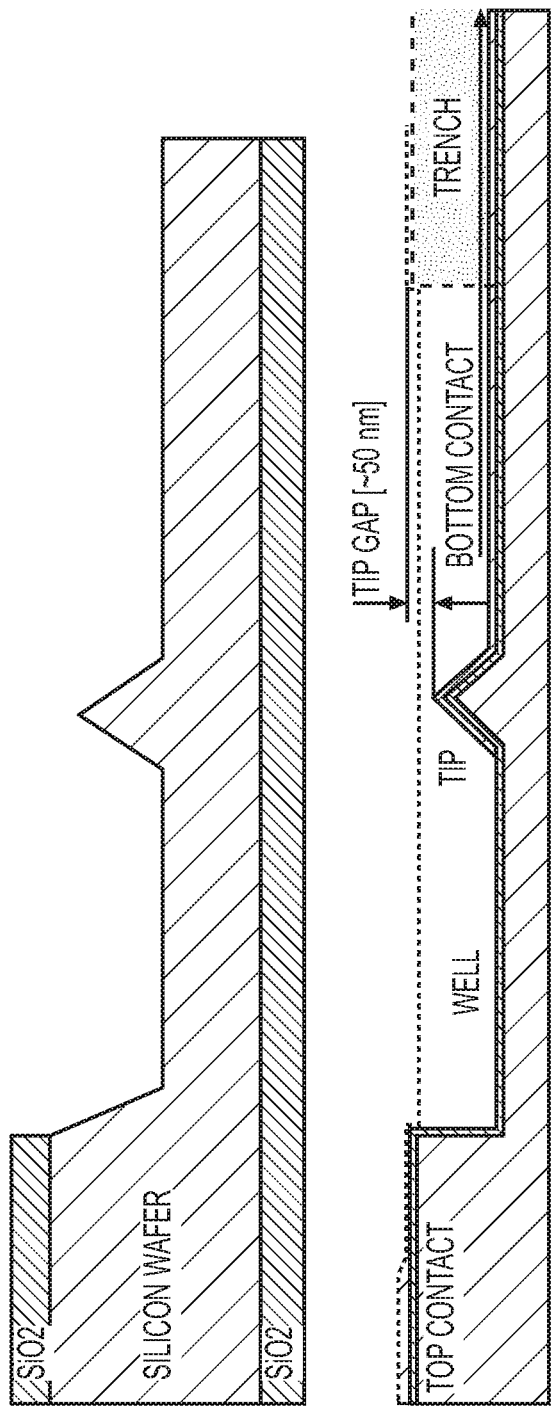
Figure 22M:
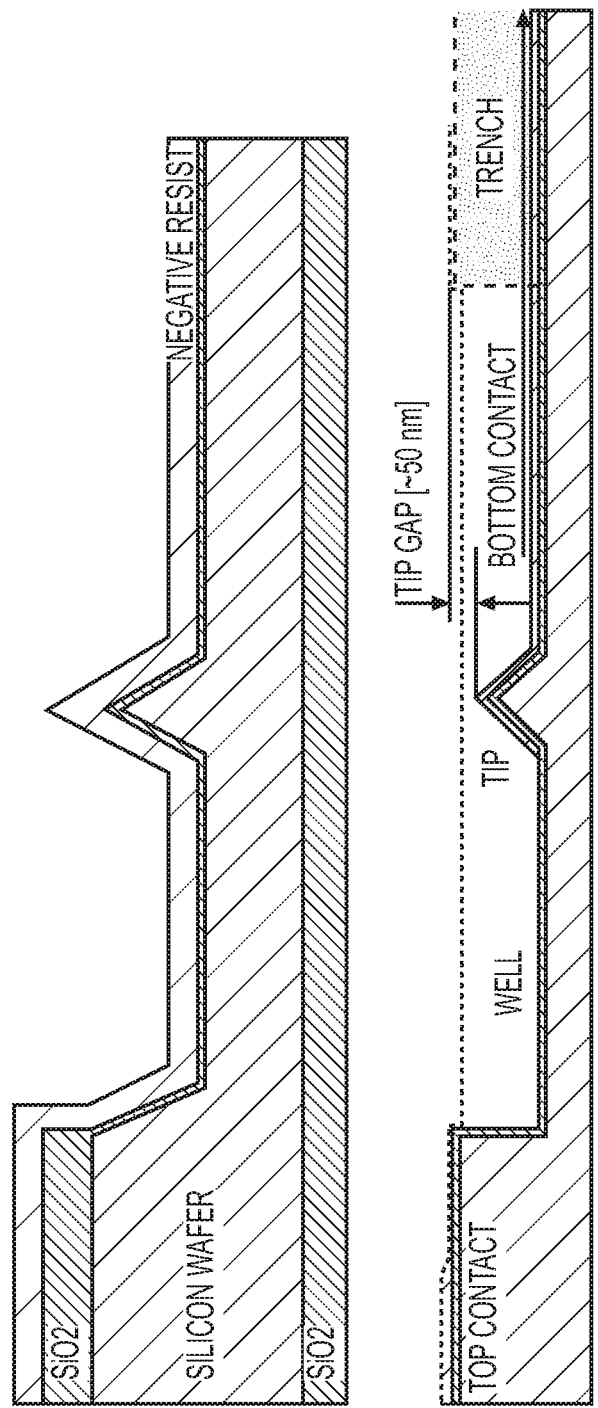
Figure 22N:
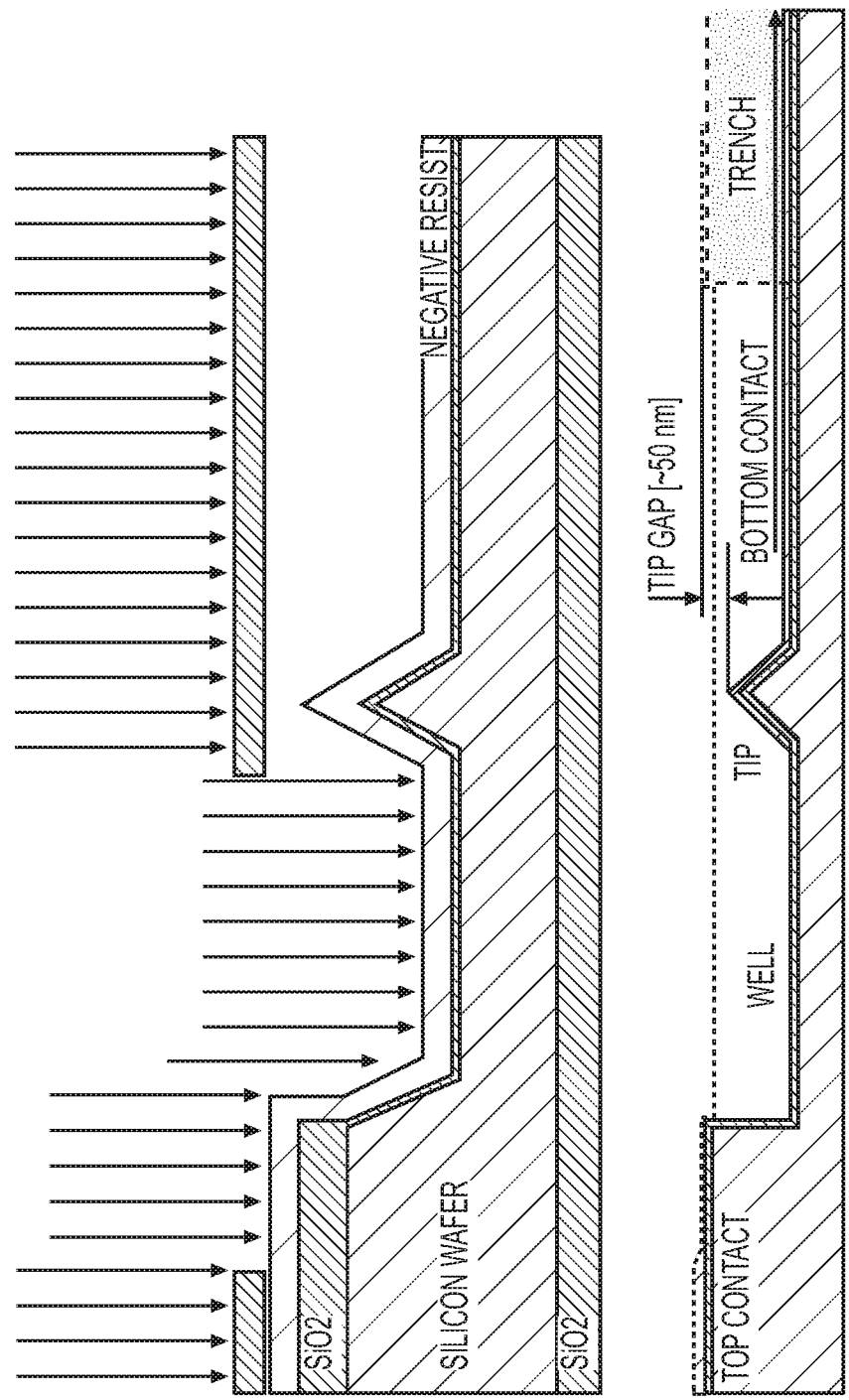
Figure 22O:
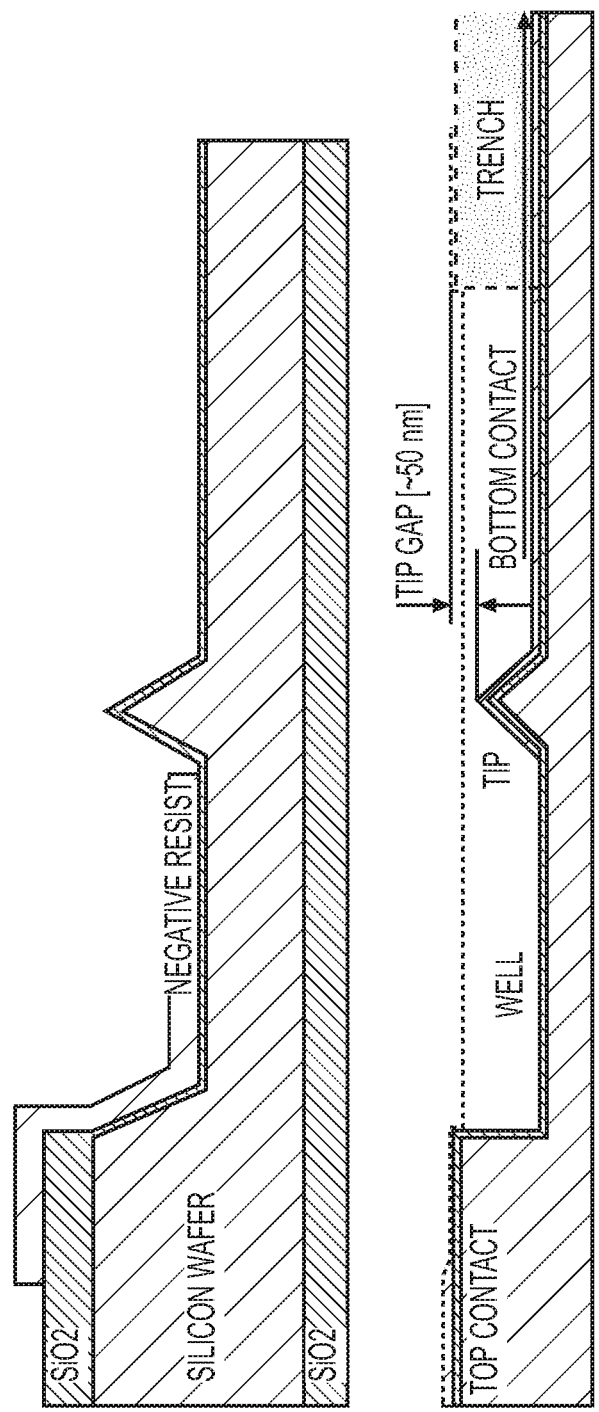
Figure 22P:
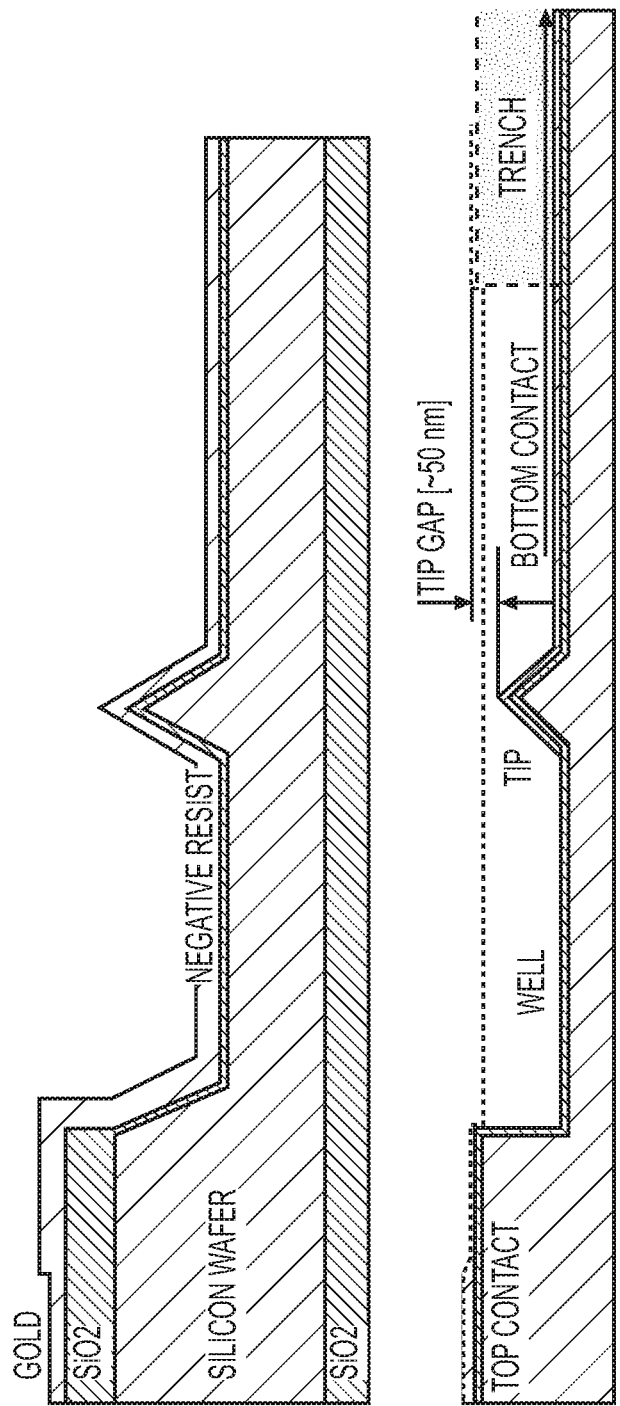
Figure 22Q:
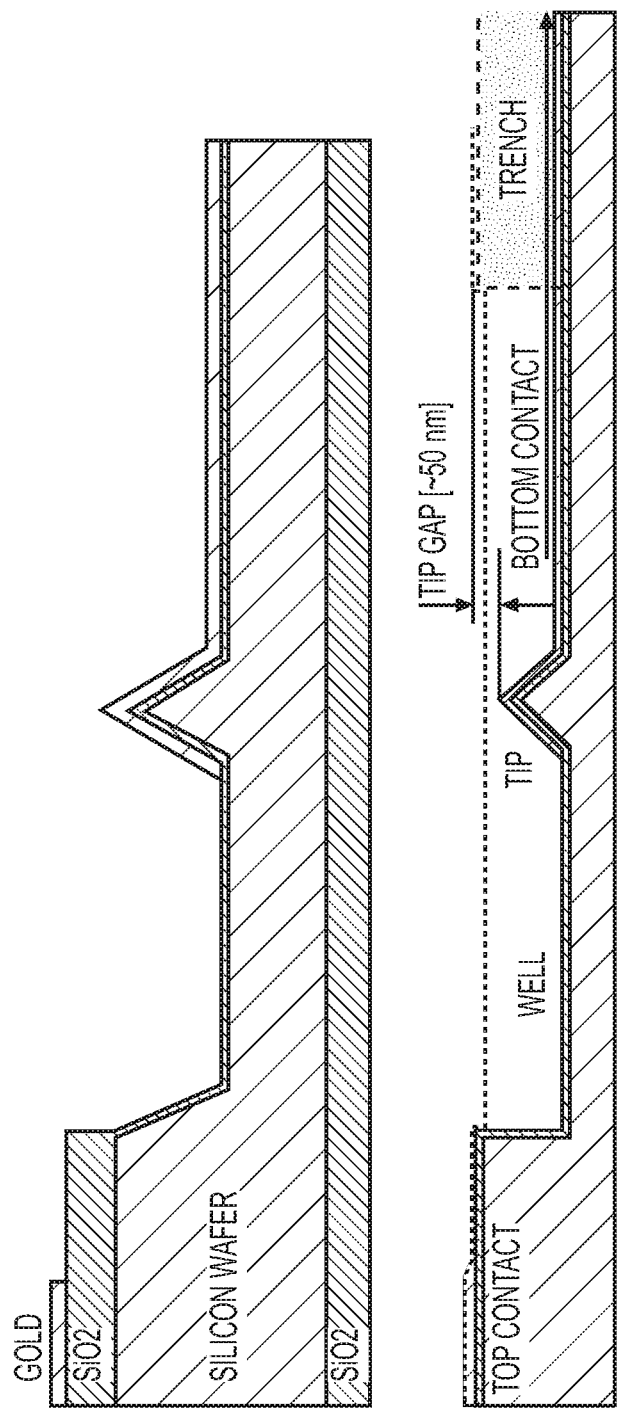
Figure 22R:
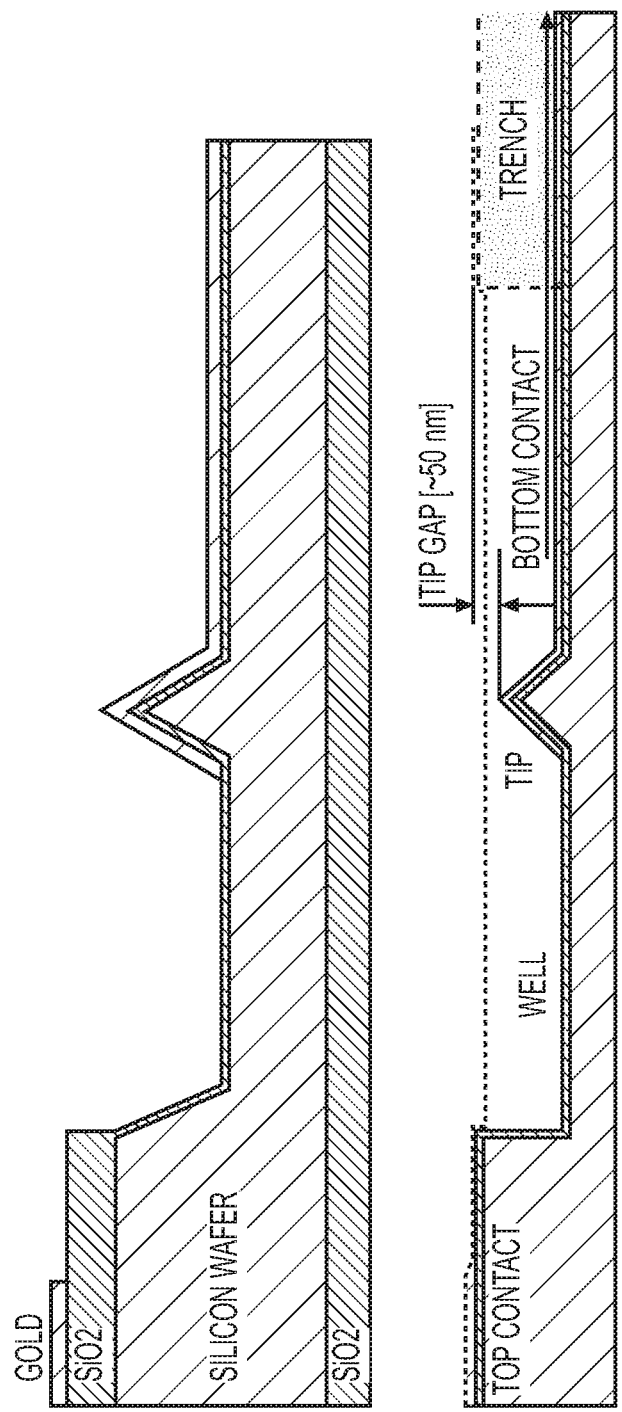

FIGS. 22A-22R illustrate example procedures, that are not limiting of the disclosure, for forming a device according to this disclosure with photolithography fabrication steps as follows:

FIG. 22A. Begin fabrication process with a 4" <100> silicon wafer 500 microns thick;

FIG. 22B. Oxidize the wafer to establish a specified SiO2 layer thickness (e.g., 300 nm);

FIG. 22C. Spin coat resist back side of wafer and soft bake; AZ-MiR 703, 1.08 micron thickness, 5,000 rpms; Soft bake, EMS hot plate, 90 deg C., 60 sec;

FIG. 22D. Spin coat resist on front side of wafer and bake/harden; AZ-MiR 703, 1.08 microns, 5,000 rpms; Process details from Manual 2; Bake, Blue M oven, 90 deg C., 10 min.;

FIG. 22E. Align Positive Mask 1 to front side of wafer and expose photo resist coating; Specifications: Exposure time: 65.0 sec (130 mJ/cm2 @ 2 mW/cm2), i-line exp; Post exposure bake at 110 deg C. for 10 min.;

FIG. 22F. Develop positive resist on both sides of wafer, inspect, and bake resist; AZ300MIF 3:1, 60 sec; Perform pre-etch inspection; Resist thickness >2,000 Angstroms; Trench pattern width, 2 microns; Post develop bake, 120 deg C. for 20 min.;

FIG. 22G. Patterned isotropic wet etch of SiO2 layer with BOE; BOE 5:1, 3 min 30 sec; post etch inspection; resist/oxide thickness: >5,000 A; keep wafer wet when placed in BOE;

FIG. 22H. Ash Remove the remaining PhotoResist; Specifications: O2 Plasma clean/remove photo resist; 256 W; 0.3 Torr; O2 flow: 220 sccm; 15 min; Post clean inspection; Oxide thickness: >3,000 A; Dektak 3030 Profilometer FIG. 22I. Step-wise anisotropic wet etch silicon to specified depth. The depth of etch is like a critical design/fab parameter to establish the desired graphene/tip gap; Specifications: (all these need to be rescaled to work with 50 mL of water for ebeam); Mix surfactant/water mixture, 550 mg of Triton X-100 to 5.5 liters water; Mix KOH/soapy water mixture, 2000 grams KOH pellets to 5.5 liters water; Heat mantle of solution to 50 deg C.; Etch wafer for ~15 (TBD) min (~2,000 A/min), dump rinse, and SRD; Post etch inspect for >14,000 (TBD) A depth; Repeat as necessary to achieve depth FIG. 22J. Profile the wafer to inspect features; measure silicon etch thickness: Dektak 303 profilometer; native to trench: >6,000 A (oxide & silicon etch depth); Native to tip: >0;

FIG. 22K. Thermally oxidize wafer to form an insulating layer of SiO2, thickness of SiO2 layer is likely to be a critical parameter for establishing the desired graphene/tip gap. Specifications: Insert wafer in oven at 800 deg C. in N2 atmosphere for 30 min; 02 atmosphere at 1,100 deg C. for 332 (TBD) min; N2 atmosphere at 1,100 deg C. for 5 min; N2 atmosphere at 900 deg for 45 min; Measure oxide thickness, Gaertner ellipsometer, 1,000-1,600 (TBD) A; 3,000 A takes 5 hrs 31 min 23 sec; Consumes 1,320 A of silicon, so growth is an increase of 1,680 A; 4,482 A on initial oxide; consumes 1,972.4 A of silicon so 2,510.2 grow on top; Difference is 830 A;

FIG. 22L. Profile the wafer before metal deposition; Specifications: Dektak 303 profilometer; Native to trench: >4,400 (TBD) A (oxide & silicon etch depth); Native to tip: >1,400 (TBD) A (oxide to unetched oxidized silicon tip);

FIG. 22M. Spin coat positive negative photo resist on the front side of wafer; Specifications: Dehydrate bake wafer, 30 min at 160 deg C.; HMDS prime bake, 15 min; Spin coat, Futurexx NR9-3000PY at 3000 rpm; Process details in Manual 3; Soft bake 1 min at 150 deg C., 143.4 Eaton Coater FIG. 22N. Align negative mask 2 pattern to front side of wafer and alignment fiducials marks established by negative mask 1, expose photoresist; Specifications: Align negative mask 2 to wafer; Expose: SUSS MA150; P-4: 300 mJ/cm2; 38.0 sec (7.9 W/cm2); Post-exposure bake on EMS hot plate; 100 deg C. for 1 min; 98.3 deg C.;

FIG. 22O. Develop Negative Resist and remove undeveloped material; Specifications: Positive develop 16 sec; Post bake at 120 deg C. for 20 min; Prepare surfactant dip, 1 drop of Triton X-100 in 4.5 L DI water; 100:1 BOE dip, 30 sec to remove oxide in contact windows;

FIG. 22P. Vapor deposit gold. The thickness of metal may be a critical parameter in establishing the desired graphene/tip gap; Pumpdown chamber overnight: 1×10−6 torr; 500 A layer;

FIG. 22Q. Remove photo resist; Ultrasonic both with acetone

FIG. 22R. Final inspection of fabricated wafer; Specifications: Measure profile w/ oxidized silicon pyramid tip: Dektak 3030 profilometer; Native to metal on trench: >3,900 A (oxide & silicon etch depth); Native to metal on tip: >900 A (oxide to unetched oxidized silicon tip).

Figure 23:
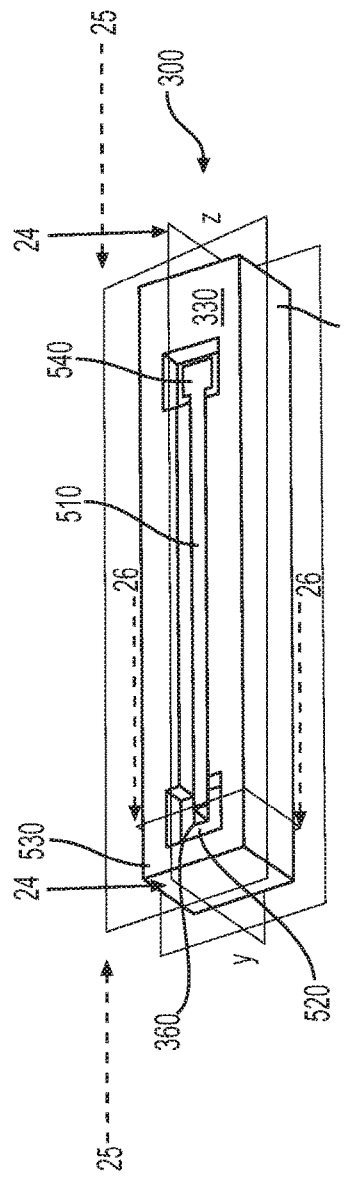
FIG. 23 is a top perspective view of an energy transducer formed in a substrate according to this disclosure.
Figure 24:
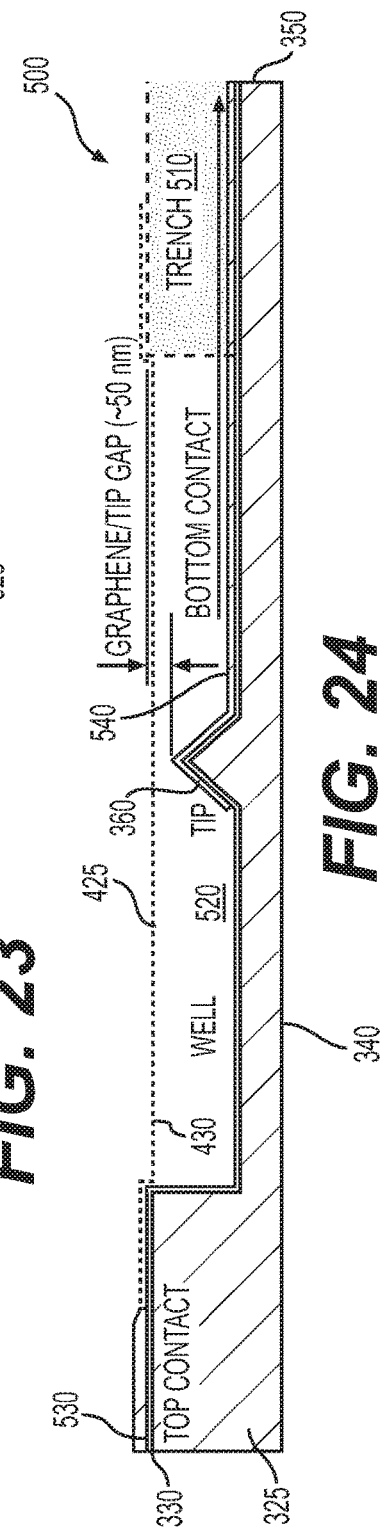
FIG. 24 is a side view of a cross section of the transducer of FIG. 23.
Figure 25:
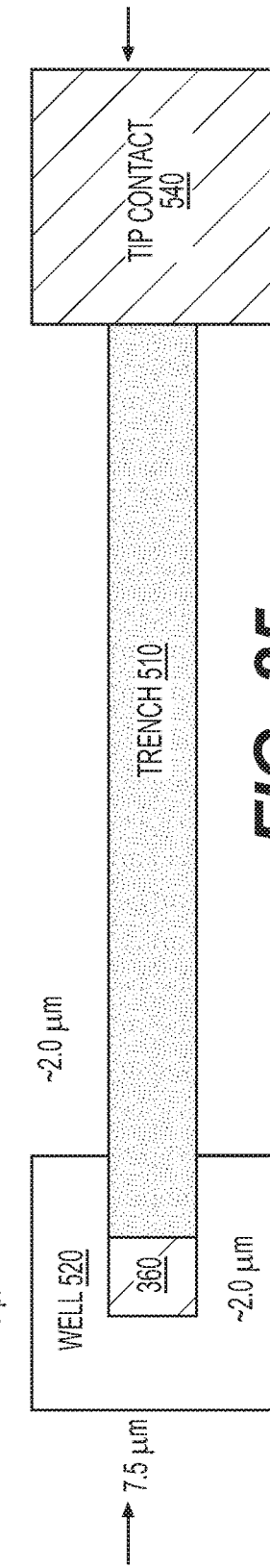
FIG. 25 is a top view of a left side section of the transducer of FIG. 24.
Figure 26:
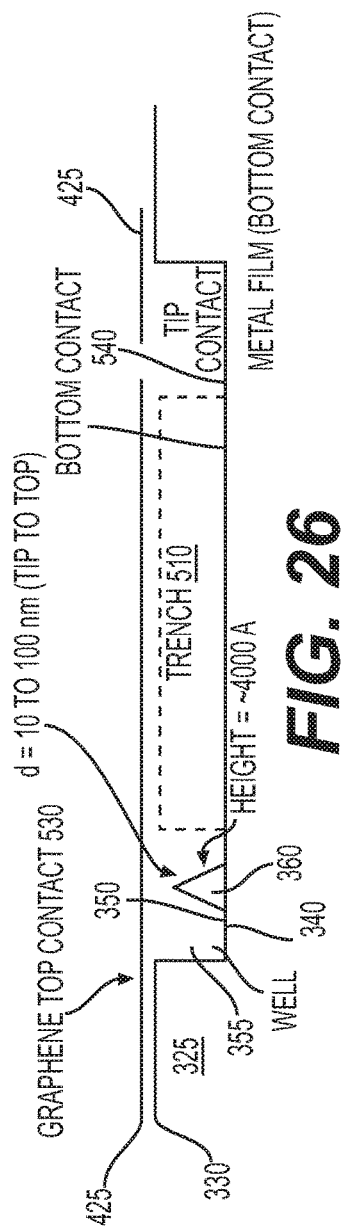
FIG. 26 is a side view of the cross section of the transducer of FIG. 23.
Figure 27:
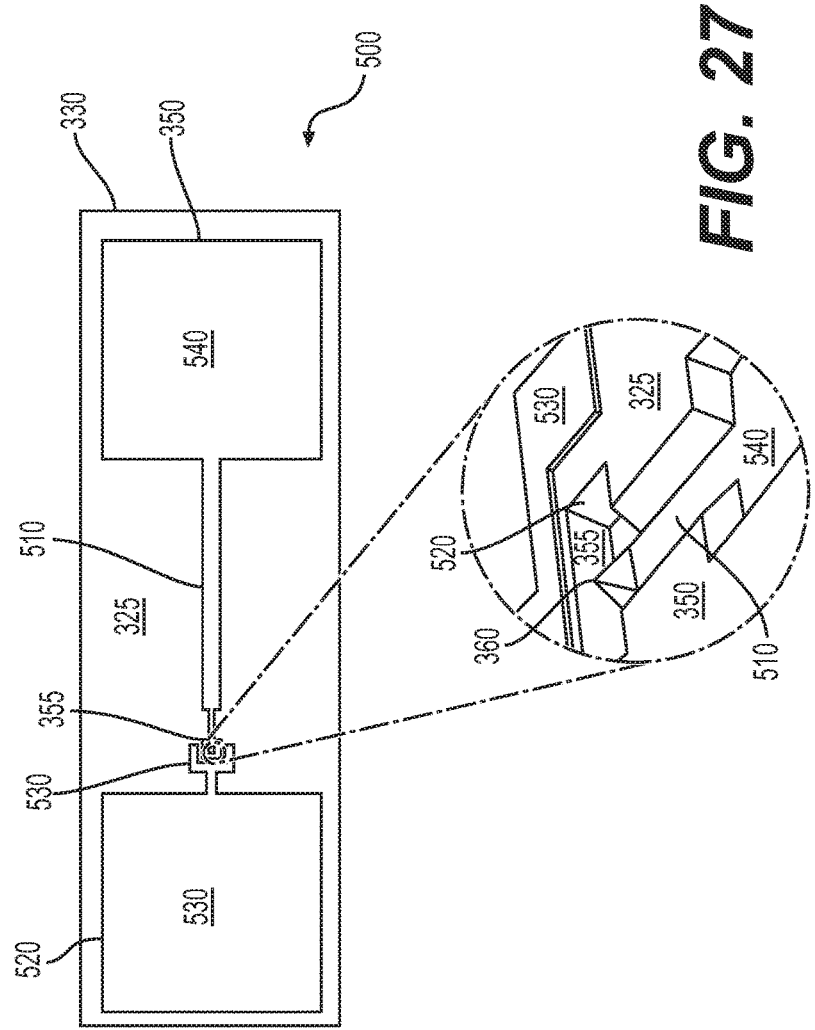
FIG. 27 is a top perspective view of the energy transducer of FIG. 23 with a detailed inset figure showing a closer view of a tip and well region according to this disclosure.

Beginning with FIG. 23, certain transducer assemblies are shown, particularly assemblies in which significant components are fabricated within a substrate in a way that eliminates the above described used of a scanning tunneling microscope (STM). In one non-limiting embodiment, the concepts of this disclosure may be incorporated into a transducer, as it converts physical movement (i.e., the vibration of a membrane) into an electrical signal. Also, fundamentally speaking, it is the extreme flexibility of ultra-thin two-dimensional materials for membranes that allows them to move large distances when experiencing an external force. The larger the movement is, the larger the induced electrical signal will be. Identified 2-D materials are 10,000 times more flexible than current silicon nitride state-of-the-art technology.

Considering this disclosure in terms of a transducer, one embodiment incorporates a system for harvesting energy and includes a substrate having an initial thickness between a first face of the substrate and an opposite face of the substrate. A second face of the substrate bounds an open well region extending from the first face of the substrate toward the second face of the substrate. A free-standing membrane may be positioned over the well region and supported by the first face of the substrate, wherein the free-standing membrane is free to vibrate in response to ambient energy. Vibration of the membrane defines cyclical ripple formations along a first surface of the membrane, wherein each ripple formation alternates between a peak and a trough over the well region. Instead of the above identified use of a scanning tunneling microscope (STM), the energy transducer of this embodiment utilizes a tip structure formed as part of or attached to the substrate and extending from the second face of the substrate. Given that one kind of transducer device described herein converts mechanical energy of vibration to electrical energy via current flow, the transducer incorporates a first contact connected to the first face of the substrate and a second contact connected to the tip structure for carrier extraction and/or injection, depending on the polarity. In one non-limiting embodiment, a voltage source may be connected to the second contact to induce a capacitive region of charges between the tip and the membrane. As described above, a distance between the tip and the membrane varies with respective peaks and troughs due to the cyclical vibration of the membrane material being acted upon by ambient forces or ambient energy (heat, air flow, compressive forces, expansive forces, etc.). The capacitive region between the tip and the membrane stores and emits the charges in cycles according to the distance between the tip and the membrane. In one embodiment, the voltage source may also be a charge receptor and storage device, like a battery. A storage capacitor, therefore, may be connected to the membrane and receive the emitted charges from the capacitive region when the distance between the tip and the membrane is increasing during ripple peak periods. In an alternate cycle of energy flow, the voltage source delivers charges to the capacitive region when the distance between the tip and the membrane is decreasing during ripple trough periods. A computer system may be in electronic communication with at least one of the first contact and the second contact and as in most computerized systems, a computer used with this energy transducer may have at least one processor and a memory, wherein the memory stores instructions which, when executed by the at least one processor, controls charge storage and charge transmission from the membrane.

A substrate in which a transducer is formed for this disclosure may incorporate a plurality of individual transducer assemblies on a single substrate. To accommodate multiple transducer assemblies, a substrate may include a pattern of trenches across the first face of the substrate, wherein each trench isolates either a tip or a first contact, or both, from adjacent portions of the substrate. One assembly in the substrate, therefore, connects an electrical circuit having, in part, the voltage source, the storage capacitor, a tip, and the membrane directing energy to a common ground. Prior to grounding, the circuit includes a first diode connected to either or both the membrane or tip, the common ground in parallel with the fixed energy receiver, e.g., the storage capacitor, and a second diode connected to the membrane or tip in series with the storage capacitor. The storage capacitor, therefore is one optional conduit to and may be connected to the common ground. A transducer according to this disclosure, may benefit from economies of scale by using an array of respective first diodes and second diodes connecting respective regions of the membrane or tip to the voltage source, the fixed storage capacitor, and the common ground. As many components as possible, particularly the diodes, may be formed within the substrate via doping techniques for numerous substrate materials. Otherwise, a system according to this disclosure may include a circuit that includes connected components, selected from the voltage source, the fixed storage capacitor, tip and the membrane, with some or all of the components are connected to each other via a circuit board that is separate from the substrate.

Many examples discussed herein recite that the freestanding membrane is a freestanding graphene membrane, but that example does not limit the kinds of materials that may be used to implement an energy transducer for this application. For non-limiting examples describing the use of a graphene membrane, the freestanding membrane is one of a bi-layer of graphene, a tri-layer of graphene, and a multi-layer of graphene. Other materials that may be used in accordance with the disclosure of the vibrating membrane, in addition to graphene, include molybdenum disulfide (MoS2), molybdenum selenide (MoSe2), tungsten disulfide (WS2), tungsten diselenide (WSe2), rhenium disulfide (ReS2), rhenium diselenide (ReSe2), boron nitride (BN), and other combinations of a transition metal and another element ("MX2"), or a combination thereof.

The storage capacitor is a reservoir for the electrical potential generated by the mechanical movement of the freestanding membrane which is in a capacitive relationship with the tip due to electrical charges on the tip and/or the membrane. In one embodiment, that is not limiting of the disclosure, the capacitive region has shown a capacitance cycle from a minimum capacitance of about 0.001 femto-farad to a maximum capacitance of about 1000 femto-farad. The minimum capacitance corresponds to time periods in which the distance between the tip and the membrane is maximized during ripple peak periods. The maximum capacitance corresponds to time periods in which the distance between the tip and the membrane is minimized during ripple trough periods. The capacitive region is subject to current tunneling when the distance between the tip and the membrane is minimized during ripple trough periods, thereby providing current to the storage capacitor. In one test embodiment, an ammeter connected via a switch to operate in parallel to the storage capacitor, wherein the ammeter measures charge in the storage capacitor for tracking by a user.

The membrane is described as a free-standing membrane in that the section of the membrane proximate the tip of the circuit (within the substrate usually) is unfettered and allowed to vibrate or undulate in a ripple effect across at least a portion of the membrane. In this regard, the membrane may be considered to have first surface proximate to or even directly facing the substrate tip formation and a second face opposite the first surface, with the surfaces connected at points away from a window region that is vibrating proximate the tip. The mechanical energy of the system vibrates the membrane and may be ambient energy in the form of thermal energy or kinetic energy from atoms in the freestanding membrane. In certain non-limiting embodiments, the membrane has an average thickness of from 0.3 nm to 3.0 nm, from 0.3 nm to 2.0 nm, from 0.3 nm to 1.0 nm, or from 0.3 nm to 0.6 nm.

The system for converting vibrational energy to a current output, as disclosed herein may utilize a transducer assembly 300 formed within or connected to a substrate 325 having an initial thickness between a first face 330 of the substrate and an opposite face 340 of the substrate. A second face 350 of the substrate bounds an open well region 355 extending from the first face 330 of the substrate toward the second face 350 of the substrate 325. A free-standing membrane 425 connected to the first face 330 of the substrate 325 includes a first surface 430 that is unobstructed and free to vibrate in response to ambient energy, wherein vibration of the membrane defines cyclical ripple formations 271 along the first surface 430 and wherein each ripple formation alternates between a peak 286 and a trough 289 in a respective window region 464 of a plurality of window regions of the membrane 425. A tip 360 is either formed within the substrate 325 or at least positioned on the second face 350 of the substrate proximate the membrane 425. A voltage source 200 is in electrical communication with the tip or membrane but the embodiments herein recognize a magnification of voltage potential initially applied by the voltage source because excess charge allowed to conduct via the transducer assembly 300 may be stored in the storage capacitor 275 as a result of the mechanical-electrical energy transduction. The voltage source, therefore, may be described in one non-limiting embodiment as setting a setpoint current between the tip 360 and the membrane 425 to define a respective capacitive region of charges between the tip and the membrane. Additional conduction to and from the tip 360 and the membrane 425 multiply the current conduction in the system as described above. A distance between the tip and the membrane varies with respective peaks and troughs, and the capacitive region stores and emits the charges in cycles in response to the distance between the tip and the membrane. A fixed storage capacitor 275 is connected to the membrane or tip and receives emitted charges and additional tunneling charges from the capacitive region when the distance between the tip and the membrane is maximized during ripple peak periods in the respective window region. Similar to other embodiments described above, the quantity of additional tunneling charges is proportional to the setpoint current of the tip. The setpoint current of the tip is a fixed current, and the range of the distance between the tip and the membrane is controlled between a minimum distance and a maximum distance, wherein the maximum distance is configured to accommodate the additional tunneling charges crossing the capacitive region.

The tip 360, formed in the substrate serves as one comparable capacitive plate while the membrane 425 serves as the other capacitive plate of a capacitive interaction between the tip and the membrane. A system utilizing this interaction for converting vibrational energy to a current output may include a current harvesting circuit 500 in a substrate, wherein the current harvesting circuit comprises an array of tip contacts connected, by respective matching diodes 235, to a voltage source 200 and a fixed storage capacitor 275. A free-standing membrane extends over at least the tip contacts in the current harvesting circuit, such that the tip contacts are separated from the membrane and faces a first surface of the membrane to define a capacitive region between a common contact connecting the respective tip contacts and the first surface of the membrane. As noted in other embodiments, the first surface of the membrane is unobstructed and free to vibrate in response to ambient energy, wherein vibration of the membrane defines cyclical ripple formations along the first surface, and wherein each ripple formation alternates between a peak and a trough relative to the common contact. The respective capacitive regions between the tip contacts and the membrane accumulate charges between the tip contact and the membrane, wherein the tip contact switches a current output of accumulated charges across one of the respective diodes to direct the current output to either the voltage source or the fixed storage capacitor in response to the cyclical ripple formations in the membrane. In some versions of this technology, the harvesting circuit 500 is formed within the substrate by defining respective trench and well regions as shown in FIGS. 21-27 herein. In one non-limiting embodiment, the tip 360 is formed as a component of the substrate 325 within a respective trench 510 proximate a well section 520 also formed in the substrate. The harvesting circuit 500 incorporates a top contact 530 and a bottom contact 540 for charge extraction. In a different embodiment, the harvesting circuit 500 comprises the tip 360 in the substrate and other components on an adjacent circuit board (not shown).

Of course, this disclosure is not limited to any one apparatus or transducer to take advantage of a method of assembling an energy harvesting circuit. For example, the disclosure shows forming a capacitive region in the energy harvesting circuit by defining a first capacitor plate having an initial separation distance with respect to a first surface of a free-standing membrane, wherein the first surface of the free-standing membrane defines a second capacitor plate. By connecting the first capacitor plate (or possibly the second capacitor plate in an opposite polarity installation) to a voltage source, the method is configured to induce charge accumulation in the capacitive region between the tip in the substrate and the first surface of the membrane. The method continues by positioning the membrane relative to the first capacitor plate such that the membrane is unobstructed and free to vibrate in response to ambient energy, wherein vibration of the membrane defines cyclical ripple formations along the first surface, and wherein each ripple formation alternates between a peak and a trough relative to the first capacitor plate to change the initial separation distance. Discharging the capacitive region across a respective diode directs accumulated charges to either the voltage source or a load, wherein discharging the capacitive region comprises directing the charges to the voltage source during a trough and directing the charges to the load during a peak. In one embodiment, the load is a charge storing capacitor referred to above as a fixed storage capacitor. The fixed storage capacitor is different from the capacitive interaction between the vibrating membrane and the substrate tip (which is more akin to a variable capacitor).

Methods of Use

Also disclosed herein are methods of use of the energy harvesting devices and/or sensors described herein. For example, also disclosed herein are methods of harvesting energy using the energy harvesting devices described herein.

The energy harvesting devices described herein can, for example, be incorporated into a variety of systems, devices, and methods for extracting energy, including discharge sensors, force and mass sensors, and self-powered devices.

Systems, devices, and methods in accordance with certain example embodiments that incorporate one or more energy harvesting devices as described herein can utilize dynamics of atomic-scale fluctuations of a freestanding two-dimensional membrane. The membrane can incorporate random out-of-plane motion which exhibits anomalous dynamics and long-tail equilibrium distributions of dynamical variables symptomatic of Levy walks. The fluctuating membrane can be controlled, for example, using scanning tunneling microscopy (STM).

One non-limiting factor to note in regard to this technology regards descriptions herein utilizing the electrostatic/capacitive approach to vibration energy harvesting are just examples of many embodiments. If the membrane was magnetized, then it would utilize the electromagnetic approach to vibration energy harvesting. For this approach, no voltage source is needed but the "tip" would need to be a wire loop. Similarly, if the membrane was piezoelectric or magnetostrictive, then it would utilize the piezoelectric or magnetostrictive phenomenon to harvest energy when it vibrates. Again, no voltage source would be needed. The bending piezo would induce the voltage and generate a current directing. The bending magnetostrictive would need a wire loop. In these other cases, a diode bridge rectifier would be used to harvest the current.

When an electrically insulating membrane like boron nitride (BN) (versus an electrically conductive membrane, like graphene) is used, the BN would be first sprayed with electric charges which would then be stuck in place since it is insulating. With charges stuck to the membrane, the voltage source is no longer needed in the above described circuit. This is called internally polarized versus externally polarized, and these are terms commonly used to describe two type of microphones. Not requiring a voltage source is an important embodiment. Consider adding here MX2 (term of the field) general formula for a transition metal and another element.

It should be appreciated that any of the components or modules referred to with regards to energy harvesting devices, and associated systems and methods, of the disclosed technology, may be integrally or separately formed with one another. Further, redundant functions or structures of the components or modules may be implemented. Any of the herein described features and their components discussed herein may take on all shapes to provide and meet the environmental, structural demands, and operational requirements. Moreover, locations and alignments of the various components may vary as desired or required.

What has been described above includes examples of one or more embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the disclosure and claims here appended and to be filed in non-provisional patent applications.

Efforts have been made to ensure accuracy with respect to numbers (e.g., amounts, temperature, etc.) but some errors and deviations should be accounted for. Unless indicated otherwise, parts are parts by weight, temperature is in ° C. or is at ambient temperature, and pressure is at or near atmospheric. There are numerous variations and combinations of reaction conditions, e.g., component concentrations, temperatures, pressures and other reaction ranges and conditions that can be used to optimize the product purity and yield obtained from the described process. Only reasonable and routine experimentation will be required to optimize such process conditions.

Other advantages which are obvious and which are inherent to the invention will be evident to one skilled in the art. It will be understood that certain features and sub-combinations are of utility and may be employed without reference to other features and sub-combinations. This is contemplated by and is within the scope of the claims. Since many possible embodiments may be made of the invention without departing from the scope thereof, it is to be understood that all matter herein set forth or shown in the accompanying drawings is to be interpreted as illustrative and not in a limiting sense.

The methods of the appended claims are not limited in scope by the specific methods described herein, which are intended as illustrations of a few aspects of the claims and any methods that are functionally equivalent are intended to fall within the scope of the claims. Various modifications of the methods in addition to those shown and described herein are intended to fall within the scope of the appended claims. Further, while only certain representative method steps disclosed herein are specifically described, other combinations of the method steps also are intended to fall within the scope of the appended claims, even if not specifically recited. Thus, a combination of steps, elements, components, or constituents may be explicitly mentioned herein or less, however, other combinations of steps, elements, components, and constituents are included, even though not explicitly stated.

CORE REFERENCES CITED

[1] N. Mounet, M. Gibertini, P. Schwaller, D. Campi, A. Merkys, A. Marrazzo, T. Sohier, I. E. Castelli, A. Cepellotti, G. Pizzi, N. Marzari, Two-dimensional materials from high-throughput computational exfoliation of experimentally known compounds, Nature Nanotechnology, 13 (2018) 246-+.
[2] N. R. Greene, Energy Flow for a Variable-Gap Capacitor, The Physics Teacher, 43 (2005) 340.
[3] S. F. Philp, VACUUM-INSULATED, VARYING-CAPACITANCE MACHINE, Ieee Transactions on Electrical Insulation, 12 (1977) 130-136.
[4] R. O'Donnell, N. Schofield, A. C. Smith, J. Cullen, Design Concepts for High-Voltage Variable-Capacitance DC Generators, Ieee Transactions on Industry Applications, 45 (2009) 1778-1784.
[5] P. Xu, M. Neek-Amal, S. D. Barber, J. K. Schoelz, M. L. Ackerman, P. M. Thibado, A. Sadeghi, F. M. Peeters, Unusual ultra-low-frequency fluctuations in freestanding graphene, Nat. Comm, 5 (2014) 3720.
[6] M. Neek-Amal, P. Xu, J. K. Schoelz, M. L. Ackerman, S. D. Barber, P. M. Thibado, A. Sadeghi, F. M. Peeters, Thermal mirror buckling in freestanding graphene locally controlled by scanning tunneling microscopy, Nat. Comm, 5 (2014) 4962.
[7] M. L. Ackerman, P. Kumar, M. Neek-Amal, P. M. Thibado, F. M. Peeters, S. Singh, Anomalous Dynamical Behavior of Freestanding Graphene Membranes, Physical Review Letters, 117 (2016).
[8] M. Lopez-Suarez, R. Rurali, L. Gammaitoni, G. Abadal, Nanostructured graphene for energy harvesting, Physical Review B, 84 (2011) 161401(R).
[9] J. F. Xu, P. M. Thibado, Z. Ding, 4 K, ultrahigh vacuum scanning tunneling microscope having two orthogonal tips with tunnel junctions as close as a few nanometers, Rev. Sci. Instrum., 77 (2006) 093703.
[10] J. Tersoff, D. R. Hamann, THEORY OF THE SCANNING TUNNELING MICROSCOPE, Physical Review B, 31 (1985) 805-813.

EXAMPLE REFERENCES CITED

[E1] A. Einstein, Investigations on the theory of the Brownian movement, Annalen der Physik, 17 (1905) 549-560.
[E2] C. Lotze, M. Corso, K. J. Franke, F. von Oppen, J. I. Pascual, Driving a Macroscopic Oscillator with the Stochastic Motion of a Hydrogen Molecule, Science, 338 (2012) 779-782.
[E3] L. Gammaitoni, P. Hanggi, P. Jung, F. Marchesoni, Stochastic resonance, Rev. Mod. Phys., 70 (1998) 223-287.
[E4] I. A. Martinez, E. Roldan, L. Dinis, D. Petrov, J. M. R. Parrondo, R. A. Rica, Brownian Carnot engine, Nature Physics, 12 (2016) 67-70.
[E5] U. Seifert, Stochastic thermodynamics, fluctuation theorems and molecular machines, Reports on Progress in Physics, 75 (2012) 126001.
[E6] R. D. Astumian, Thermodynamics and kinetics of a Brownian motor, Science, 276 (1997) 917-922.
[E7] M. O. Magnasco, FORCED THERMAL RATCHETS, Physical Review Letters, 71 (1993) 1477-1481.
[E8] A. L. Cottrill, A. T. Liu, Y. Kunai, V. B. Koman, A. Kaplan, S. G. Mahajan, P. W. Liu, A. R. Toland, M. S. Strano, Ultra-high thermal effusivity materials for resonant ambient thermal energy harvesting, Nature Communications, 9 (2018) 664.
[E9] H. H. Hasegawa, C. B. Li, Y. Ohtaki, Thermodynamics of a system with long-time correlations, International Journal of Quantum Chemistry, 98 (2004) 138-144.
[E10]M. L. Ackerman, P. Kumar, M. Neek-Amal, P. M. Thibado, F. M. Peeters, S. Singh, Anomalous Dynamical Behavior of Freestanding Graphene Membranes, Physical Review Letters, 117 (2016) 126801.
[E11] J. C. Meyer, A. K. Geim, M. I. Katsnelson, K. S. Novoselov, T. J. Booth, S. Roth, The structure of suspended graphene sheets, Nature, 446 (2007) 60-63.
[E12] A. Fasolino, J. H. Los, M. I. Katsnelson, Intrinsic ripples in graphene, Nature Materials, 6 (2007) 858-861.
[E13] P. San-Jose, J. Gonzalez, F. Guinea, Electron-Induced Rippling in Graphene, Physical Review Letters, 106 (2011) 045502.
[E14] P. Xu, M. Neek-Amal, S. D. Barber, J. K. Schoelz, M. L. Ackerman, P. M. Thibado, A. Sadeghi, F. M. Peeters, Unusual ultra-low-frequency fluctuations in freestanding graphene, Nat. Comm, 5 (2014) 3720.
[E15] M. Ruiz-Garcia, L. L. Bonilla, A. Prados, Ripples in hexagonal lattices of atoms coupled to Glauber spins, Journal of Statistical Mechanics-Theory and Experiment, (2015) P05015.
[E16] M. Ruiz-Garcia, L. L. Bonilla, A. Prados, STM-driven transition from rippled to buckled graphene in a spin-membrane model, Physical Review B, 94 (2016) 205404.
[E17] See Supplemental Material at [URL will be inserted by publisher] for further details on experiments and calculations.
[E18] M. Lopez-Suarez, R. Rurali, L. Gammaitoni, G. Abadal, Nanostructured graphene for energy harvesting, Physical Review B, 84 (2011) 161401(R).
[E19] M. R. Sorensen, A. F. Voter, Temperature-accelerated dynamics for simulation of infrequent events, Journal of Chemical Physics, 112 (2000) 9599-9606.

[E20] L. L. Bonilla, M. Ruiz-Garcia, Critical radius and temperature for buckling in graphene, Physical Review B, 93 (2016) 115407.

[E21] J. F. Xu, P. M. Thibado, Z. Ding, 4 K, ultrahigh vacuum scanning tunneling microscope having two orthogonal tips with tunnel junctions as close as a few nanometers, Rev. Sci. Instrum., 77 (2006) 093703.

[E22] S. F. Philp, Vacuum-Insulated, Varying-Capacitance Machine, IEEE Transactions on Electrical Insulation, 12 (1977) 130-136.

[E23] R. O'Donnell, N. Schofield, A. C. Smith, J. Cullen, Design Concepts for High-Voltage Variable-Capacitance DC Generators, IEEE Transactions on Industry Applications, 45 (2009) 1778-1784.

[E24] N. R. Greene, Energy Flow for a Variable-Gap Capacitor, The Physics Teacher, 43 (2005) 340.

[E25] J.-S. Rattinacannou, A promising new energy source: The Brownian motion of nanoresonator arrays European Physical Journal, 79 (2014) 01006.

[E26] M. B. Lundeberg, J. A. Folk, Rippled Graphene in an In-Plane Magnetic Field: Effects of a Random Vector Potential, Physical Review Letters, 105 (2010) 146804.

[E27] C. B. Williams, R. B. Yates, Analysis of a microelectric generator for microsystems, Transducers, (1995) 369.

[E28] S. Roundy, P. K. Wright, J. Rabaey, A study of low level vibrations as a power source for wireless sensor nodes, Computer Communications, 26 (2003) 1131-1144.

[E29] E. V. Castro, H. Ochoa, M. I. Katsnelson, R. V. Gorbachev, D. C. Elias, K. S. Novoselov, A. K. Geim, F. Guinea, Limits on Charge Carrier Mobility in Suspended Graphene due to Flexural Phonons, Physical Review Letters, 105 (2010) 266601.

[E30] A. A. Balandin, S. Ghosh, W. Bao, I. Calizo, D. Teweldebrhan, F. Miao, C. N. Lau, Superior thermal conductivity of single-layer graphene, Nano Lett., 8 (2008) 902-907.

[E31] J. Macaulay, M. Kuckelhaus, Internet of things in logistics, Matthais Heutger (2015).

[E32] S. Hanson, M. Seok, Y. S. Lin, Z. Foo, D. Kim, Y. Lee, N. Liu, D. Sylvester, D. Blaauw, A Low-Voltage Processor for Sensing Applications With Picowatt Standby Mode, IEEE Journal of Solid-State Circuits, 44 (2009) 1145-1155.

The invention claimed is:

1. A system for harvesting energy, comprising:
a substrate having an initial thickness between a first face of the substrate and an opposite face of the substrate;
a second face of the substrate bounding an open well region extending from the first face of the substrate toward the second face of the substrate;
a free-standing membrane positioned over the well region and supported by the first face of the substrate, wherein the free-standing membrane is free to vibrate in response to ambient energy, wherein vibration of the membrane defines cyclical ripple formations along a first surface of the membrane, wherein each ripple formation alternates between a peak and a trough over the well region;
a tip structure extending from the second face of the substrate;
a first contact connected to the first face of the substrate;
a second contact connected to the tip structure;
a voltage source connected to the second contact inducing a capacitive region of charges between the tip and the membrane,
wherein a distance between the tip and the membrane varies with respective peaks and troughs, and
wherein the capacitive region between the tip and the membrane stores and emits the charges in cycles according to the distance between the tip and the membrane; and
a storage capacitor connected to the membrane and receiving emitted charges from the capacitive region when the distance between the tip and the membrane is increasing during ripple peak periods.

2. A system according to claim 1, wherein the voltage source delivers charges to the capacitive region when the distance between the tip and the membrane is decreasing during ripple trough periods.

3. A system according to claim 1, further comprising a computer system in electronic communication with at least one of the first contact and the second contact and having at least one processor and a memory, and wherein the memory stores instructions which, when executed by the at least one processor, controls charge storage and charge transmission from the membrane.

4. A system according to claim 1, further comprising a pattern of trenches across the first face of the substrate, wherein each trench isolates either a tip or a first contact from adjacent portions of the substrate.

5. A system according to claim 1, further comprising an electrical circuit connecting the voltage source, the storage capacitor, tip, and the membrane to a common ground, wherein the circuit comprises a first diode connected to the membrane or tip, the common ground in parallel with the fixed capacitor, and a second diode connected to the membrane or tip in series with the fixed capacitor connected to the common ground.

6. A system according to claim 5, further comprising an array of respective first diodes and second diodes connecting respective regions of the membrane or tip to the voltage source, the fixed storage capacitor, and the common ground.

7. A system according to claim 5, wherein the circuit connecting components, selected from the voltage source, the fixed storage capacitor, tip and the membrane, are connected to each other via a circuit board that is separate from the substrate.

8. A system according to claim 1, wherein the freestanding membrane is a freestanding graphene membrane.

9. A system according to claim 1, wherein the freestanding membrane is one of a bi-layer of graphene, a tri-layer of graphene, and a multi-layer of graphene.

10. A system according to claim 1, further comprising an ammeter connected via a switch to operate in parallel to the storage capacitor, wherein the ammeter measures charge in the storage capacitor.

11. A system according to claim 1, wherein the capacitive region has a capacitance cycle from a minimum capacitance of about 0.001 femto-farad to a maximum capacitance of about 1000 femto-farad.

12. A system according to claim 11, wherein the minimum capacitance corresponds to time periods in which the distance between the tip and the membrane is maximized during ripple peak periods.

13. A system according to claim 12, wherein the maximum capacitance corresponds to time periods in which the distance between the tip and the membrane is minimized during ripple trough periods.

14. A system according to claim 1, wherein the capacitive region is subject to current tunneling when the distance between the tip and the membrane is minimized during ripple trough periods.

15. A system according to claim 1, wherein the ambient energy is thermal energy.

16. A system according to claim 1, wherein the ambient energy is kinetic energy from atoms in the freestanding membrane.

17. A system according to claim 1, wherein the freestanding membrane comprises graphene, $MoS_2$, $MoSe_2$, $WS_2$, $WSe_2$, $ReS_2$, $ReSe_2$, BN, combinations of a transition metal and another element ("$MX_2$"), or a combination thereof.

18. A system according to claim 1, wherein the membrane has an average thickness of from 0.3 nm to 3.0 nm, from 0.3 nm to 2.0 nm, from 0.3 nm to 1.0 nm, or from 0.3 nm to 0.6 nm.

\* \* \* \* \*